United States Patent
Yoshida et al.

(10) Patent No.: US 10,431,589 B2
(45) Date of Patent: Oct. 1, 2019

(54) MEMORY CELL, SEMICONDUCTOR INTEGRATED CIRCUIT DEVICE, AND METHOD FOR MANUFACTURING SEMICONDUCTOR INTEGRATED CIRCUIT DEVICE

(71) Applicant: FLOADIA CORPORATION, Kodaira-shi, Tokyo (JP)

(72) Inventors: Shoji Yoshida, Kodaira (JP); Fukuo Owada, Kodaira (JP); Daisuke Okada, Kodaira (JP); Yasuhiko Kawashima, Kodaira (JP); Shinji Yoshida, Kodaira (JP); Kazumasa Yanagisawa, Kodaira (JP); Yasuhiro Taniguchi, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 15/744,163

(22) PCT Filed: Jul. 21, 2016

(86) PCT No.: PCT/JP2016/071351
§ 371 (c)(1),
(2) Date: Jan. 12, 2018

(87) PCT Pub. No.: WO2017/014254
PCT Pub. Date: Jan. 26, 2017

(65) Prior Publication Data
US 2018/0211965 A1 Jul. 26, 2018

(30) Foreign Application Priority Data
Jul. 23, 2015 (JP) .................................. 2015-146189

(51) Int. Cl.
*H01L 27/115* (2017.01)
*H01L 29/788* (2006.01)
(Continued)

(52) U.S. Cl.
CPC ............ *H01L 27/115* (2013.01); *H01L 21/28* (2013.01); *H01L 21/28282* (2013.01);
(Continued)

(58) Field of Classification Search
CPC ....... H01L 27/115; H01L 21/28; H01L 27/10; H01L 29/788; H01L 29/792
(Continued)

(56) References Cited

U.S. PATENT DOCUMENTS

2011/0001179 A1    1/2011   Yanagi et al.
2011/0233649 A1    9/2011   Shimizu
(Continued)

FOREIGN PATENT DOCUMENTS

JP    2010-278314 A    12/2010
JP    2011-029631 A     2/2011
(Continued)

OTHER PUBLICATIONS

International Search Report issued in Patent Application No. PCT/JP2016/071351 dated Sep. 13, 2016.
(Continued)

*Primary Examiner* — Caleen O Sullivan
(74) *Attorney, Agent, or Firm* — Pearne & Gordon LLP

(57) ABSTRACT

A memory cell includes a memory gate structure, a first select gate structure, and a second select gate structure. In the memory gate structure, a lower memory gate insulating film, a charge storage layer, an upper memory gate insulating film, and a metal memory gate electrode are stacked in this order. The first select gate structure includes a metal first select gate electrode along a first sidewall spacer provided on a sidewall of the memory gate structure. The second select gate structure includes a metal second select gate electrode along a second sidewall spacer provided on another sidewall of the memory gate structure. Thus, the
(Continued)

metal memory gate electrode, the metal first select gate electrode, and the metal second select gate electrode can be formed of a same metallic material as a metal logic gate electrode, permitting the memory cell to be formed together with the metal logic gate electrode.

11 Claims, 15 Drawing Sheets

(51) Int. Cl.
| | |
|---|---|
| H01L 29/792 | (2006.01) |
| H01L 21/28 | (2006.01) |
| H01L 27/10 | (2006.01) |
| H01L 29/423 | (2006.01) |
| H01L 29/66 | (2006.01) |
| H01L 27/1157 | (2017.01) |
| H01L 27/11573 | (2017.01) |
| H01L 27/11575 | (2017.01) |

(52) U.S. Cl.
CPC .......... *H01L 27/10* (2013.01); *H01L 27/1157* (2013.01); *H01L 27/11573* (2013.01); *H01L 27/11575* (2013.01); *H01L 29/42344* (2013.01); *H01L 29/66833* (2013.01); *H01L 29/788* (2013.01); *H01L 29/792* (2013.01)

(58) Field of Classification Search
USPC .......................................................... 257/324
See application file for complete search history.

(56) References Cited

U.S. PATENT DOCUMENTS

| | | |
|---|---|---|
| 2011/0242888 A1 | 10/2011 | Arigane et al. |
| 2012/0299084 A1 | 11/2012 | Saito et al. |
| 2014/0175533 A1 | 6/2014 | Kwon |
| 2014/0213030 A1 | 7/2014 | Tsukuda et al. |
| 2015/0041875 A1 | 2/2015 | Perera |
| 2015/0060983 A1 | 3/2015 | Lusetsky et al. |
| 2015/0111357 A1 | 4/2015 | Tsukuda et al. |
| 2015/0145023 A1 | 5/2015 | Arigane et al. |

FOREIGN PATENT DOCUMENTS

| | | |
|---|---|---|
| JP | 2011-129816 A | 6/2011 |
| JP | 2012-248652 A | 12/2012 |
| JP | 2014-143339 A | 8/2014 |
| JP | 2015-103698 A | 6/2015 |

OTHER PUBLICATIONS

Written Opinion issued in Patent Application No. PCT/JP2016/071351 dated Sep. 13, 2016.
Partial Supplementary European Search Report issued in European Patent Application EP 16 82 7814 dated Feb. 19, 2019.

MEMORY CELL, SEMICONDUCTOR INTEGRATED CIRCUIT DEVICE, AND METHOD FOR MANUFACTURING SEMICONDUCTOR INTEGRATED CIRCUIT DEVICE

TECHNICAL FIELD

The present invention relates to a memory cell, a semiconductor integrated circuit device, and a method for manufacturing a semiconductor integrated circuit device.

BACKGROUND ART

Japanese Patent Laid-open No. 2011-129816 (Patent Literature 1) discloses a conventional memory cell in which a memory gate structure is disposed between two select gate structures (refer to FIG. 15 in Patent Literature 1). The memory cell includes a drain region connected with a bit line and a source region connected with a source line. A first select gate structure, a memory gate structure, and a second select gate structure are disposed in this order on a semiconductor substrate between these drain and source regions. In the memory cell thus configured, a charge storage layer is provided to the memory gate structure. Data is programmed by injecting charge into the charge storage layer, or data is erased by removing charge inside the charge storage layer.

In the case where charge is injected into the charge storage layer in such a memory cell, voltage is blocked by the second select gate structure connected with the source line while a low bit voltage from the bit line is applied to the channel layer of the memory gate structure through the first select gate structure. Simultaneously, a high memory gate voltage is applied to a memory gate electrode in the memory gate structure, and accordingly, charge is injected into the charge storage layer due to the quantum tunneling effect caused by the voltage difference between the bit voltage and the memory gate voltage.

CITATION LIST

Patent Literature

Patent Literature 1: Japanese Patent Laid-open No. 2011-120816

SUMMARY OF INVENTION

Technical Problem

In the case where a logic gate electrode made of polysilicon with added impurities is used in a peripheral circuit included in a metal-oxide-semiconductor (MOS) transistor structure and configured to drive such a memory cell, for example, voltage application to the logic gate electrode forms a depletion layer in the logic gate electrode. In such a peripheral circuit, a parasitic capacitor due to the depletion layer becomes connected in series with a gate capacitor. As a result, even when the gate insulating film is formed to be extremely thin, the effective thickness of the gate insulating film increases by an amount corresponding to the depletion layer. For this reason, in a recent peripheral circuit, a logic gate electrode made of a metallic material is employed to prevent formation of a depletion layer in the logic gate electrode.

However, for example, in the case where a memory cell in which electrodes of the memory gate structure, the first select gate structure, and the second select gate structure are made of polysilicon is formed on a semiconductor substrate on which a peripheral circuit including a metal logic gate electrode made of a metallic material is disposed, a manufacturing process of forming the memory cell is needed separately from a manufacturing process of forming the peripheral circuit since the memory cell and the peripheral circuit are made of different materials.

The present invention is intended to solve the above-described problem by providing a memory cell and a semiconductor integrated circuit device that are formed through a series of manufacturing processes of forming a metal logic gate electrode made of a metallic material on a semiconductor substrate, and a method for manufacturing the semiconductor integrated circuit device.

Solution to Problem

To solve the above-described problem, a memory cell according to the present invention is a memory cell disposed on a semiconductor substrate on which a peripheral circuit including a metal logic gate electrode containing a metallic material is provided. The memory cell includes: a drain region disposed on a surface of the semiconductor substrate and connected with a bit line; a source region disposed on the surface of the semiconductor substrate and connected with a source line; a memory gate structure that is disposed between the drain region and the source region and in which a lower memory gate insulating film, a charge storage layer, an upper memory gate insulating film, and a metal memory gate electrode containing the metallic material are stacked in this order on the semiconductor substrate; a first select gate structure in which a metal first select gate electrode containing the metallic material is disposed on the semiconductor substrate between the drain region and the memory gate structure through a first select gate insulating film and that is disposed adjacent to a first sidewall of the memory gate structure through a first sidewall spacer; and a second select gate structure in which a metal second select gate electrode containing the metallic material is disposed on the semiconductor substrate between the source region and the memory gate structure through a second select gate insulating film and that is disposed adjacent to a second sidewall of the memory gate structure through a second sidewall spacer.

The first sidewall spacer is composed of a first sidewall insulating film disposed along the first sidewall of the memory gate structure and a first select gate sidewall insulating film disposed along a sidewall of the first select gate structure and integrated with the first select gate insulating film. The second sidewall spacer is composed of a second sidewall insulating film disposed along the second sidewall of the memory gate structure and a second select gate sidewall insulating film disposed along a sidewall of the second select gate structure and integrated with the second select gate insulating film. The first select gate sidewall insulating film and the second select gate sidewall insulating film are made of an insulating material different from an insulating material of the first sidewall insulating film and the second sidewall insulating film. The first sidewall insulating film and the second sidewall insulating film are made of the insulating material having a relative dielectric constant smaller than a relative dielectric constant of the insulating material of the first select gate sidewall insulating film and the second select gate sidewall insulating film.

A first memory gate sidewall insulating film disposed along the sidewall spacer and integrated with the upper memory gate insulating film is provided between the metal memory gate electrode and the first sidewall spacer. A second memory gate sidewall insulating film disposed along the sidewall spacer and integrated with the upper memory gate insulating film is provided between the metal memory gate electrode and the second sidewall spacer.

A semiconductor integrated circuit device according to the present invention is a semiconductor integrated circuit device including memory cells arranged in a matrix of rows and columns and each connected with a bit line and a source line. Each memory cell is the above-described memory cell. A peripheral circuit region in which the peripheral circuit is provided is provided around a memory circuit region in which each memory cell is disposed.

A method for manufacturing a semiconductor integrated circuit device according to a first embodiment of the present invention is a method for manufacturing a semiconductor integrated circuit device including: a memory circuit region in which a memory cell including a memory gate structure between a first select gate structure and a second select gate structure is disposed; and a peripheral circuit region in which a peripheral circuit including a logic gate structure is disposed. The method includes: a first dummy electrode layer forming process of forming a layered lower memory gate insulating film and a layered charge storage layer in this order on a semiconductor substrate in the memory circuit region, and then stacking a layered first insulating film and a layered logic dummy electrode layer in this order on the charge storage layer in the memory circuit region and the semiconductor substrate in the peripheral circuit region; a dummy memory gate structure forming process of patterning the logic dummy electrode layer, the first insulating film, the charge storage layer, and the tower memory gate insulating film in the memory circuit region by using a patterned resist so that a dummy memory gate structure in which the lower memory gate insulating film, the charge storage layer, an upper memory gate insulating film, and a dummy memory gate electrode provided by patterning are stacked in this order is formed in the memory circuit region and the first insulating film and the logic dummy electrode layer to remain intact in the peripheral circuit region using the resist; a sidewall insulating film forming process of forming sidewall insulating films along facing sidewalls of the dummy memory gate structure in the memory circuit region; a second dummy electrode layer forming process of forming a layered second insulating film across the memory circuit region and the peripheral circuit region to form sidewall spacers composed of the sidewall insulating films and the second insulating film on the respective facing sidewalls of the dummy memory gate structure, stacking a layered memory dummy electrode layer on the second insulating film, and removing the memory dummy electrode layer and the second insulating film in this order in the peripheral circuit region by using a patterned resist so that the second insulating film and the memory dummy electrode layer remain in the memory circuit region; a dummy gate electrode forming process of patterning the logic dummy electrode layer and the first insulating film in the peripheral circuit region by using another patterned resist to form a dummy logic gate structure in which a dummy logic gate electrode is stacked on the semiconductor substrate through a logic gate insulating film, and etching back the memory dummy electrode layer and the second insulating film in the memory circuit region so that a sidewall-shaped dummy first select gate electrode is formed along one of the sidewall spacers of the dummy memory gate structure whereas the second insulating film remains below the dummy first select gate electrode to form a first select gate insulating film and a sidewall-shaped dummy second select gate electrode is formed along the oilier sidewall spacer of the dummy memory gate structure whereas the second insulating film remains below the dummy second select gate electrode to form a second select gate insulating film; an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, and then forming, in electrode formation spaces in which the dummy memory gate electrode, the dummy first select gate electrode, the dummy second select gate electrode, and the dummy logic gate electrode have been formed, a metal memory gate electrode, a metal first select gate electrode, a metal second select gate electrode, and a metal logic gate electrode each containing a metallic material.

A method for manufacturing a semiconductor integrated circuit device according to a second embodiment of the present invention is a method for manufacturing a semiconductor integrated circuit device including: a memory circuit region in which a memory cell including a memory gate structure between a first select gate structure and a second select gate structure is disposed; and a peripheral circuit region in which a peripheral circuit including a logic gate structure is disposed. The method includes: a sidewall insulating film forming process of providing, in the memory circuit region, a dummy memory gate structure in which a lower memory gate insulating film, a charge storage layer, an upper memory gate insulating film, and a dummy memory gate electrode provided by patterning are stacked in this order on a semiconductor substrate, and then forming sidewall insulating films along facing sidewalls of the dummy memory gate structure; a dummy electrode layer forming process of forming a layered insulating film in the memory circuit region and the peripheral circuit region to form sidewall spacers composed of the sidewall insulating films and the insulating film on the respective facing sidewalls of the dummy memory gate structure, and then slacking a layered logic dummy electrode layer on the insulating film; a dummy gate electrode forming process of patterning the logic dummy electrode layer and the insulating film in the peripheral circuit region by using a patterned resist to form a dummy logic gate structure in which a dummy logic gate electrode is stacked on the semiconductor substrate through a logic gate insulating film, and etching back the logic dummy electrode layer and the insulating film in the memory circuit region so that a sidewall-shaped dummy first select gate electrode is formed along one of the sidewall spacers of the dummy memory gate structure whereas the insulating film remains below the dummy first select gate electrode to form a first select gate insulating film and a sidewall-shaped dummy second select gate electrode is formed along the other sidewall spacer of the dummy memory gate structure whereas the insulating film remains below the dummy second select gate electrode to form a second select gate insulating film; an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, and then forming, in electrode formation spaces in which the dummy memory gate electrode, the dummy first select gate electrode, the dummy second select gate electrode, and the dummy logic gate electrode have been formed, a metal memory gate electrode, a metal first select gate electrode, a metal second select gate electrode, and a metal logic gate electrode each containing a metallic material.

A method for manufacturing a semiconductor integrated circuit device according to a third embodiment of the present invention is a method for manufacturing a semiconductor integrated circuit device including: a memory circuit region in which a memory cell including a memory gate structure between a first select gate structure and a second select gate structure is disposed; and a peripheral circuit region in which a peripheral circuit including a logic gate structure is disposed. The method includes: a first dummy electrode layer forming process of forming a layered lower memory gate insulating film and a layered charge storage layer in this order on a semiconductor substrate in the memory circuit region, and then forming a layered logic dummy electrode layer on the charge storage layer in the memory circuit region and the semiconductor substrate in the peripheral circuit region; a dummy memory gate structure forming process of patterning the logic dummy electrode layer, the charge storage layer, and the lower memory gate insulating film in the memory circuit region by using a patterned resist so that a dummy memory gate structure in which the lower memory gate insulating film, the charge storage layer, and a dummy memory gate electrode provided by patterning are stacked in this order is formed in the memory circuit region whereas the logic dummy electrode layer remains intact in the peripheral circuit region using the resist; a sidewall insulating film forming process of forming sidewall insulating films along facing sidewalls of the dummy memory gate structure in the memory circuit region; a second dummy electrode layer forming process of forming a layered memory dummy electrode layer across the memory circuit region and the peripheral circuit region, and then removing the memory dummy electrode layer in the peripheral circuit region by using a patterned resist whereas the memory dummy electrode layer remains in the memory circuit region; a dummy gate electrode forming process of patterning the logic dummy electrode layer in the peripheral circuit region by using another patterned resist to form a dummy logic gate electrode on the semiconductor substrate, and etching back the memory dummy electrode layer in the memory circuit region so that a sidewall-shaped dummy first select gate electrode is formed along one of the sidewall insulating films of the dummy memory gate structure and a sidewall-shaped dummy second select gate electrode is formed along the other sidewall insulating film of the dummy memory gate structure; an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, forming a layered insulating film in spaces in which the dummy memory gate electrode, the dummy first select gate electrode, the dummy second select gate electrode, and the dummy logic gate electrode have been formed, and then forming a metal memory gate electrode, a metal first select gate electrode, a metal second select gate electrode, and a metal logic gate electrode each containing a metallic material in electrode formation spaces enclosed by the insulating film in the spaces.

A method for manufacturing a semiconductor integrated circuit device according to a fourth embodiment of the present invention is a method for manufacturing a semiconductor integrated circuit device including: a memory circuit region in which a memory cell including a memory gate structure between a first select gate structure and a second select gate structure is disposed; and a peripheral circuit region in which a peripheral circuit including a logic gate structure is disposed. The method includes: a sidewall insulating film forming process of providing, in the memory circuit region, a dummy memory gate structure in which a lower memory gate insulating film, a charge storage layer, and a dummy memory gate electrode provided by patterning are stacked in this order on a semiconductor substrate, and then forming sidewall insulating films along facing sidewalls of the dummy memory gate structure; a dummy electrode layer forming process of forming a layered logic dummy electrode layer in the memory circuit region and the peripheral circuit region; a dummy gate electrode forming process of patterning the logic dummy electrode layer in the peripheral circuit region by using a patterned resist to form a dummy logic gate electrode on the semiconductor substrate, and etching back the logic dummy electrode layer in the memory circuit region so that a sidewall-shaped dummy first select gate electrode is formed along one of the sidewall insulating films of the dummy memory gate structure and a sidewall-shaped dummy second select gate electrode is formed along the other sidewall insulating film of the dummy memory gate structure; an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, forming a layered insulating film in spaces in which the dummy memory gate electrode, the dummy first select gate electrode, the dummy second select gate electrode, and the dummy logic gate electrode have been formed, and then forming a metal memory gate electrode, a metal first select gate electrode, a metal second select gate electrode, and a metal logic gate electrode each containing a metallic material, in electrode formation spaces enclosed by the insulating film m the spaces.

According to the above-described manufacturing method, the memory cell is formed in the memory circuit region and the logic gate structure is formed in the peripheral circuit region. The memory cell includes: the memory gate structure in which the lower memory gate insulating film, the charge storage layer, the upper memory gate insulating film, and the metal memory gate electrode are stacked in this order on the semiconductor substrate; the first select gate structure in which the metal first select gate electrode is disposed on the semiconductor substrate through the first select gate insulating film and that is disposed adjacent to the first sidewall of the memory gate structure through one of the sidewall spacers; and the second select gate structure in which the metal second select gate electrode is disposed on the semiconductor substrate through the second select gate insulating film and that is disposed adjacent to the second sidewall of the memory gate structure through the other sidewall spacer. In the logic gate structure, the metal logic gate electrode is disposed on the semiconductor substrate through the logic gate insulating film.

Advantageous Effects of Invention

In a memory cell, a semiconductor integrated circuit device, and a method for manufacturing a semiconductor integrated circuit device according to the present invention, a metal memory gate electrode, a metal first select gate electrode, and a metal second select gate electrode can be formed of a metallic material the same as that of a metal logic gate electrode, thereby providing a memory cell that is formed through a series of manufacturing processes of forming the metal logic gate electrode made of a metallic material on a semiconductor substrate.

DESCRIPTION OF EMBODIMENTS

Figure 1:
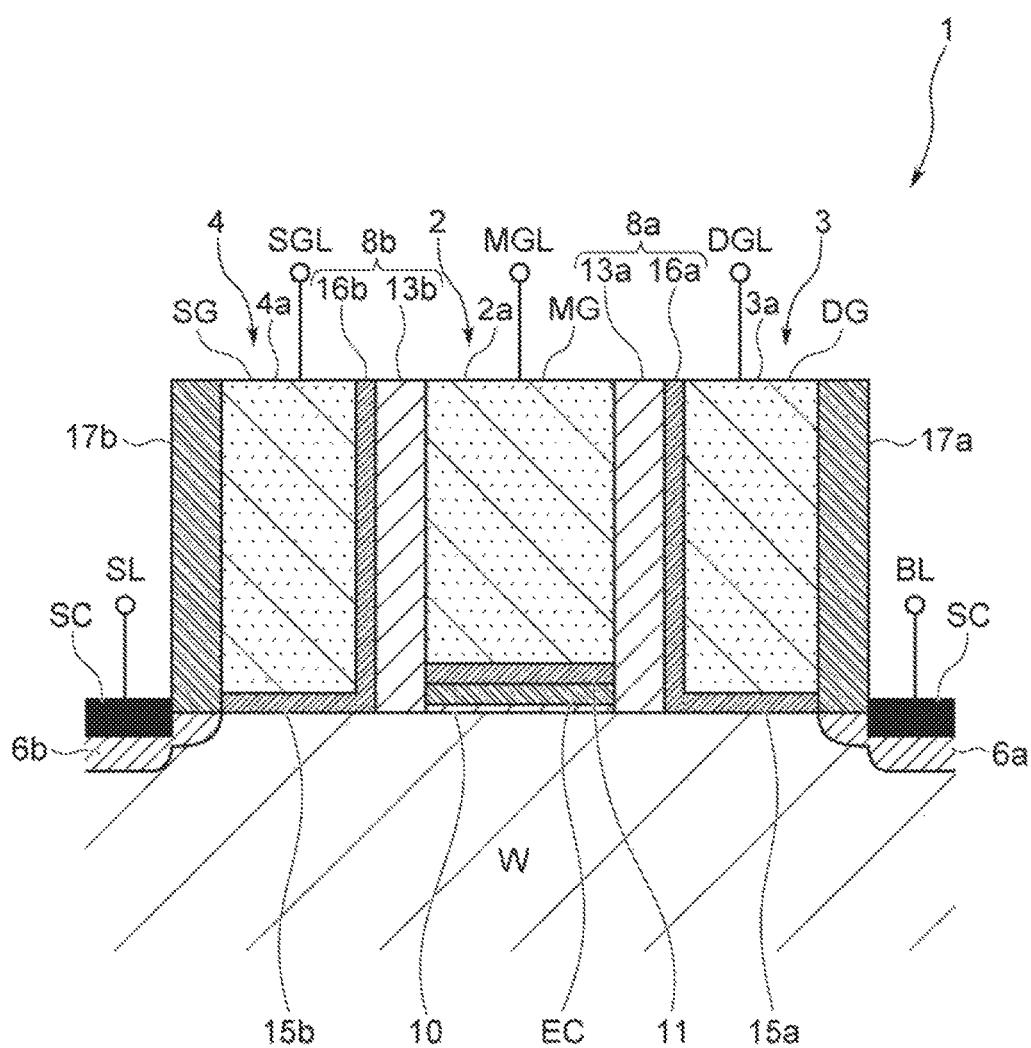
FIG. 1 is a schematic view illustrating a sectional configuration of a memory cell according to a first embodiment.

Hereinafter, embodiments of the present invention will be described in the following order.
1. First embodiment
1-1. Configuration of memory cell according to first embodiment
1-2. Data programming method
1-2-1. First programming method
1-2-2. Second programming method
1-3. Other operations
1-4. Configuration of semiconductor integrated circuit device according to first embodiment
1-5. Method for manufacturing semiconductor integrated circuit device according to first embodiment
1-6. Operations and effects
2. Second embodiment
2-1. Configuration of semiconductor integrated circuit device according to second embodiment
2-2. Method for manufacturing semiconductor integrated circuit device according to second embodiment
2-3. Operations and effects
3. Third embodiment
3-1. Configuration of memory cell according to third embodiment
3-2. Configuration of semiconductor integrated circuit device according to third embodiment
3-3. Method for manufacturing semiconductor integrated circuit device according to third embodiment
3-4. Operations and effects 4. Fourth embodiment
4-1. Configuration of semiconductor integrated circuit device according to fourth embodiment
4-2. Method for manufacturing semiconductor integrated circuit device according to fourth embodiment
4-3. Operations and effects
5. Other embodiments (1) First Embodiment (1-1) Configuration of Memory Cell According to First Embodiment In FIG. 1, reference numeral 1 denotes a memory cell according to the present invention. In the memory cell 1, for example, a memory gate structure 2 included in an N-type transistor structure, a first select gate structure 3 included in an N-type MOS transistor structure, and a second select gate structure 4 included in an N-type MOS transistor structure are disposed on a semiconductor substrate W in which P-type impurities are injected. A drain region 6a and a source region 6b are spaced at a predetermined distance from each other on a surface of the semiconductor substrate W. The drain region 6a is disposed at one end of the first select gate structure 3, and the source region 6b is disposed at one end of the second select gate structure 4. The drain region 6a is connected with a bit line BL, and the source region 6b is connected with a source line SL.

A low-concentration drain region is disposed in the drain region 6a on the surface of the semiconductor substrate W. A sidewall structure 17a along a sidewall of the first select gate structure 3 is disposed on the low-concentration drain region. A low-concentration source region is disposed in the source region 6b on the surface of the semiconductor substrate W. A sidewall structure 17b along a sidewall of the second select gate structure 4 is disposed on the low-concentration source region. Silicide layers SC are disposed on the respective surfaces of the drain region 6a and the source region 6b.

The sidewall structures 17a and 17b are each made of, for example, SiN and have top surfaces planarized through planarizing treatment such as chemical mechanical polishing (CMP) performed in a manufacturing process, together with top surfaces of a metal memory gate electrode MG of the memory gate structure 2, a metal first select gate electrode DG of the first select gate structure 3, and a metal second select gate electrode SG of the second select gate structure 4.

In the present embodiment, the low-concentration drain region inside the drain region 6a and the low-concentration source region inside the source region 6b each have an impurity concentration exceeding $1.0E19/cm^3$. The semiconductor substrate W directly below each of sidewall spacers 8a and 8b to be described later is the same as a surface region (for example, a region extending to a depth of 50 nm from the surface of the semiconductor substrate W) in which a channel layer is formed directly below the memory gate structure 2, and has an impurity concentration of $1.0E19/cm^3$ or less, preferably $3.0E18/cm^3$ or less.

The memory gate structure 2 includes a charge storage layer EC made of, for example, silicon nitride ($Si_3N_4$), silicon oxynitride (SiON), alumina ($Al_2O_3$), or hafnia (HfO2) on the semiconductor substrate W between the low-concentration drain region of the drain region 6a and the low-concentration source region of the source region 6b through a lower memory gate insulating film 10 made of an insulating material such as $SiO_2$. The memory gate structure 2 further includes the metal memory gate electrode MG on the charge storage layer EC through an upper memory gate insulating film 11 made of an insulating material (for example, a high-k material such as oxidize hafnium (HfO2), or nitrided hafnium silicate (HfSiON)) different from that of the lower memory gate insulating film 10. In other words, the memory gate structure 2 has a configuration in which the charge storage layer EC is insulated from the semiconductor substrate W and the metal memory gate electrode MG by the lower memory gate insulating film 10 and the upper memory gate insulating film 11.

The metal memory gate electrode MG is made of an N-type MOS metallic material such as aluminum (Al), titanium aluminide (TiAl), tantalum carbide (TaC), or tantalum silicon nitride (TaSiN). The metal memory gate electrode MG includes a planarized top surface 2a that is a top surface planarized through planarizing treatment such as CMP performed in a manufacturing process. The metal memory gate electrode MG is connected with a memory gate line MGL to receive voltage application from the memory gate line MGL.

The memory gate structure 2 is provided with the sidewall spacer 8a made of an insulating material and disposed along a first sidewall of the memory gate structure 2. The memory gate structure 2 is adjacent to the first select gate structure 3 through the sidewall spacer 8a. The sidewall spacer 8a disposed between the memory gate structure 2 and the first select gate structure 3 has a thickness large enough to insulate the memory gate structure 2 and the first select gate structure 3 from each other. The sidewall spacer 8a includes a sidewall insulating film 13a made of an insulating material such as $SiO_2$ and a first select gate sidewall insulating film 16a made of an insulating material (for example, a high-k material). The sidewall insulating film 13a is disposed along the sidewall of the memory gate structure 2. The for select gate sidewall insulating film 16a is deposited through a process different from that for the sidewall insulating film 13a and disposed between the sidewall insulating film 13a and the first select gate structure 3.

When the distance between the memory gate structure 2 and the first select gate structure 3 is less than 5 nm, voltage application to the metal memory gate electrode MG and the metal first select gate electrode DG potentially generates a breakdown voltage to the sidewall spacer 8a. When the distance between the memory gate structure 2 and the first select gate structure 3 exceeds 40 nm, an increased resistance is obtained at the semiconductor substrate W (for example, a region (surface region) extending to a depth of 50 nm from the surface) between the metal memory gate electrode MG and the metal first select gate electrode DG, and a readout current is unlikely to occur between the memory gate structure 2 and the first select gate structure 3 at data reading. Thus, in the present embodiment, the sidewall spacer 8a between the memory gate structure 2 and the first select gate structure 3 desirably has a width of 5 nm to 40 nm inclusive. The sidewall insulating film 13a is desirably made of an insulating material having a relative dielectric constant smaller than that of the first select gate sidewall insulating film 16a. In this case, the first select gate structure 3 and the memory gate structure 2 have a reduced capacitance therebetween, thereby achieving an increased access speed.

The first select gate structure 3 includes a first select gate insulating film 15a on the semiconductor substrate W between the sidewall spacer 8a and the drain region 6a. The first select gate insulating film 15a is made of an insulating material (for example, a high-k material) the same as that of the first select gate sidewall insulating film 16a and integrated with a lower-end sidewall of the wall-shaped first select gate sidewall insulating film 16a. The first select gate insulating film 15a has a thickness of 9 nm or smaller, preferably 3 nm or smaller. The metal first select gate electrode DG is disposed on the first select gate insulating film 15a. The metal first select gate electrode DG is made of an N-type MOS metallic material (for example, aluminum (Al), titanium aluminide (TiAl), tantalum carbide (TaC), or tantalum silicon nitride (TaSiN)) the same as that of the metal memory gate electrode MG. The metal first select gate electrode DG includes a planarized top surface 3a that is a top surface planarized through planarizing treatment such as CMP performed in a manufacturing process. The metal first select gate electrode DG is connected with a first select gate line DGL to receive voltage application from the first select gate line DGL.

The memory gate structure 2 is also provided with the sidewall spacer 8b made of an insulating material and disposed on a second sidewall of the memory gate structure 2. The memory gate structure 2 is adjacent to the second select gate structure 4 through the sidewall spacer 8b. The sidewall spacer 8b disposed between the memory gate structure 2 and the second select gate structure 4 has a thickness the same as that of the sidewall spacer 8a, which is large enough to insulate the memory gate structure 2 and the second select gate structure 4 from each other. The sidewall spacer 8b includes a sidewall insulating film 13b made of an insulating material such as $SiO_2$ and a second select gate sidewall insulating film 16b made of an insulating material (for example, a high-k material). The sidewall insulating film 13b is disposed along the sidewall of the memory gate structure 2. The second select gate sidewall insulating film 16b is deposited through a process different from that for the sidewall insulating film 13b and disposed between the sidewall insulating film 13b and the second select gate structure 4.

When the distance between the memory gate structure 2 and the second select gate structure 4 is less than 5 nm, voltage application to the metal memory gate electrode MG and the metal second select gate electrode SG potentially generates a breakdown voltage to the sidewall spacer 8b. When the distance between the memory gate structure 2 and the second select gate structure 4 exceeds 40 nm, an increased resistance is obtained at the semiconductor substrate W between the metal memory gate electrode MG and the metal second select gate electrode SG, and a readout current is unlikely to occur between the memory gate structure 2 and the second select gate structure 4 at data reading. Thus, in the present embodiment, the sidewall spacer 8b between the memory gate structure 2 and the second select gate structure 4 desirably has a width of 5 nm to 40 nm inclusive. The sidewall insulating film 13b is desirably made of an insulating material having a relative dielectric constant smaller than that of the second select gate sidewall insulating film 16b. In this case, the second select gate structure 4 and the memory gate structure 2 have a reduced capacitance therebetween, thereby achieving an increased access speed.

The second select gate structure 4 includes a second select gate insulating film 15b on the semiconductor substrate W between the sidewall spacer 8b and the source region 6b. The second select gate insulating film 15b is made of an insulating material (for example, a high-k material) the same as that of the second select gate sidewall insulating film 16b and integrated with a lower-end sidewall of the wall-shaped second select gate sidewall insulating film 16b. The second select gate insulating film 15b has a thickness of 9 nm or smaller, preferably 3 nm or smaller. The metal second select gate electrode SG is disposed on the second select gate insulating film 15b. The metal second select gate electrode SG is made of an N-type MOS metallic material (for example, aluminum (Al), titanium aluminide (TiAl), tantalum carbide (TaC), or tantalum silicon nitride (TaSiN)) the same as that of the metal memory gate electrode MG. The metal second select gate electrode SG includes a planarized top surface 4a that is a top surface planarized through planarizing treatment such as CMP performed in a manufacturing process. The metal second select gate electrode SG is connected with a second select gate line SGL to receive voltage application from the second select gate line SGL.

In the memory cell 1, the planarized lop surface 3a of the metal first select gate electrode DG, the planarized top surface 4a of the metal second select gate electrode SG, the planarized top surface 2a of the metal memory gate electrode MG, planarized top surfaces of the sidewall spacers 8a and 8b, and planarized top surfaces of the sidewall structures 17a and 17b are all aligned at the same height with no protruding region. This configuration achieves downsizing.

The metal memory gate electrode MG, the metal first select gate electrode DG, and the metal second select gate electrode SG of the memory cell 1 are each made of a metallic material. Thus, when a metal logic gate electrode (not illustrated) of a peripheral circuit is formed on the same semiconductor substrate W, the metallic material of the metal logic gate electrode can be used to form the metal memory gate electrode MG, the metal first select gate electrode DG, and the metal second select gate electrode SG. In addition, since the metal memory gate electrode MG, the metal first select gate electrode DG, and the metal second select gate electrode SG of the memory cell 1 are each made of a metallic material, no depletion layer is formed in the metal memory gate electrode MG, the metal first select gate electrode DG, and the metal second select gate electrode SG.

(1-2) Data Programming Method

A data programming operation on the memory cell 1 thus configured is performed by any one of a first programming method and a second programming method described below. In the first programming method, before execution of the data programming operation, any carrier for forming a channel layer is removed from a region (hereinafter referred to as a channel layer formation carrier region) in which the carrier exist in the semiconductor substrate W facing to the metal memory gate electrode MG (hereinafter, this operation is referred to as a carrier removing operation). In the second programming method, the data programming operation is executed without the carrier removing operation.

(1-2-1) First Programming Method

In the first programming method, when the carrier removing operation is executed, for example, a first select gate voltage of 1.5 V is applied from the first select gate line DGL to the metal first select gate electrode DG of the first select gate structure 3, and a bit voltage of 0 V is applied from the bit line BL to the drain region 6a. Accordingly, the surface of the semiconductor substrate W facing to the metal first select gate electrode DG of the first select gate structure 3 becomes a conductive state to electrically connect the drain region 6a connected with the bit line BL and the channel layer formation carrier region of the semiconductor substrate W facing to the memory gate structure 2.

In the present embodiment, for example, a second select gate voltage of 1.5 V is applied from the second select gate line SGL to the metal second select gate electrode SG of the second select gate structure 4, and a source voltage of 0 V is applied from the source line SL to the source region 6b.

Accordingly, the surface of the semiconductor substrate W facing to the metal second select gate electrode SG of the second select gate structure 4 becomes a conductive state to electrically connect the source region 6b connected with the source line SL and the channel layer formation carrier region of the semiconductor substrate W facing to the memory gate structure 2.

Additionally, in the memory cell 1, for example, a substrate voltage of 0 V, which is equal to the bit voltage and the source voltage, is applied to the semiconductor substrate W, and a carrier removal voltage of −2 V is applied from the memory gate line MGL to the metal memory gate electrode MG of the memory gate structure 2. The carrier removal voltage applied to the metal memory gate electrode MG is defined based on a threshold voltage (Vth) at which a channel layer is formed in the semiconductor substrate W facing to the memory gate structure 2. In this case, the carrier removal voltage has a voltage value that is out of a range of the threshold voltage (Vth) which varies according to a data programming state and a data erasing state and forms no channel layer when applied to the metal memory gate electrode MG.

Accordingly, in the memory cell 1, earners (in this case, electrons) induced in the channel layer formation carrier region are expelled from the channel layer formation carrier region into the drain region 6a and/or the source region 6b by the carrier removal voltage applied to the metal memory gate electrode MG. As a result, no channel layer is formed in the semiconductor substrate W directly below the memory gate structure 2 and minority carriers are depleted in the memory cell 1.

In the memory cell 1, the carrier removal voltage lower (shallower) than a lower (shallower) value of the threshold voltage when the charge storage layer EC stores no electrons (or stores holes) is applied to the metal memory gate electrode MG. As a result, even if the memory cell 1 is in the depleted state, carriers induced in the channel layer formation carrier region of the semiconductor substrate W directly below the memory gate structure 2 are removed from the channel layer formation carrier region. Accordingly, no channel layer is formed and minority carriers are depleted in the memory cell 1.

Thereafter, when charge is injected into the charge storage layer EC of the memory cell 1, a charge storage gate voltage of 12 V is applied from the memory gate line MGL to the metal memory gate electrode MG of the memory gate structure 2. In this case, a gate off voltage of 0 V is applied from the second select gate line SGL to the metal second select gate electrode SG of the second select gate structure 4, and a source off voltage of 0 V is applied from the source line SL to the Source region 6b. Accordingly, electrical connection is blocked between the source region 6b connected with the source line SL and the channel layer formation carrier region below the memory gate structure 2, and voltage application is prevented from the source line SL to the channel layer formation carrier region below the memory gate structure 2.

Since the first select gate voltage of 1.5 V is applied from the first select gate line DGL to the metal first select gate electrode DG of the first select gate structure 3, and the charge storage bit voltage of 0 V is applied from the bit line BL to the drain region 6a, the drain region 6a connected with the bit line BL and the channel layer formation carrier region below the memory gate structure 2 are electrically connected with each other. Simultaneously, the substrate voltage of 0 V, which is equal to the charge storage bit voltage, is applied to the semiconductor substrate W.

The electrical connection between the drain region 6a and the channel layer formation carrier region of the semiconductor substrate W below the memory gate structure 2 allows carriers to be induced into the channel layer formation carrier region to form a channel layer at 0 V, which is equal to the charge storage bit voltage, in the surface of the semiconductor substrate W. Accordingly, a large voltage difference of 12 V is generated between the metal memory gate electrode MG of the memory gate structure 2 and the channel layer to cause a quantum tunneling effect, which allows charge injection into the charge storage layer EC, thereby achieving a data programmed state.

When charge is not to be injected into the charge storage layer EC of the memory cell 1 at application of the high charge storage gate voltage to the metal memory gate electrode MG, no high bit voltage needs to be applied to the bit line BL in accordance with the high charge storage gate voltage as conventional cases. The charge injection into the charge storage layer EC of the memory gate structure 2 is prevented by blocking, through the first select gate structure 3, the electrical connection between the bit line BL and the channel layer formation carrier region of the semiconductor substrate W directly below the memory gate structure 2 and blocking, through the second select gate structure 4, the electrical connection between the source line SL and the channel layer formation carrier region directly below the memory gate structure 2.

In the memory cell 1 to which no data is to be programmed, for example, a first select gate voltage of 1.5 V is applied from the first select gate line DGL to the metal first select gate electrode DG, and an off voltage of 1.5 V is applied from the bit line BL to the drain region 6a. Accordingly, the first select gate structure 3 becomes a non-conductive state (off stale) to block the electrical connection between the drain region 6a connected with the bit line BL and the channel layer formation carrier region of the semiconductor substrate W directly below the memory gate structure 2.

Simultaneously, in the memory cell 1 to which no data is to be programmed, for example, a gate off voltage of 0 V is applied from the second select gate line SGL to the metal second select gate electrode SG, and a source off voltage of 0 V is applied from the source line SL to the source region 6b. Accordingly, the second select gate structure 4 becomes a non-conductive state (off state) to block the electrical connection between the source region 6b connected with the source line SL and the channel layer formation carrier region of the semiconductor substrate W directly below the memory gate structure 2. A substrate voltage of 0 V, which is equal to the charge storage bit voltage is applied to the semiconductor substrate W.

In this case, minority carriers are depleted in the channel layer formation carrier region below the memory gate structure 2 of the memory cell 1 through the carrier removing operation in advance. In this state, the semiconductor substrate W is in a non-conductive state directly below the first select gate structure 3 and the second select gate structure 4 on both sides of the memory gate structure 2. Accordingly, a depleted layer in which no charge exists is formed in the semiconductor substrate W directly below the memory gate structure 2.

As a result, in the memory cell 1 to which no data is to be programmed, voltage decreases through the three layers of the upper memory gate insulating film 11, the charge storage layer EC, and the lower memory gate insulating film 10, generating a voltage difference between the metal memory gate electrode MG and the surface of the semiconductor substrate W. Voltage further decreases through the depleted layer extending to a certain depth from the surface of the semiconductor substrate W, finally reaching at the substrate voltage of 0 V.

In the present embodiment, when the charge storage gate voltage of 12 V is applied to the metal memory gate electrode MG of the memory gate structure 2, the voltage difference between the metal memory gate electrode MG and the surface of the semiconductor substrate W is approximately 3.5 V (for example, when a flat band voltage Vfb is 0 V, a memory gate voltage Vg is 12 V, the semiconductor substrate W ruts an acceptor concentration Na of $2.0E17$ $cm^{-3}$, the upper memory gate insulating film 11 has a thickness of 2 nm, the charge storage layer EC has a thickness of 12 nm, and the lower memory gate insulating film has a thickness of 2 nm). The voltage difference is not large enough to cause the quantum tunneling effect between the metal memory gate electrode MG and the surface of the semiconductor substrate W, thereby preventing charge injection into the charge storage layer EC.

Additionally, no impurity diffusion region having a high impurity concentration is formed in a region of the semiconductor substrate W between the memory gate structure 2 and the first select gate structure 3 in the memory cell 1. Thus, a depleted layer can be reliably formed in the semiconductor substrate W between the memory gate structure 2 and the first select gate structure 3. The depleted layer prevents the potential at the surface of the semiconductor substrate W directly below the memory gate structure 2 from reaching at the first select gate insulating film 15a, thereby preventing dielectric breakdown of the first select gate insulating film 15a due to the potential at the surface of the semiconductor substrate W.

Additionally, no impurity diffusion region having a high impurity concentration is formed in a region of the semiconductor substrate W between the memory gate structure 2 and the second select gate structure 4. Thus, a depleted layer can be reliably formed in the semiconductor substrate W between the memory gate structure 2 and the second select gate structure 4. The depleted layer prevents the potential at the surface of the semiconductor substrate W directly below the memory gate structure 2 from reaching at the second select gate insulating film 15b, thereby preventing dielectric breakdown of the second select gate insulating film 15b due to the potential at the surface of the semiconductor substrate W.

In the carrier removing operation described above, for example, carriers may be removed from the channel layer formation carrier region by blocking, through the second select gate structure 4, the electrical connection between the channel layer formation carrier region and the source region 6b to send carriers inside the channel layer formation carrier region to the drain region 6a, or by blocking, through the first select gate structure 3, the electrical connection between the channel layer formation carrier region and the drain region 6a to send carriers inside the channel layer formation carrier region to the source region 6b.

(1-2-2) Second Programming Method

When data is to be programmed to the memory cell 1, the second programming method is the same as "(1-2-1) First programming method" described above except that the carrier removing operation is not performed, and thus a description thereof will be omitted. When no charge is to be injected into the charge storage layer EC of the memory cell 1 at application of a high charge storage gate voltage to the metal memory gate electrode MG, the charge storage gate voltage of 12 V is applied from the memory gate line MGL to the metal memory gate electrode MG. Accordingly, the charge storage gate voltage is applied to the semiconductor substrate W to form a channel layer along the surface of the semiconductor substrate W facing to the metal memory gate electrode MG.

For example, a gate off voltage of 0 V is applied from the second select gate line SGL to the metal second select gate electrode SG of the second select gate structure 4 of the memory cell 1, and a source off voltage of 0 V is applied from the source line SL to the source region 6b. Accordingly, the semiconductor substrate W below the second select gate structure 4, facing to the metal second select gate electrode SG, becomes a non-conductive state to block the electrical connection between the source region 6b connected with the source line SL and the channel layer below the memory gate structure 2.

Additionally, for example, a first select gate voltage of 1.5 V is applied from the first select gate line DGL to the metal first select gate electrode DG of the first select gate structure 3 of the memory cell 1, and an off voltage of 1.5 V is applied from the bit line BL to the drain region 6a. Accordingly, the semiconductor substrate W below the first select gate structure 3, facing to the metal first select gate electrode DG, becomes a non-conductive state to block the electrical connection between the drain region 6a connected with the bit line BL and the channel layer below the memory gate structure 2.

In this case, the semiconductor substrate W is in a non-conductive state below the first select gate structure 3 and the second select gate structure 4 on both sides of the memory gate structure 2 of the memory cell 1. Accordingly, the electrical connection between the channel layer, which is formed in the surface of the semiconductor substrate W by the metal memory gate electrode MG, and each of the drain region 6a and the source region 6b is blocked, so that a depleted layer is formed around the channel layer.

The three-layered configuration of the upper memory gate insulating film 11, the charge storage layer EC, and the lower memory gate insulating film 10 forms a capacitor (gate-insulator capacitor), and the depleted layer formed in the semiconductor substrate W and enclosing the channel layer forms a capacitor (depletion-layer capacitor). The gate-insulator capacitor and the depletion-layer capacitor are connected in series. For example, when the gate-insulator capacitor has a capacitance three times larger than that of the depletion-layer capacitor, the channel layer has a channel potential of 9 V.

Accordingly, when the charge storage gate voltage of 12 V is applied to the metal memory gate electrode MG of the memory gate structure 2, the voltage difference between the metal memory gate electrode MG and the channel layer has a reduced value of 3 V since the channel layer enclosed by the depleted layer m the semiconductor substrate W has a channel potential of 9 V. As a result, the quantum tunneling effect does not occur, and thus charge injection into the charge storage layer EC is prevented.

When the above-described operation is executed in the memory cell 1, the channel potential at start of the operation potentially varies depending on a charge storage state in the memory cell 1. Thus, it is more desirable to perform, before the data programming operation, an additional operation to set the channel potential of the memory cell 1 equal to the potential of the bit line BL or the source line SL by setting, for example, the potential of the bit line BL or the source line SL to 0 V, the potential of the metal first select gate electrode DG or the metal second select gate electrode SG to 1.5 V, and the potential of the metal memory gate electrode MG to 1.5 V. In this case, after the channel potential is thus set, the gate off voltage of 0 V may be set back to the metal first select gate electrode DG or the metal second select gate electrode SG before the programming operation.

(1-3) Other Operations

In a reading operation, the bit line BL connected with the memory cell 1 from which data is to be read is precharged to, for example, 1.5 V. Then, whether charge is stored in the charge storage layer EC is determined by detecting the potential of the bit line BL, which changes depending on whether current flows through the memory cell 1 when the source line SL is set to 0 V. Specifically, at data reading, when charge is stored in the charge storage layer EC of the memory gate structure 2 (when data is programmed), the semiconductor substrate W directly below the memory gate structure 2 is in a non-conductive state to block the electrical connection between the drain region 6a and the source region 6b. Accordingly, in the memory cell 1 from which data is to be read, a reading voltage of 1.5 V applied to the bit line BL connected with the drain region 6a adjacent to the first select gate structure 3 is maintained intact.

At data reading, when no charge is stored in the charge storage layer EC of the memory gate structure 2 (when no data is programmed), the semiconductor substrate W directly below the memory gate structure 2 is in a conductive slate. Accordingly, the drain region 6a and the source region 6b are electrically connected with each other, and thus the source line SL at 0 V and the bit line BL at 1.5 V are electrically connected with each other through the memory cell 1. Thus, in the memory cell 1 from which data is to be read, the reading voltage of 1.5 V applied to the bit line BL is applied to the source line SL at 0 V and decreases accordingly. In a semiconductor integrated circuit device including a plurality of the memory cells 1 thus configured, a data reading operation on whether charge is stored in the charge storage layer EC of each memory cell 1 can be executed by detecting whether the reading voltage applied to the bit line BL has changed.

At a data erasing operation of removing charge inside the charge storage layer EC of the memory cell 1, a memory gate voltage of −12 V is applied from the memory gate line MGL to the metal memory gate electrode MG to remove the charge inside the charge storage layer EC toward the semiconductor substrate W at 0 V, thereby achieving data erasing.

Figure 2:
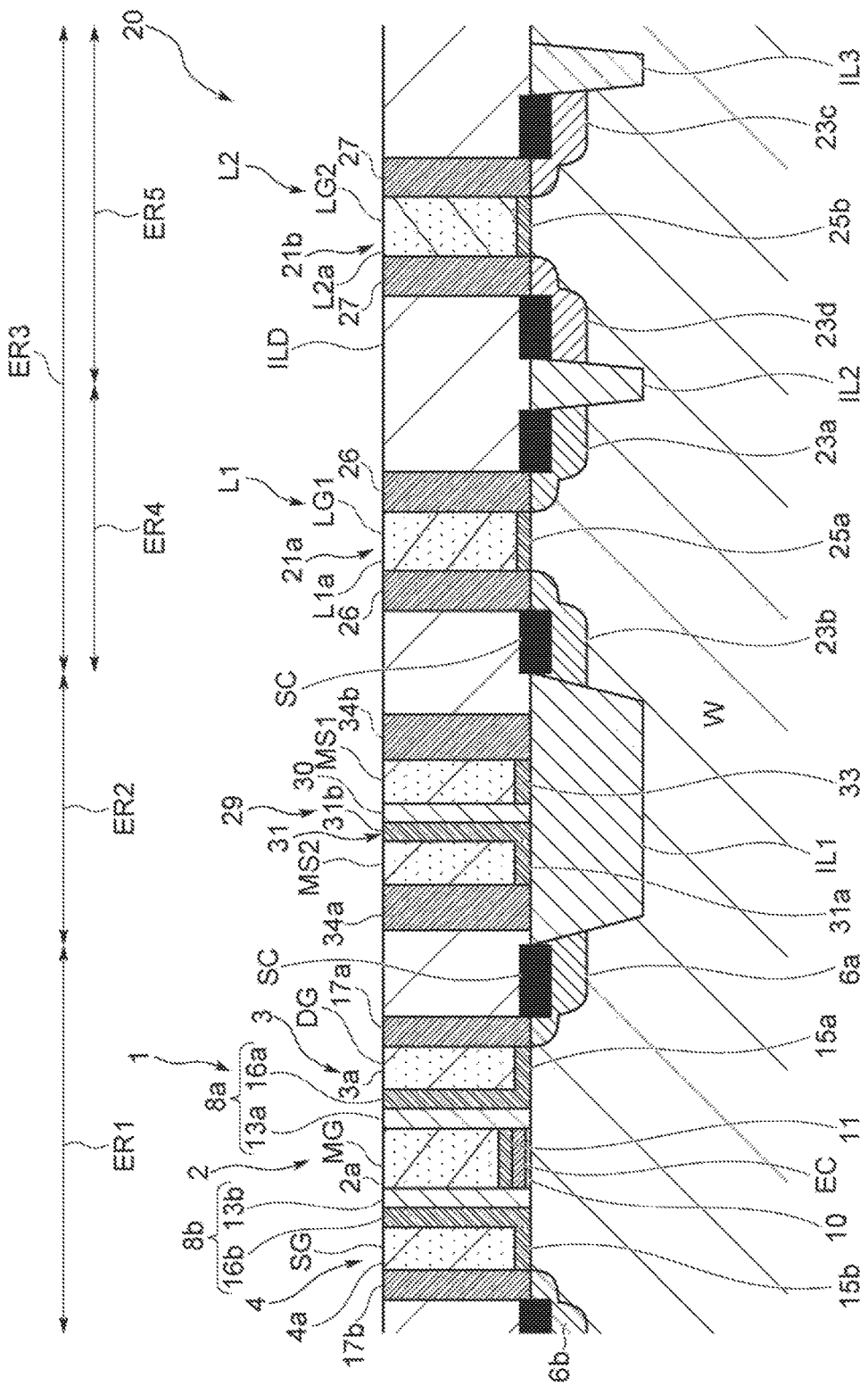
FIG. 2 is a schematic view illustrating a sectional configuration of a semiconductor integrated circuit device according to the first embodiment.

(1-4) Configuration of Semiconductor Integrated Circuit Device According to First Embodiment A semiconductor integrated circuit device including the memory cell 1 according to the present invention has a configuration in which a plurality of the memory cells 1 are arranged in a matrix of rows and columns. The semiconductor integrated circuit device also includes a peripheral circuit in addition to the memory cells 1. FIG. 2 is a schematic view illustrating a sectional configuration of a region of a semiconductor integrated circuit device 20 in which, for example, one memory cell 1 and two peripheral circuits L1 and L2 are provided. In this case, the semiconductor integrated circuit device 20 includes a memory circuit region ER1 in which the memory cell 1 is provided, and a peripheral circuit region ER3 in which the peripheral circuits L1 and L2 are provided. The memory circuit region ER1 and the peripheral circuit region ER3 are separated from each other by a barrier region ER2. The peripheral circuit region ER3 includes, for example, a NMOS peripheral circuit region ER4 in which the peripheral circuit L1 included in an N-type MOS transistor structure is disposed, and a PMOS peripheral circuit region ER5 in which the peripheral circuit L2 included in P-type MOS transistor structure is disposed.

An element separation layer IL2 is disposed in the surface of the semiconductor substrate W between the NMOS peripheral circuit region ER4 and the PMOS peripheral circuit region ER5.

Since the memory cell 1 disposed in the memory circuit region ER1 is described above with reference to FIG. 1, the following omits description of the memory circuit region ER1. The following description will be made on the barrier region ER2 and the peripheral circuit region ER3. In this case, an impurity diffusion region 23a and an impurity diffusion region 23b are disposed in the surface of the semiconductor substrate W in the NMOS peripheral circuit region ER4 provided in the peripheral circuit region ER3. The impurity diffusion region 23a is in contact with the element separation layer IL2 between the NMOS peripheral circuit region ER4 and the PMOS peripheral circuit region ER5. The impurity diffusion region 23b is in contact with an element separation layer IL1 in the barrier region ER2.

In the NMOS peripheral circuit region ER4 of the peripheral circuit region ER3, N-type impurities are added in the impurity diffusion regions 23a and 23b separated from each other in the surface of the semiconductor substrate W. A logic gate structure 21a is disposed on the surface of the semiconductor substrate W between the impurity diffusion regions 23a and 23b. The logic gate structure 21a includes a metal logic gate electrode LG1 disposed on the semiconductor substrate W through a logic gate insulating film 25a.

In the present embodiment, the logic gate insulating dim 25a is made of for example, an insulating material (in this case, a high-k material) the same as that of the upper memory gate insulating film 11 of the memory cell 1. The logic gate insulating film 25a has a thickness of 9 nm or smaller, preferably 3 nm or smaller. The metal logic gate electrode LG1 is made of, for example, a metallic material the same as those of the metal memory gate electrode MG, the metal first select gate electrode DG, and the metal second select gate electrode SG. The metal logic gate electrode LG1 includes a planarized top surface L1a that is a top surface planarized through planarizing treatment such as CMP performed in a manufacturing process, at a height the same as the planarized top surfaces 2a, 3a, and 4a of the memory cell 1. In the present embodiment, in the semiconductor integrated circuit device 20, the metal memory gate electrode MG, the metal first select gate electrode DG, and the metal second select gate electrode SG provided in the memory circuit region ER1 are made of an N-type MOS metallic material (for example, aluminum (Al), titanium aluminide (TiAl), tantalum carbide (TaC), or tantalum silicon nitride (TaSiN)), and the metal logic gate electrode LG1 provided in the NMOS peripheral circuit region ER4 is made of an N-type MOS metallic material like the metal memory gate electrode MG, the metal first select gate electrode DG, and the metal second select gate electrode SG.

In the peripheral circuit L1, sidewall structures 26 made of for example, SiN are disposed on respective facing sidewalk of the logic gate structure 21a. Low-concentration regions of the impurity diffusion regions 23a and 23b are disposed directly below the respective sidewall structures 26. The silicide layers SC are disposed on the respective surfaces of the impurity diffusion regions 23a and 23b. Similarly to the metal logic gate electrode LG1, each sidewall structure 26 has a top surface planarized through planarizing treatment such as CMP performed in a manufacturing process.

An impurity diffusion region 23c and impurity diffusion region 23d are disposed in the surface of the semiconductor substrate W in the PMOS peripheral circuit region ER5 of the peripheral circuit region ER3. The impurity diffusion region 23c is in contact with an element separation layer IL3. The impurity diffusion region 23d is in contact with the element separation layer IL2 between the NMOS peripheral circuit region ER4 and the PMOS peripheral circuit region ER5. In the PMOS peripheral circuit region ER5 of the peripheral circuit region ER3, P-type impurities are added to the impurity diffusion regions 23c and 23d separated from each other in the surface of the semiconductor substrate W. A logic gate structure 21b is disposed in the surface of the semiconductor substrate W between the impurity diffusion regions 23c and 23d. The logic gate structure 21b includes a metal logic gate electrode LG2 disposed on the semiconductor substrate W through a logic gate insulating film 25b.

In the present embodiment, the logic gate insulating film 25b is made of, for example, an insulating material (in this case, a high-k material) the same as that of the upper memory gate insulating film 11. The logic gate insulating film 25b has a thickness of 9 nm or smaller, preferably 3 nm or smaller. The metal logic gate electrode LG2 is made of, for example, a metallic material having a work function different from those of the metal memory gate electrode MG, the metal first select gate electrode DG, and the metal second select gate electrode SG. The metal logic gate electrode LG2 has a planarized top surface L2a that is a top surface planarized through planarizing treatment such as CMP performed in a manufacturing process. In the present embodiment, the metal logic gate electrode LG2 provided in the PMOS peripheral circuit region ER5 is made of a P-type MOS metallic material (for example, aluminum (Al) or nitridation titanium (TiN)), unlike the metal memory gate electrode MG, the metal first select gate electrode DG, the metal second select gate electrode SG, and the metal logic gate electrode LG2 made of N-type MOS metallic materials.

Similarly to the peripheral circuit L1, in the peripheral circuit L2, sidewall structures 27 made of, for example, SiN are disposed on respective facing sidewalls of the logic gate structure 21b. Low-concentration regions of the impurity diffusion regions 23c and 23d are disposed directly below the respective sidewall structures 27. The silicide layers SC are disposed on the respective surfaces of the impurity diffusion regions 23c and 23d. Similarly to the metal logic gate electrode LG2, each sidewall Structure 27 has a top surface planarized through planarizing treatment such as CMP performed in a manufacturing process.

In the barrier region ER2, a remaining part 29 is disposed on the element separation layer IL1. The remaining part 29 remains through a process of manufacturing the memory gate structure 2, the first select gate structure 3, the second select gate structure 4, and the logic gate structures 21a and 21b. In this case, the remaining part 29 remains when the first select gate insulating film 15a and the second select gate insulating film 15b are formed. The remaining part 29 includes a remaining insulating film 31 made of an insulating material (in this case, a high-k material) the same as those of the first select gate insulating film 15a and the second select gate insulating film 15b and having an L-shaped section. The remaining insulating film 31 includes a bottom part 31a disposed on the element separation layer ILL and a wall part 31b erected on the element separation layer IL1 at an end side surface of the bottom part 31a. A remaining metal layer MS2 is disposed on the bottom part 31a and along a surface of the wall part 31b. In the remaining part 29, a sidewall structure 34a made of, for example, SiN is disposed along the bottom part 31a of the remaining insulating film 31 and a sidewall of the remaining metal layer MS2 on the bottom part 31a.

In the remaining part 29, a wall-shaped remaining sidewall insulating film 30 is provided along the other surface of the wall part 31b of the remaining insulating film 31. The remaining sidewall insulating film 30 remains when the sidewall insulating films 13a and 13b of the memory cell 1 are formed. The remaining sidewall insulating film 30 is made of an insulating material (for example, $SiO_2$) the same as those of the sidewall insulating films 13a and 13b. In the remaining part 29, a remaining insulating film 33 is disposed adjacent to the remaining sidewall insulating film 30 on the element separation layer IL1. The remaining insulating film 33 remains when the upper memory gate insulating film 11 and the logic gate insulating films 25a and 25b are formed. The remaining insulating film 33 is made of an insulating material (in this case, a high-k material) the same as those of the upper memory gate insulating film 11 and the logic gate insulating films 25a and 25b.

In the remaining part 29, a remaining metal layer MS1 is disposed along the remaining sidewall insulating film 30 on the remaining insulating film 33. A sidewall structure 34b made of for example, SiN is disposed along sidewalls of the remaining insulating film 33 and the remaining metal layer MS1. In this case, the sidewall structures 34a and 34b, the remaining metal layers MS1 and MS2, the remaining insulating film 31, and the remaining sidewall insulating film 30 in the remaining part 29 have top surfaces planarized through planarizing treatment such as CMP performed in a manufacturing process. In the semiconductor integrated circuit device 20, the memory cell 1 in the memory circuit region ER1, the remaining part 29 in the barrier region ER2, and the peripheral circuits L1 and L2 in the peripheral circuit region ER3 are each covered by an interlayer insulating layer ILD made of an insulating material such as $SiO_2$, and thus are insulated from each other.

Figure 3A:
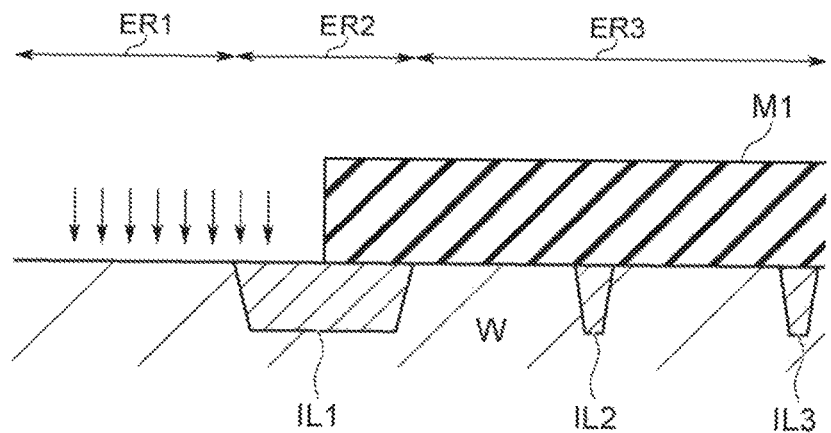
FIG. 3A is a schematic view illustrating process (1) of manufacturing the semiconductor integrated circuit device illustrated in FIG. 2.

(1-5) Method for Manufacturing Semiconductor Integrated Circuit Device According to First Embodiment When the semiconductor integrated circuit device 20 having the above-described configuration is manufactured in accordance with a manufacturing process described below, the memory cell 1 can be formed in the memory circuit region ER1 through a series of manufacturing processes of forming, in the peripheral circuit region ER3, the peripheral circuit L1 including the metal logic gate electrode LG1 made of an N-type MOS metallic material. In this case, as illustrated in FIG. 3A, first, for example, a plurality of the element separation layers IL1, IL2, and IL3 each made of an insulating material such as $SiO_2$ are formed at predetermined positions with predetermined intervals therebetween on the surface of the semiconductor substrate W made of Si by a shallow trench isolation (STI) method. In adjustment of a threshold voltage of the semiconductor substrate W in the peripheral circuit region ER3, for example, an ion implantation method is employed to inject P-type impurities into the semiconductor substrate W in the NMOS peripheral circuit region ER4 between the element separation layers IL1 and IL2, and N-type impurities into the semiconductor substrate W in the PMOS peripheral circuit region ER5 between the element separation layers IL2 and IL3.

Subsequently, resist patterning is performed by a photolithography technique to cover, with a resist M1, a partial region of the element separation layer IL1 disposed in the barrier region ER2 between the memory circuit region ER1 and the peripheral circuit region ER3 and the semiconductor substrate W in the peripheral circuit region ER3. Then, impurities such as B (boron), P (phosphorus), and As (arsenic) are injected into the semiconductor substrate W in the memory circuit region ER1 by the ion implantation method or the like to adjust the threshold voltage of the semiconductor substrate W in a formation target region (hereinafter also referred to as a memory gate electrode formation target region) in which the metal memory gate electrode MG (FIG. 2) is to be formed.

Figure 3B:
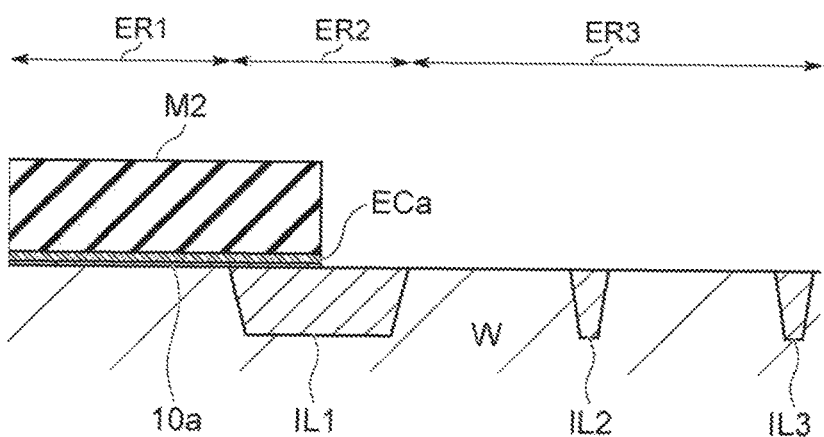
FIG. 3B is a schematic view illustrating process (2) of manufacturing the semiconductor integrated circuit device illustrated in FIG. 2.

Subsequently, after the resist M1 is removed, a layered lower memory gate insulating film made of, for example. SiO$_2$, and a charge storage layer made of, for example, SiN are stacked in this order across the memory circuit region ER1, the barrier region ER2, and the peripheral circuit region ER3. Then, resist patterning is performed by the photolithography technique to cover, with a resist M2, the memory circuit region ER1 and a partial region of the barrier region ER2, as illustrated in FIG. 3B, in which any corresponding part to that in FIG. 3A is denoted by an identical reference sign. Thereafter, the lower memory gate insulating film and the charge storage layer in the barrier region ER2 and the peripheral circuit region ER3 that are exposed through the resist M2 are removed. In this manner, a layered lower memory gate insulating film 10a and a layered charge storage layer ECa are formed only on the memory circuit region ER1 and the partial region of the barrier region ER2.

Figure 3C:
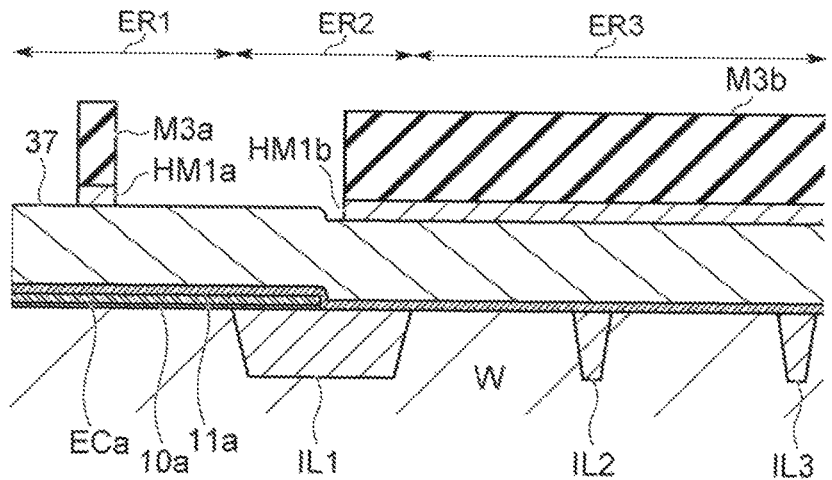
FIG. 3C is a schematic view illustrating process (3) of manufacturing the semiconductor integrated circuit device illustrated in FIG. 2.

Subsequently, after the resist M2 is removed, a layered first insulating film 11a made of an insulating material (for example, a high-k material) different from that of the lower memory gate insulating film 10a is formed across the charge storage layer ECa in the memory circuit region ER1, the element separation layer IL1 in the barrier region ER2, and the semiconductor substrate W in the peripheral circuit region ER3 as illustrated in FIG. 3C, in which any corresponding part to that in FIG. 3B is denoted by an identical reference sign. Then, a layered logic dummy electrode layer 37 made of, for example, polysilicon is stacked on the first insulating film 11a (a first dummy electrode layer forming process).

Subsequently, after a layered hard mask layer is formed on the logic dummy electrode layer 37 and patterned by using resists M3a and M3b patterned by the photolithography technique. In this case, the resist M3a is formed on the memory gate electrode formation target region in the memory circuit region ER1, and the resist M3b is formed to cover the entire surface of the peripheral circuit region ER3. Then, the hard mask layer exposed using the resists M3a and M3b is removed to leave a hard mask layer HM1a on the memory gate electrode formation target region in the memory circuit region ER1, and a hard mask layer HM1b on the entire surface of the peripheral circuit region ER3.

Figure 4A:
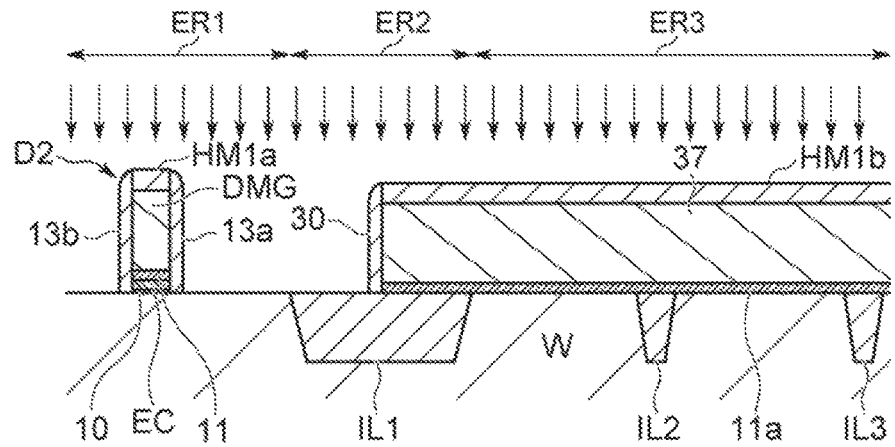
FIG. 4A is a schematic view illustrating process (4) of manufacturing the semiconductor integrated circuit device illustrated in FIG. 2.

Subsequently, after the resists M3a and M3b are removed, the logic dummy electrode layer 37, the first insulating film 11a, the charge storage layer ECa, and the lower memory gate insulating film 10a in the memory circuit region ER1 and the barrier region ER2 are removed in this order by using the hard mask layers HM1a and HM1b as masks. As a result, as illustrated in FIG. 4A, in which any corresponding part to that in FIG. 3C is denoted by an identical reference sign, a dummy memory gate structure D2 in which the lower memory gate insulating film 10, the charge storage layer EC, the upper memory gate insulating film 11, and a dummy memory gate electrode DMG are slacked in this order is formed in the memory gate electrode formation target region in the memory circuit region ER1. The upper memory gate insulating film 11 is formed by fabricating the first insulating film 11a in the memory circuit region ER1.

Simultaneously, the first insulating film 11a and the logic dummy electrode layer 37 remain intact in the peripheral circuit region ER3 through the hard mask layer HM1b (a dummy memory gate structure forming process). In this manner, in the present embodiment, the logic dummy electrode layer 37, which is provided for forming a dummy logic gate electrodes DLG1 and DLG2 (FIG. 5B) to be described later in a later manufacturing process, is used to form the dummy memory gate electrode DMG in the memory circuit region ER1.

Subsequently, after a layered insulating film made of, for example, SiO$_2$ is formed across the memory circuit region ER1, the barrier region ER2, and the peripheral circuit region ER3, the sidewall-shaped sidewall insulating films 13a and 13b are formed along facing sidewalls of the dummy memory gate structure D2 in the memory circuit region ER1 as illustrated in FIG. 4A by etching back (a sidewall insulating film forming process). Simultaneously, the insulating film remains on sidewalls of the logic dummy electrode layer 37 and the first insulating film 11a disposed in the barrier region ER2, and accordingly the sidewall-shaped remaining sidewall insulating film 30 is formed.

Subsequently, impurities such as B (boron), P (phosphorus), and As (arsenic) are injected into the semiconductor substrate W in the memory circuit region ER1 not covered by the hard mask layers HM1a and HM1b and the sidewall insulating films 13a, 13b, and 30 by the ion implantation method or the like to adjust the threshold voltage of the semiconductor substrate W in a formation target region (hereinafter also referred to as a select gate electrode formation target region) of the metal first select gate electrode DG and the metal second select gate electrode SG (FIG. 2) to be formed in a later manufacturing process.

Figure 4B:
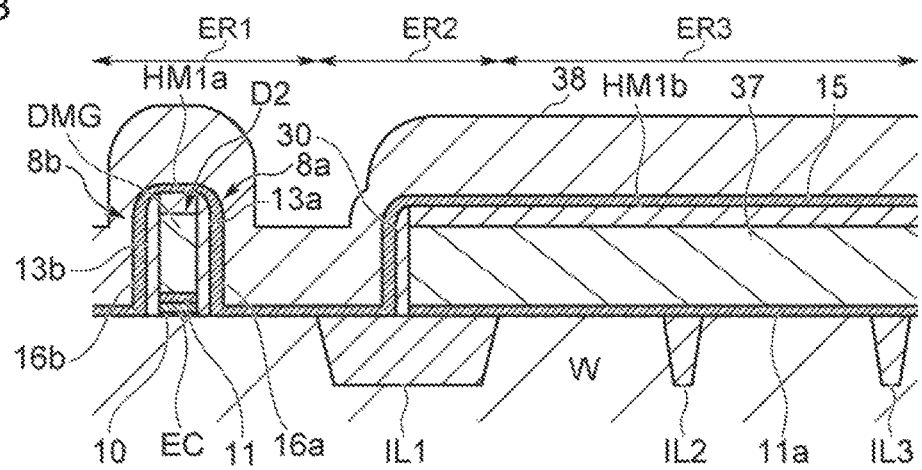
FIG. 4B is a schematic view illustrating process (5) of manufacturing the semiconductor integrated circuit device illustrated in FIG. 2.

Subsequently, as illustrated in FIG. 4B, in which any corresponding part to that in FIG. 4A is denoted by an identical reference sign, a layered second insulating film 15 made of an insulating material (for example, a high-k material) the same as that of the upper memory gate insulating film 11 is formed across the memory circuit region ER1, the barrier region ER2, and the peripheral circuit region ER3. Thereafter, a layered memory dummy electrode layer 38 made of for example, polysilicon is formed on the second insulating film 15. The second insulating film 15 is provided in a wall shape along the sidewall insulating film 13a on a first sidewall of the dummy memory gate structure D2, thereby forming the first select gate sidewall insulating film 16a. In addition, the second insulating film 15 is provided in a wall shape along the sidewall insulating film 13b on a second sidewall of the dummy memory gate structure D2, thereby forming the second select gate sidewall insulating film 16b. Accordingly, the sidewall spacer 8a made of the sidewall insulating film 13a and the first select gate sidewall insulating film 16a is formed on the first sidewall of the dummy memory gate structure D2, and the sidewall spacer 8b made of the sidewall insulating film 13b and the second select gate sidewall insulating film 16b is formed on the second sidewall thereof.

Figure 4C:
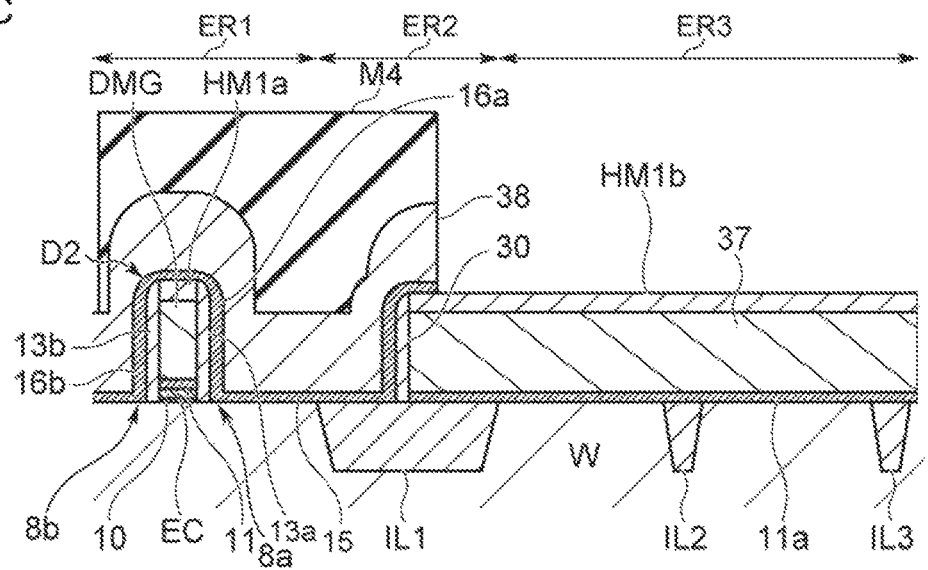
FIG. 4C is a schematic view illustrating process (6) of manufacturing the semiconductor integrated circuit device illustrated in FIG. 2.

Subsequently, as illustrated in FIG. 4C, in which any corresponding part to that in FIG. 4B is denoted by an identical reference sign, the memory circuit region ER1 and a partial region of the barrier region ER2 are covered by a resist M4 patterned by the photolithography technique. Then, the memory dummy electrode layer 38 and the second insulating film 15 formed in the peripheral circuit region ER3 and the other partial region of the barrier region ER2, which are not covered by the resist M4, are removed. Accordingly, the layered memory dummy electrode layer 38 and the layered second insulating film 15 remain in the memory circuit region ER1 and the partial region of the barrier region ER2, which are covered by the resist M4 (a second dummy electrode layer forming process).

Figure 5A:
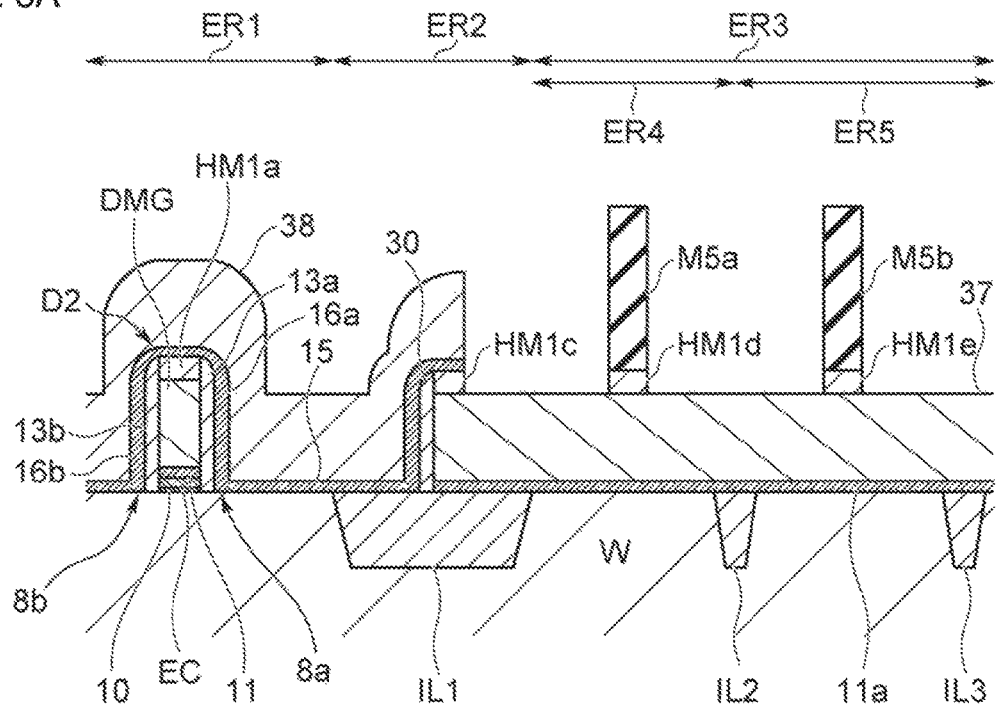
FIG. 5A is a schematic view illustrating process (7) of manufacturing the semiconductor integrated circuit device illustrated in FIG. 2.

Subsequently, after the resist M4 is removed, a new layered resist is formed across the memory circuit region ER1, the barrier region ER2, and the peripheral circuit region ER3. Subsequently, as illustrated in FIG. 5A, in which any corresponding part to that in FIG. 4C is denoted by an identical reference sign, resist patterning is performed by the photolithography technique to form resists M5a and M5b covering a formation target region (hereinafter also referred to as a logic gate electrode formation target region) of the metal logic gate electrodes LG1 and LG2 (FIG. 2) to be formed in the peripheral circuit region ER3 through a later manufacturing process. The hard mask layer HM1b (FIG. 4C) in the peripheral circuit region ER3 and the barrier region ER2 is patterned by using the resists M5a and M5b to form hard mask layers HM1d and HM1e covering the logic gate electrode formation target region.

Subsequently, after the resists M5a and M5b are removed, the remaining hard mask layers HM1d and HM1e are used as masks to etch back the memory dummy electrode layer 38 in the memory circuit region ER1 and the barrier region ER2, the second insulating film 15 covered by the memory dummy electrode layer 38, the logic dummy electrode layer 37 in the barrier region ER2 and the peripheral circuit region ER3, and the first insulating film 11a covered by the logic dummy electrode layer 37.

Figure 5B:
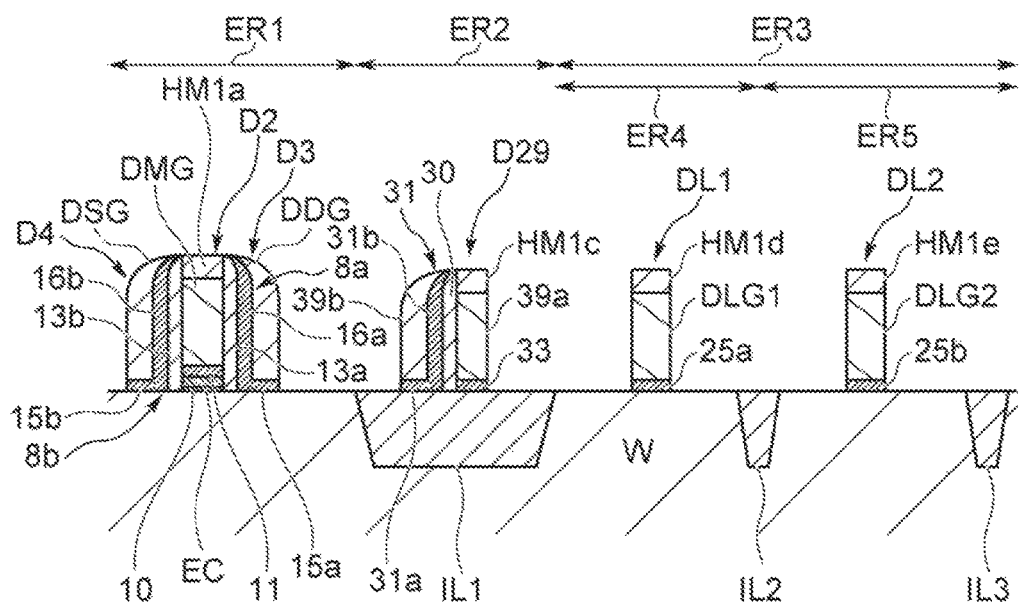
FIG. 5B is a schematic view illustrating process (8) of manufacturing the semiconductor integrated circuit device illustrated in FIG. 2.

Accordingly, as illustrated in FIG. 5B, in which any corresponding part to that in FIG. 5A is denoted by an identical reference sign, in the memory circuit region ER1, the memory dummy electrode layer 38 remains in a sidewall shape along the sidewall spacer 8a on the first sidewall of the dummy memory gate structure D2, forming a dummy first select gate electrode DDG, and in addition, the second insulating film 15 remains below the dummy first select gate electrode DDG, forming the first select gate insulating film 15a. In this manner, a dummy first select gate structure D3 including the sidewall-shaped dummy first select gate electrode DDG on the first select gate insulating film 15a is formed.

Simultaneously, in the memory circuit region ER1, the memory dummy electrode layer 38 remains in a sidewall shape along the sidewall spacer 8b on the second sidewall of the dummy memory gate structure D2, forming a dummy second select gate electrode DSG, and in addition, the second insulating film 15 remains below the dummy second select gate electrode DSG, forming the second select gate insulating film 15b. In this manner, a dummy second select gate structure D4 including the sidewall-shaped dummy second select gate electrode DSG on the second select gate insulating film 15b is formed.

Additionally, simultaneously, in the peripheral circuit region ER3, the logic dummy electrode layer 37 remains on the logic gate electrode formation target region through the hard mask layers HM1d and HM1e, forming dummy logic gate electrodes DGL1 and DGL2, and the first insulating film 11a remains below the dummy logic gate electrodes DLG1 and DLG2, forming the logic gate insulating films 25a and 25b, respectively. In this manner, dummy logic gate structures DL1 and DL2 in which the dummy logic gate electrodes DLG1 and DLG2 are stacked through the logic gate insulating films 25a and 25b, respectively, on the semiconductor substrate W in the peripheral circuit region ER3 are formed when the dummy first select gate structure D3 and the dummy second select gate structure D4 are formed in the memory circuit region ER1 (a dummy gate electrode forming process).

The dummy first select gate electrode DDG and the dummy second select gate electrode DSG, which are formed through the dummy gate electrode forming process, can be formed to have a desired width by adjusting the thickness of the memory dummy electrode layer 38, which is formed through the second dummy electrode layer forming process described above.

When the hard mask layers HM1d and HM1e are formed, a hard mask layer HM1c remains in a region covered by the memory dummy electrode layer 38 and the second insulating film 15 in the barrier region ER2 (FIG. 5A). In addition to the hard mask layer HM1c, the first insulating film 11a, the second insulating film 15, the logic dummy electrode layer 37, and the memory dummy electrode layer 38 remain around the remaining sidewall insulating film 30 in the barrier region ER2, forming a dummy remaining part D29. In the barrier region ER2, the second insulating film 15 remains in an L-shaped section along one surface of the wall-shaped remaining sidewall insulating film 30 and the element separation layer ILL forming the remaining insulating film 31, and the memory dummy electrode layer 38 remains in a sidewall shape along the bottom part 31a of the remaining insulating film 31 and the wall part 31b, forming a memory dummy electrode remaining part 39b. In the barrier region ER2, the logic dummy electrode layer 37 remains in a region disposed adjacent to the other surface of the remaining sidewall insulating film 30 and covered by the hard mask layer HM1c, forming a logic dummy electrode remaining part 39a, and the first insulating film 11a remains in a region covered by the logic dummy electrode remaining part 39a, forming the remaining insulating film 33 on the element separation layer IL1.

Figure 6A:
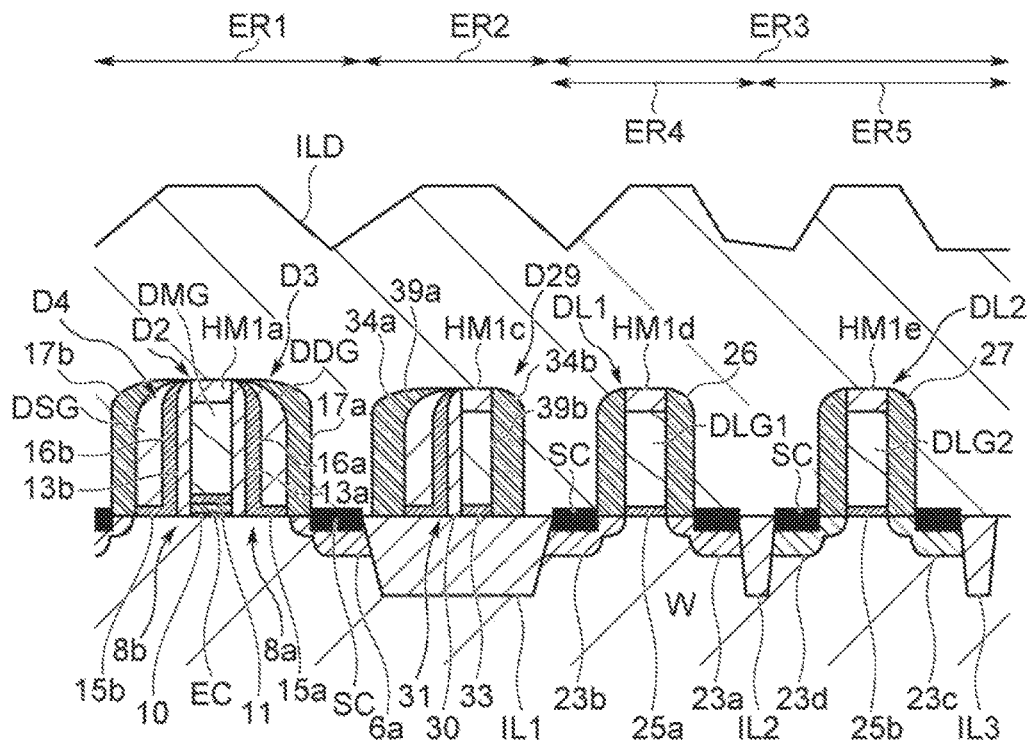
FIG. 6A is a schematic view illustrating process (9) of manufacturing the semiconductor integrated circuit device illustrated in FIG. 2.

Subsequently, as illustrated in FIG. 6A, in which any corresponding part to that in FIG. 5B is denoted by an identical reference sign, low concentration of N-type impurities or P-type impurities are injected into the memory circuit region ER1 and the peripheral circuit region ER3 by the ion implantation method or the like using a resist (not illustrated) patterned for the N type or the P type. Accordingly, the drain region 6a and the source region 6b are formed in the surface of the semiconductor substrate W in the memory circuit region ER1, and the impurity diffusion regions 23a, 23b, 23c, and 23d are formed in the surface of the semiconductor substrate W in the peripheral circuit region ER3. Subsequently, a layered insulating layer (not illustrated) made of, for example, SiN is formed across the memory circuit region ER1, the barrier region ER2, and the peripheral circuit region ER3, and then etched back. Accordingly, the insulating layer remains on sidewalls of the dummy first select gate structure D3 and the dummy second select gate structure D4, forming the sidewall structures 17a and 17b, and the insulating layer also remains on facing sidewalls of the dummy logic gate structures DL1 and DL2, forming the sidewall structures 26 and 27. The insulating layer also remains around the logic dummy electrode remaining part 39a and the memory dummy electrode remaining part 39b in the dummy remaining part D29 in the barrier region ER2, forming the sidewall structures 34a and 34b.

Thereafter, in addition to the above-described process, the following processes are sequentially performed: a process of forming high-concentration impurity regions in the drain region 6a and the source region 6b in the memory circuit region ER1 and the impurity diffusion regions 23a, 23b, 23c, and 23d in the peripheral circuit region ER3 by injecting high concentration of N-type impurities or P-type impurities into necessary places of the semiconductor substrate W by the ion implantation method or the like; a process of forming the silicide layer SC on the drain region 6a, the source region 6b, and the impurity diffusion regions 23a, 23b, 23c, and 23d; and a process of forming the interlayer insulating layer ILD to cover, for example, the dummy memory gate structure D2, the dummy first select gate structure D3, the dummy second select gate structure D4, the dummy logic gate structures DL1 and DL2, and the dummy remaining part D29.

Figure 6B:
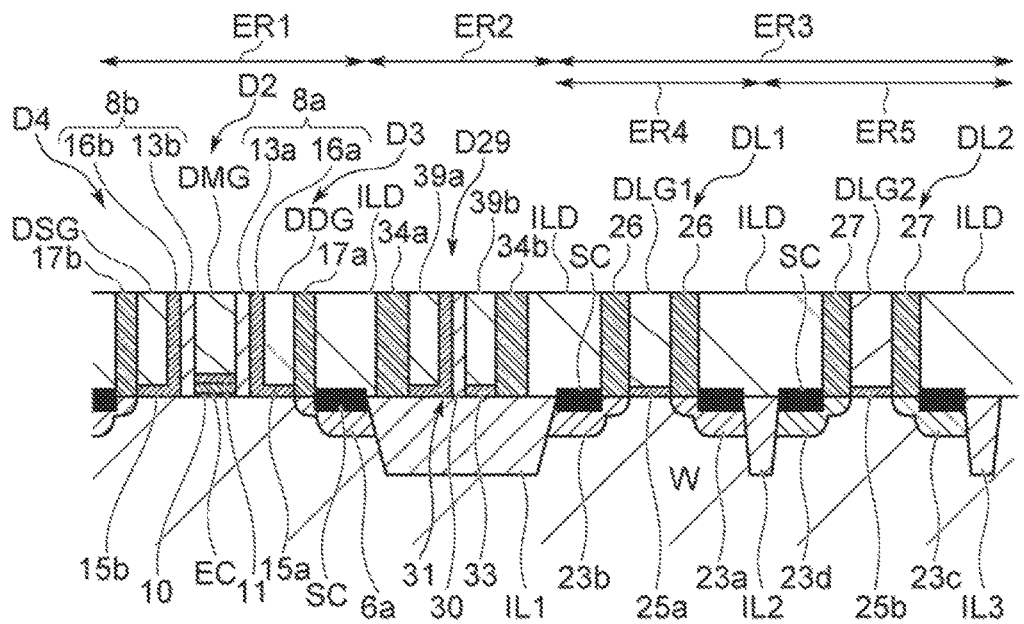
FIG. 6B is a schematic view illustrating process (10) of manufacturing the semiconductor integrated circuit device illustrated in FIG. 2.

Subsequently, planarizing treatment such as CMP is performed to polish and planarize a surface of the interlayer insulating layer ILD, and further polish and planarize surfaces of the hard mask layers HM1a, HM1c, HM1d, and HM1e, the dummy memory gate structure D2, the dummy first select gate structure D3, the dummy second select gate structure D4, the dummy logic gate structures DL1 and DL2, and the dummy remaining part D29 that are exposed from a top surface of the interlayer insulating layer ILD. In this manner, as illustrated in FIG. 6B, in which any corresponding part to that in FIG. 6A is denoted by an identical reference sign, planarized top surfaces of the dummy memory gate electrode DMG, the dummy first select gate electrode DDG, the dummy second select gate electrode DSG, the dummy logic gate electrodes DLG1 and DLG2, the logic dummy electrode remaining part 39a, and the memory dummy electrode remaining part 39b are exposed on the planarized surface of the interlayer insulating layer ILD.

Subsequently, the PMOS peripheral circuit region ER5 is covered by a resist, whereas the memory circuit region ER1, the barrier region ER2, and the NMOS peripheral circuit region ER4 are exposed. In this state, dry etching using, for example, carbon tetrafluoride (CF$_4$) is performed to remove the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b, which are exposed on the surface of the interlayer insulating layer ILD. Thereafter, the resist on the PMOS peripheral circuit region ER5 is removed.

Subsequently, a metal electrode layer made of an N-type MOS metallic material such as aluminum (Al), titanium aluminide (TiAl), tantalum carbide (TaC), or tantalum silicon nitride (TaSiN) is formed on the surface of the interlayer insulating layer ILD and embedded in electrode formation spaces from which the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b have been removed. Thereafter, a surface of the metal electrode layer is polished through planarizing treatment such as CMP and planarized in accordance with the surface of the interlayer insulating layer ILD. In the PMOS peripheral circuit region ER5 of the peripheral circuit region ER3, since the dummy logic gate electrode DLG2 is not removed but remains intact in a state in which it is formed, the metal electrode layer on the dummy logic gate electrode DLG2 and the interlayer insulating layer ILD is removed through the planarizing treatment.

Accordingly, as illustrated in FIG. 2, in the memory circuit region ER1, the metal memory gate electrode MG is formed as the metal electrode layer embedded in the electrode formation space in which the dummy memory gate electrode DMG has been formed, the metal first select gate electrode DG is formed as the metal electrode layer embedded in the electrode formation space in which the dummy first select gate electrode DDG has been formed, and the metal second select gate electrode SG is formed as the metal electrode layer embedded in the electrode formation space in which the dummy second select gate electrode DSG has been formed.

Simultaneously, in the NMOS peripheral circuit region ER4 of the peripheral circuit region ER3, the metal logic gate electrode LG1 made of an N-type MOS metallic material is formed as the metal electrode layer embedded in the electrode formation space in which the dummy logic gate electrode DLG1 has been formed (a metal gate electrode forming process). In addition, simultaneously, in the barrier region ER2, the remaining metal layers MS1 and MS2 made of an N-type MOS metallic material are formed as the metal electrode layer embedded in the electrode formation spaces from which the logic dummy electrode remaining part 39a and the memory dummy electrode remaining pact 39b have been removed. Accordingly, the metal memory gate electrode MG, the metal first select gate electrode DG, the metal second select gate electrode SG, and the metal logic gate electrode LG1 are formed from the same layer (metal electrode layer) through the same manufacturing process.

Subsequently, the memory circuit region ER1, the barrier region ER2, and the NMOS peripheral circuit region ER4 are covered by a resist, whereas the PMOS peripheral circuit region ER5 is exposed. In this state, dry etching using, for example, carbon tetrafluoride (CF$_4$) is performed to remove the dummy logic gate electrode DLG2 exposed on the surface of the interlayer insulating layer ILD. Thereafter, the resist is removed. Subsequently, another metal electrode layer made of a P-type MOS metallic material such as aluminum (Al) or nitridation titanium (TiN) is formed on the surface of the interlayer insulating layer ILD to embed the metal electrode layer in an electrode formation space from which the dummy logic gate electrode DLG2 has been removed. Subsequently, a surface of the metal electrode layer is polished through planarizing treatment such as CMP to planarize the surface of the metal electrode layer in accordance with the surface of the interlayer insulating layer ILD.

Accordingly, as illustrated in FIG. 2, in the PMOS peripheral circuit region ER5 of the peripheral circuit region ER3, the P-type MOS metal electrode layer is embedded in the electrode formation space in which the dummy logic gate electrode DLG2 has been formed, forming the metal logic gate electrode LG2 made of a P-type MOS metallic material. Thereafter, a process of forming various contacts such as a first select gate contact, a second select gate contact, and a memory gate contact, which are not illustrated in FIG. 2, at predetermined places of the interlayer insulating layer ILD is performed to complete manufacturing of the semiconductor integrated circuit device 20.

(1-6) Operations and Effects

In the above-described configuration, the memory cell 1 includes: the memory gate structure 2 in which the lower memory gate insulating film 10, the charge storage layer EC, the upper memory gate insulating film 11, and the metal memory gate electrode MG are stacked in this order on the semiconductor substrate W between the drain region 6a and the source region 6b; the first select gate structure 3 disposed along a sidewall of the sidewall spacer 8a provided on the first sidewall of the memory gate structure 2; and the second select gate structure 4 disposed along a sidewall of the sidewall spacer 8b provided on the second sidewall of the memory gate structure 2.

The first select gate structure 3 includes the metal first select gate electrode DG provided, through the first select gate insulating film 15a, on the semiconductor substrate W between the drain region 6a connected with the bit line BL and the sidewall spacer 8a provided on the sidewall of the memory gate structure 2. The second select gate structure 4 includes the metal second select gate electrode SG provided, through the second select gate insulating film 15b, on the semiconductor substrate W between the source region 6b connected with the source line SL and the sidewall spacer 8b provided on the sidewall of the memory gate structure 2.

The metal memory gate electrode MG, the metal first select gate electrode DG, and the metal second select gate electrode SG of the memory cell 1 thus configured can be formed of a metallic material the same as that of the metal logic gate electrode LG1 of the peripheral circuit L1. Thus, the metal memory gate electrode MG, the metal first select gate electrode DG, and the metal second select gate electrode SG can be formed through a series of manufacturing processes of forming the metal logic gate electrode LG1 made of a predetermined metallic material on the semiconductor substrate W.

In the memory cell 1, the planarized top surface 3a of the metal first select gate electrode DG, the planarized top surface 4a of the metal second select gate electrode SG, and the planarized top surface 2a of the metal memory gate electrode MG are planarized through the same planarizing treatment in a manufacturing process. Accordingly, the memory gate structure 2, the first select gate structure 3, and the second select gate structure 4 have the same height, and the metal memory gate electrode MG does not protrude relative to the metal first select gate electrode DG and the metal second select gate electrode SG, thereby achieving reduction of the entire size.

In the memory cell 1, in order to prevent, by the first programming method, charge injection into the charge storage layer EC when a charge storage gate voltage enough to allow charge injection into the charge storage layer EC is applied to the metal memory gate electrode MG, carriers induced in the channel layer formation carrier region of the semiconductor substrate W facing to the metal memory gate electrode MG are removed from the channel layer formation carrier region, and then the first select gate structure 3 blocks the electrical connection between the drain region 6a and the semiconductor substrate W in the region facing to the metal memory gate electrode MG, and the second select gate structure 4 blocks the electrical connection between the source region 6b and the semiconductor substrate W in the region facing to the metal memory gate electrode MG.

With this configuration, a depleted layer is formed in the channel layer formation carrier region without a channel layer in the memory cell 1. As a result, the potential at the surface of the semiconductor substrate W increases in accordance with the charge storage gate voltage, and the voltage difference between the metal memory gate electrode MG and the surface of the semiconductor substrate W decreases accordingly. In this manner, the charge injection into the charge storage layer EC is prevented, and the depleted layer prevents the potential at the surface of the semiconductor substrate W directly below the memory gate structure 2 from reaching at the first select gate insulating film 15a and the second select gate insulating film 15b.

Thus, voltage applied to the hit line BL and the source line SL in the memory cell 1 is not restricted by a high charge storage gate voltage necessary for injecting charge into the charge storage layer EC by the quantum tunneling effect, but can be reduced to voltage necessary for the first select gate structure 3 to block the electrical connection between the bit line BL and the semiconductor substrate W in the region facing to the metal memory gate electrode MG, or to voltage necessary for the second select gate structure 4 to block the electrical connection between the source line SL and the semiconductor substrate W in the region facing to the metal memory gate electrode MG. Thus, the thicknesses of the first select gate insulating film 15a of the first select gate structure 3 and the second select gate insulating film 15b of the second select gate structure 4 in the memory cell 1 can be reduced in accordance with the reduction of voltage applied to the bit line BL and the source line SL. The thickness reduction leads to a faster operation.

In the memory cell 1, in order to prevent, by the second programming method, charge injection into the charge storage layer EC when a charge storage gate voltage enough to allow charge injection into the charge storage layer EC is applied to the metal memory gate electrode MG to form a channel layer in the surface of the semiconductor substrate W facing to the metal memory gate electrode MG, the first select gate structure 3 blocks the electrical connection between the drain region 6a and the channel layer, and the second select gate structure 4 blocks the electrical connection between the source region 6b and the channel layer.

With this configuration, a depleted layer is formed around the semiconductor substrate W facing to the channel layer below the memory gate structure 2 in the memory cell 1. As a result, the channel potential of the channel layer increases in accordance with the charge storage gate voltage, and the voltage difference between the metal memory gate electrode MG and the channel layer decreases accordingly. In this manner, the charge injection into the charge storage layer EC is prevented, and the depleted layer blocks voltage application from the channel layer to the first select gate insulating film 15a and the second select gate insulating film 15b.

Thus, voltage applied to the bit line BL and the source line SL in the memory cell 1 is not restricted by a high charge storage gate voltage necessary for injecting charge into the charge storage layer EC by the quantum tunneling effect, but can be reduced to voltage necessary for the first select gate structure 3 and the second select gate structure 4 to block the electrical connection between the bit line BL and the channel layer and the electrical connection between the source line SL and the channel layer. Thus, the thicknesses of the first select gate insulating film 15a of the first select gate structure 3 and the second select gate insulating film 15b of the second select gate structure 4 in the memory cell 1 can be reduced in accordance with the reduction of voltage applied to the bit line BL and the source line SL. The thickness reduction leads to a faster operation.

In the method for manufacturing the semiconductor integrated circuit device 20 according to the present invention, as illustrated in FIGS. 3C and 4A, the logic dummy electrode layer 37, the first insulating film 11a, the charge storage layer ECa, and the lower memory gate insulating film 10a in the memory circuit region ER1 are patterned through the patterned resists M3a and M3b to form the dummy memory gate structure D2 in which the patterned lower memory gate insulating film 10, the charge storage layer EC, the upper memory gate insulating film 11, and the dummy memory gate electrode DMG are stacked in this order in the memory circuit region ER1. Simultaneously, the first insulating film 11a and the logic dummy electrode layer 37 remain intact in the peripheral circuit region ER3 using the resist M3b, and then the sidewall spacers 8a and 8b made of the sidewall insulating films 13a and 13b and the second insulating film 15 (the first select gate sidewall insulating film 16a and the second select gate sidewall insulating film 16b) are formed along the facing sidewalls of the dummy memory gate structure D2 in the memory circuit region ER1.

In the manufacturing method, the dummy logic gate structures DL1 and DL2, the dummy first select gate structure D3, and the dummy second select gate structure D4 can be formed all at once through the same manufacturing process by patterning, using the patterned resists M5a and M5b, the second insulating film 15 and the memory dummy electrode layer 38 formed in the memory circuit region ER1, and the logic dummy electrode layer 37 and the first insulating film 11a formed in the peripheral circuit region ER3, as illustrated in FIGS. 5A and 5B. In the dummy logic gate structures DL1 and DL2, the dummy logic gate electrodes DLG1 and DLG2 are stacked on the semiconductor substrate W through the logic gate insulating films 25a and 25b, respectively. The dummy first select gate structure D3 is composed of the dummy first select gate electrode DDG disposed along the sidewall spacer 8a of the dummy memory gate structure D2 and the first select gate insulating film 15a. The dummy second select gate structure D4 is composed of the dummy second select gate electrode DSG disposed along the sidewall spacer 8b of the dummy memory gate structure D2 and the second select gate insulating film 15b.

In addition, in the manufacturing method, the metal memory gate electrode MG, the metal first select gate electrode DG, the metal second select gate electrode SG, and the metal logic gate electrode LG1 can be formed all at once through the same manufacturing process by planarizing the interlayer insulating layer ILD formed in the memory circuit region ER1 and the peripheral circuit region ER3 through planarizing treatment, removing the dummy memory gate electrode DMG, the dummy first select gate electrode DDG, the dummy second select gate electrode DSG, and the dummy logic gate electrode DLG1 exposed from the interlayer insulating layer ILD, and forming a metal electrode layer in the electrode formation spaces in which the dummy memory gate electrode DMG, the dummy first select gate electrode DDG, the dummy second select gate electrode DSG, and the dummy logic gate electrode DLG1 have been formed.

In this manner, in the manufacturing method according to the present invention, the metal memory gate electrode MG, the metal first select gate electrode DG, and the metal second select gate electrode SG each made of a metallic material the same as that of the metal logic gate electrode LG1 can be formed simultaneously with, for example, the metal logic gate electrode LG1 made of an N-type MOS metallic material through a series of manufacturing processes of forming the metal logic gate electrode LG1 on the semiconductor substrate W.

Figure 7:
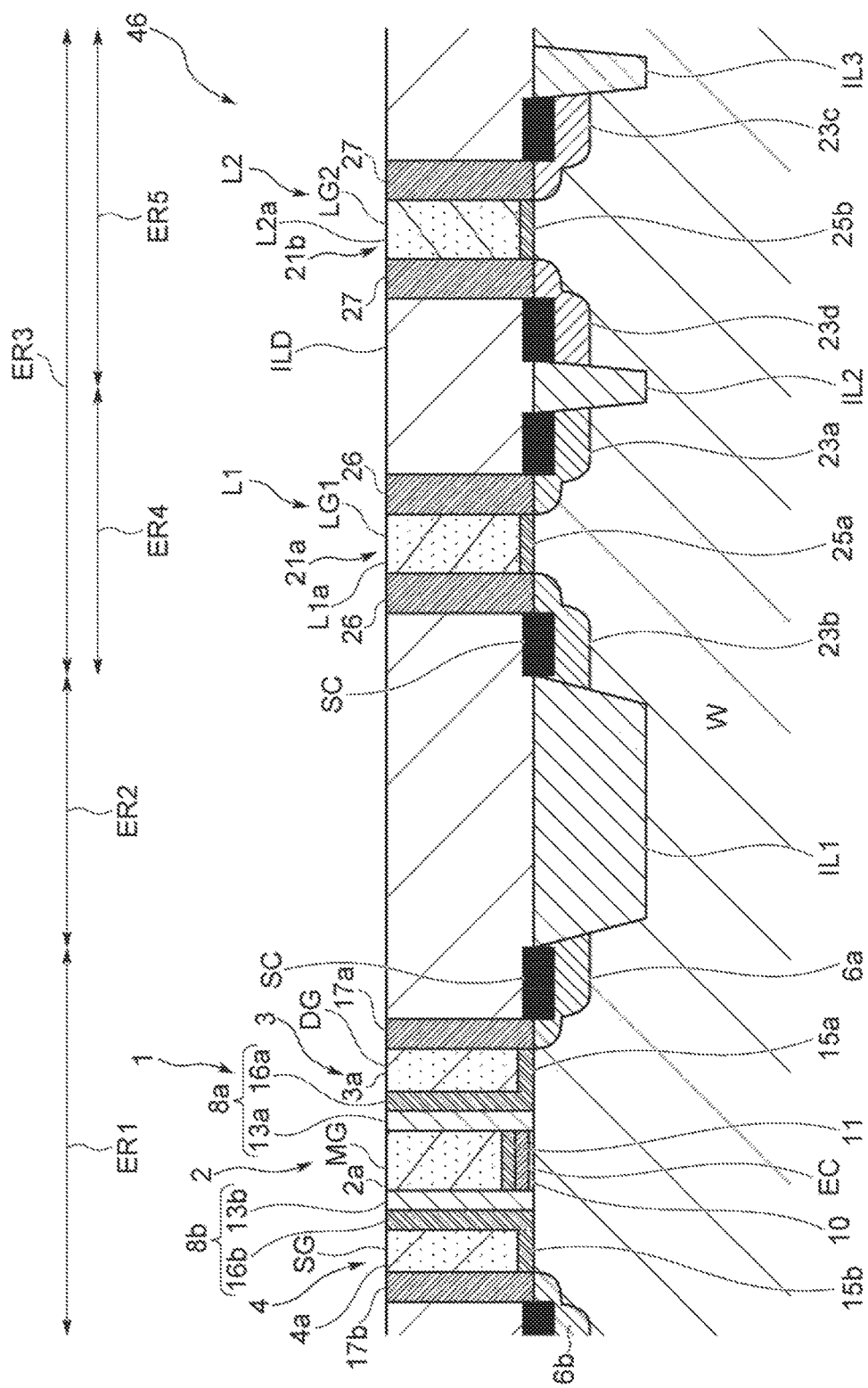
FIG. 7 is a schematic view illustrating a sectional configuration of a semiconductor integrated circuit device according to a second embodiment.

(2) Second Embodiment (2-1) Configuration of Semiconductor Integrated Circuit Device According to Second Embodiment In FIG. 7, in which any corresponding part to that in FIG. 2 is denoted by an identical reference sign, reference numeral 46 denotes a semiconductor integrated circuit device according to a second embodiment, which differs from the semiconductor integrated circuit device 20 according to the first embodiment described above only in the configuration of the barrier region ER2. The semiconductor integrated circuit device 46 does not include, in the barrier region ER2, the remaining part 29 (FIG. 2) included in the semiconductor integrated circuit device 20 according to the first embodiment described above. The semiconductor integrated circuit device 46 has a configuration in which the interlayer insulating layer ILD is disposed on the element separation layer IL1. The semiconductor integrated circuit device 46, which includes no remaining part 29 (FIG. 2) in the barrier region ER2, has a simplified entire configuration.

The semiconductor integrated circuit device 46 according to the second embodiment has, in the memory circuit region ER1 and in the peripheral circuit region ER3 other than the barrier region ER2, a configuration identical to that of the semiconductor integrated circuit device 20 according to the first embodiment described above, and thus description of the memory circuit region ER1 and the peripheral circuit region ER3 will be omitted in the following description. In addition, in the semiconductor integrated circuit device 46, the data programming operation and the data programming prevention operation on the memory cell 1 are the same as those described above in "(1-2) Data programming method", and the data reading operation and the data erasing operation on the memory cell 1 are the same as those described above in "(1-3) Other operations", and thus description thereof will be omitted in the following.

(2-2) Method for Manufacturing Semiconductor Integrated Circuit Device According to Second Embodiment The semiconductor integrated circuit device 46 having the above-described configuration is manufactured in accordance with a manufacturing process as described below. In the manufacturing process, simultaneously with the metal logic gate electrode LG1 made of, for example, an N-type MOS metallic material among the metal logic gate electrodes LG1 and LG2 each made of a metallic material, the metal memory gate electrode MG, the metal first select gate electrode DG, and the metal second select gate electrode SG are formed of a metallic material the same as that of the metal logic gate electrode LG1 without forming the remaining part 29 (FIG. 2) in the barrier region ER2 through a series of manufacturing processes of forming the metal logic gate electrode LG1 on the semiconductor substrate W.

First, as illustrated in FIG. 3A, a plurality of the element separation layers IL1, IL2, and IL3 each made of an insulating material such as $SiO_2$ are formed at predetermined positions with predetermined intervals therebetween on the surface of the semiconductor substrate W made of, for example, Si by, for example, the shallow trench isolation (STI) method. In adjustment of the threshold voltage of the semiconductor substrate W in the peripheral circuit region ER3, for example, the ion implantation method is employed to inject P-type impurities into the semiconductor substrate W in the NMOS peripheral circuit region ER4 between the element separation layers IL1 and IL2, and N-type impurities into the semiconductor substrate W in the PMOS peripheral circuit region ER5 between the element separation layers IL2 and IL3.

Figure 8A:
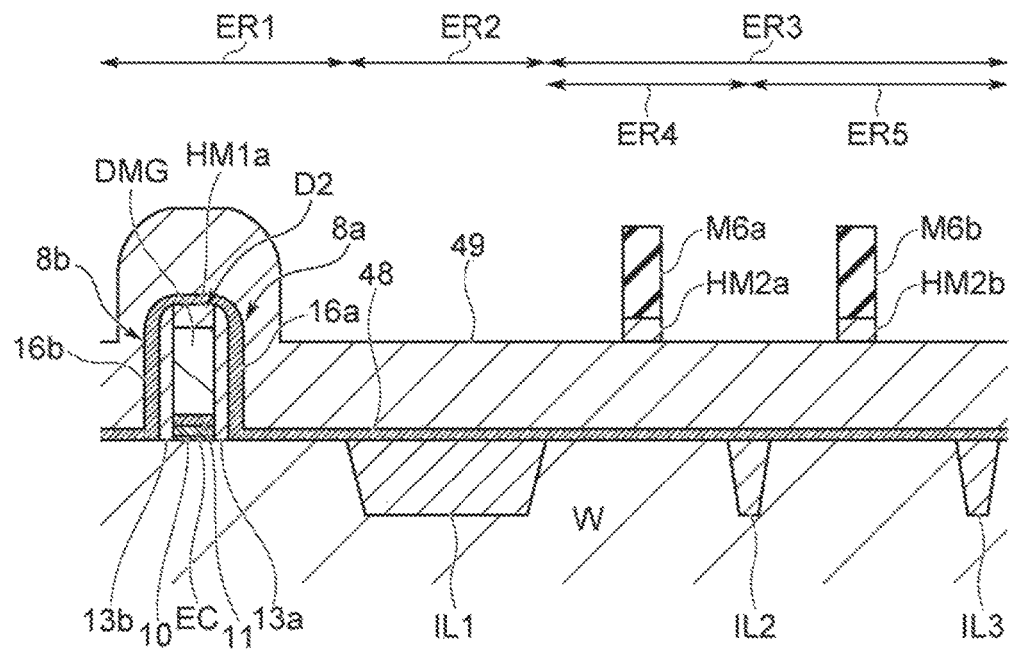
FIG. 8A is a schematic view illustrating process (1) of manufacturing the semiconductor integrated circuit device illustrated in FIG. 7.

Subsequently, the dummy memory gate structure D2 is formed in the memory gate electrode formation target region in the memory circuit region ER1. In the dummy memory gate structure D2, as illustrated in FIG. 8A, the lower memory gate insulating film 10, the charge storage layer EC, the upper memory gate insulating film 11, and the dummy memory gate electrode DMG which are patterned through the hard mask layer HM1a formed in the memory circuit region ER1 by using a patterned resist (not illustrated), are stacked in this order on the semiconductor substrate W. The dummy memory gate electrode DMG is formed as a layered memory dummy electrode layer remaining in the memory gate electrode formation target region through the hard mask layer HM1a.

Subsequently, a layered insulating film (not illustrated) made of, for example, SiO$_2$ is formed across the memory circuit region ER1, the barrier region ER2, and the peripheral circuit region ER3 and then etched back to form the sidewall insulating films 13a and 13b having sidewall shapes along the facing sidewalls of the dummy memory gate structure D2 in the memory circuit region ER1 (the sidewall insulating film forming process). Subsequently, the peripheral circuit region ER3 is covered by a patterned resist (not illustrated). In this state, impurities such as B (boron), P (phosphorus), and As (arsenic) are injected into the semiconductor substrate W in the memory circuit region ER1 by the ion implantation method or the like to adjust the threshold voltage of the semiconductor substrate W in the formation target regions (select gate electrode formation target regions) of the metal first select gate electrode DG and the metal second select gate electrode SG (FIG. 7) to be formed through a later manufacturing process.

Subsequently, the resist is removed, and a layered insulating film 48 made of an insulating material (for example, a high-k material) the same as that of the upper memory gate insulating film 11 is formed across the memory circuit region ER1, the barrier region ER2, and the peripheral circuit region ER3. Thereafter, a layered logic dummy electrode layer 49 made of, for example, polysilicon is formed on the insulating film 48 (a dummy electrode layer forming process). The insulating film 48 is provided in a wall shape along the sidewall insulating film 13a on the first sidewall of the dummy memory gate Structure D2 to form the first select gate sidewall insulating film 16a, and is also provided in a wall shape along the sidewall insulating film 13b on the second sidewall thereof to form the second select gate sidewall insulating film 16b. In this manner, the sidewall spacer 8a composed of the sidewall insulating film 13a and the first select gate sidewall insulating film 16a is formed on the first sidewall of the dummy memory gate structure D2, and the sidewall spacer 8b composed of the sidewall insulating film 13b and the second select gate sidewall insulating film 16b is formed on the second sidewall thereof.

Subsequently, resists M6a and M6b are formed in the peripheral circuit region ER3 to cover the formation target regions (logic gate electrode formation target regions) of the metal logic gate electrodes LG1 and LG2 (FIG. 7) to be formed through a later manufacturing process. A hard mask layer (not illustrated) made of, for example, SiO$_2$ is patterned by using the resists M6a and M6b to form, on the logic dummy electrode layer 49, hard mask layers HM2a and HM2b covering the logic gate electrode formation target region.

Figure 8B:
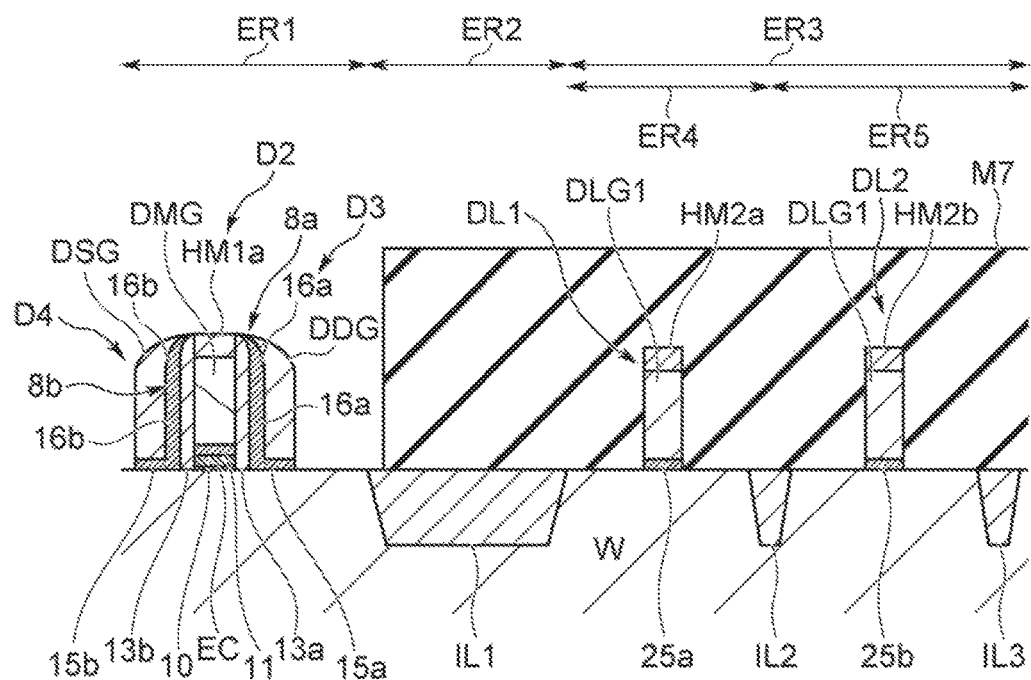
FIG. 8B is a schematic view illustrating process (2) of manufacturing the semiconductor integrated circuit device illustrated in FIG. 7.

Subsequently, after the resists M6a and M6b are removed, the remaining hard mask layers HM2a and HM2b are used as masks to etch back the logic dummy electrode layer 49 in the memory circuit region ER1, the barrier region ER2, and the peripheral circuit region ER3, and the insulating film 48 covered by the logic dummy electrode layer 49. Accordingly, as illustrated in FIG. 8B, in which any corresponding part to that in FIG. 8A is denoted by an identical reference sign, the logic dummy electrode layer 49 remains in the logic gate electrode formation target regions in the peripheral circuit region ER3 through the hard mask layers HM2a and HM2b, forming the dummy logic gate electrodes DLG1 and DLG2, and in addition, the insulating film 48 remains below the dummy logic gate electrodes DLG1 and DLG2, forming the logic gate insulating films 25a and 25b. In this manner, the dummy logic gate structures DL1 and DL2 in which the dummy logic gate electrodes DLG1 and DLG2 are slacked on the semiconductor substrate W through the logic gate insulating films 25a and 25b is formed in the peripheral circuit region ER3.

Simultaneously, in the memory circuit region ER1, the logic dummy electrode layer 49 remains in a sidewall shape along the sidewall spacer 8a on the first sidewall of the dummy memory gate structure D2, forming the dummy first select gate electrode DDG, and in addition, the insulating film 48 remains below the dummy first select gate electrode DDG, forming the first select gate insulating film 15a. In this manner, the dummy first select gate structure D3 including the sidewall-shaped dummy first select gate electrode DDG on the first select gate insulating film 15a is formed along the sidewall spacer 8a on the first sidewall of the dummy memory gate structure D2 in the memory circuit region ER1.

Simultaneously, in the memory circuit region ER1, the logic dummy electrode layer 49 remains in a sidewall shape along the sidewall spacer 8b on the second sidewall of the dummy memory gate structure D2, forming the dummy second select gate electrode DSG, and in addition, the insulating film 48 remains below the dummy second select gate electrode DSG, forming the second select gate insulating film 15b. In this manner, the dummy second select gate structure D4 including the sidewall-shaped dummy second select gate electrode DSG on the second select gate insulating film 15b is formed along the sidewall spacer 8b on the second sidewall of the dummy memory gate structure D2 in the memory circuit region ER1 (the dummy gate electrode forming process).

As described above, in the present embodiment, the logic dummy electrode layer 49 provided for forming the dummy logic gate electrodes DLG1 and DLG2 is used to form the dummy first select gate electrode DDG and the dummy second select gate electrode DSG in the memory circuit region ER1.

To reduce the widths of the dummy first select gate electrode DDG and the dummy second select gate electrode DSG formed in the memory circuit region ER1, as illustrated in FIG. 8B, the peripheral circuit region ER3 and a partial region of the barrier region ER2 are covered by a resist M7, and the dummy first select gate electrode DDG and the dummy second select gate electrode DSG exposed in the memory circuit region ER1 are removed by dry etching. In this manner, the dummy first select gate electrode DDG and the dummy second select gate electrode DSG having desired widths are formed. Accordingly, in the manufacturing method, the dummy first select gate electrode DDG and the dummy second select gate electrode DSG in the memory circuit region ER1 can be formed to have desired widths independently whereas the dummy logic gate electrodes DLG1 and DLG2 having desired widths are formed in the peripheral circuit region ER3. Thus, the dummy first select gate electrode DDG and the dummy second select gate electrode DSG having small widths can be formed by the manufacturing method.

In the method for manufacturing the semiconductor integrated circuit device 46 according to the second embodiment, when the dummy first select gate electrode DDG, the dummy second select gate electrode DSG, and the dummy logic gate electrode DLG1, DLG2 are formed, the sidewall insulating film 30, the first insulating film 11a, the second insulating film 15, the logic dummy electrode layer 49, and the memory dummy electrode layer do not remain in the barrier region ER2, and thus the entire surface of the element separation layer IL1 can be exposed.

Thereafter, low concentration of N-type impurities or P-type impurities are injected into the memory circuit region ER1 and the peripheral circuit region ER3 by the ion implantation method or the like using a resist (not illustrated) patterned for the N type or the P type. Accordingly, as illustrated in FIG. 7, the dram region 6a and the source region 6b are formed in the surface of the semiconductor substrate W in the memory circuit region ER1, and the impurity diffusion regions 23a, 23b, 23c, and 23d are formed in the surface of the semiconductor substrate W in the peripheral circuit region ER3. Subsequently, a layered insulating layer (not illustrated) made of, for example, SiN is formed across the memory circuit region ER1, the barrier region ER2, and the peripheral circuit region ER3 and then etched back. Accordingly, the insulating layer remains on the sidewalls of the dummy first select gate structure D3 and the dummy second select gate structure D4, forming the sidewall structures 17a and 17b, and the insulating layer also remains on the facing sidewalls of the dummy logic gate structures DL1 and DL2, forming the sidewall structures 26 and 27.

Thereafter, in addition, the following processes are sequentially performed: the process of forming high-concentration impurity regions on the drain region 6a and the source region 6b in the memory circuit region ER1 and the impurity diffusion regions 23a, 23b, 23c, and 23d in the peripheral circuit region ER3 by injecting high concentration of N-type impurities or P-type impurities into necessary places of the semiconductor substrate W by the ion implantation method or the like; the process of forming the silicide layer SC on the drain region 6a, the source region 6b, and the impurity diffusion regions 23a, 23b, 23c, and 23d; and the process of forming the interlayer insulating layer ILD to cover, for example, the dummy memory gate structure D2, the dummy first select gate structure D3, the dummy second select gate structure D4, the dummy logic gate structures DL1 and DL2, and the dummy remaining part D29.

Subsequently, the surface of the interlayer insulating layer ILD is planarized by polished through planarizing treatment such as CMP to expose, on the surface of the interlayer insulating layer ILD, the planarized top surfaces of the dummy memory gate electrode DMG, the dummy first select gate electrode DDG, the dummy second select gate electrode DSG, and the dummy logic gate electrodes DLG1 and DLG2 (an electrode exposing process). Subsequently, the PMOS peripheral circuit region ER5 is covered by a resist, whereas the memory circuit region ER1, the barrier region ER2, and the NMOS peripheral circuit region ER4 are exposed. In this state, dry etching using, for example, carbon tetrafluoride ($CF_4$) is performed to remove the dummy memory gate electrode DMG, the dummy first select gate electrode DDG, the dummy second select gate electrode DSG, and the dummy logic gate electrode DLG1 exposed on the surface of the interlayer insulating layer ILD. Thereafter, the resist on the PMOS peripheral circuit region ER5 is removed.

Subsequently, a metal electrode layer made of an N-type MOS metallic material such as aluminum (Al), titanium aluminide (TiAl), tantalum carbide (TaC), or tantalum silicon nitride (TaSiN) is formed on the surface of the interlayer insulating layer ILD and embedded in the electrode formation spaces from which the dummy memory gate electrode DMG, the dummy first select gate electrode DDG, the dummy second select gate electrode DSG, and the dummy logic gate electrode DLG1 have been removed. Thereafter, a surface of the metal electrode layer is polished through planarizing treatment such as CMP and planarized in accordance with the surface of the interlayer insulating layer ILD. In the PMOS peripheral circuit region ER5 of the peripheral circuit region ER3, since the dummy logic gate electrode DLG2 is not removed but remains intact in a state in which it is formed, the metal electrode layer on the dummy logic gate electrode DLG2 and the interlayer insulating layer ILD is removed through the planarizing treatment.

Accordingly, as illustrated in FIG. 7, in the memory circuit region ER1, the metal memory gate electrode MG is formed as the metal electrode layer embedded in the electrode formation space in which the dummy memory gate electrode DMG has been formed, the metal first select gate electrode DG is formed as the metal electrode layer embedded in the electrode formation space in which the dummy first select gate electrode DDG has been formed, and the metal second select gate electrode SG is formed as the metal electrode layer embedded in the electrode formation space in which the dummy second select gate electrode DSG has been formed. Simultaneously, in the NMOS peripheral circuit region ER4 of the peripheral circuit region ER3, the metal logic gate electrode LG1 made of an N-type MOS metallic material is formed as the metal electrode layer embedded in the electrode formation space in which the dummy logic gate electrode DLG1 has been formed (the metal gate electrode forming process). Accordingly, the metal memory gate electrode MG, the metal first select gate electrode DG, the metal second select gate electrode SG, and the metal logic gate electrode LG1 are formed of the same layer (metal electrode layer).

Thereafter, similarly to the first embodiment described above, as illustrated in FIG. 7, the metal logic gate electrode LG2 made of a P-type MOS metallic material is formed in the PMOS peripheral circuit region ER5 of the peripheral circuit region ER3. In addition, for example, the process of forming various contacts such as the first select gate contact, the second select gate contact, and the memory gate contact, which are not illustrated in FIG. 7, at predetermined places of the interlayer insulating layer ILD is performed to complete manufacturing of the semiconductor integrated circuit device 46.

(2-3) Operations and Effects

The memory cell 1 manufactured by the manufacturing method as described above and the semiconductor integrated circuit device 46 according to the second embodiment can achieve effects similarly 10 those of the first embodiment described above.

In the method for manufacturing the semiconductor integrated circuit device 46 according to the present invention, as illustrated in FIG. 8A, the dummy memory gate structure D2, in which the lower memory gate insulating film 10, the charge storage layer EC, the upper memory gate insulating film 11, and the dummy memory gate electrode DMG provided by patterning are stacked in this order on the semiconductor substrate W, is provided in the memory circuit region ER1. Thereafter, the sidewall spacers 8a and 8b composed of the sidewall insulating films 13a and 13b and the insulating film 48 are formed along the facing sidewalls of the dummy memory gate structure D2.

In the manufacturing method, as illustrated in FIG. 8B, the dummy logic gate structures DL1 and DL2, the dummy first select gate structure D3, and the dummy second select gate structure D4 can be formed all at once through the same manufacturing process by patterning, using the patterned resists M6a and M6b, the insulating film 48 and the logic dummy electrode layer 49 formed across the memory circuit region ER1 and the peripheral circuit region ER3. In the dummy logic gate structures DL1 and DL2, the dummy logic gate electrodes DLG1 and DLG2 are stacked on the semiconductor substrate W through the logic gate insulating films 25a and 25b. The dummy first select gate structure D3 is composed of the dummy first select gate electrode DDG disposed along the sidewall spacer 8a of the dummy memory gate structure D2 and the first select gate insulating film 15a. The dummy second select gate structure D4 is composed of the dummy second select gate electrode DSG disposed along the sidewall spacer 8b of the dummy memory gate structure D2 and the second select gate insulating film 15b.

In the method for manufacturing, too, the metal memory gate electrode MG, the metal first select gate electrode DG, the metal second select gate electrode SG, and the metal logic gate electrode LG1 can be formed all at once through the same manufacturing process by planarizing the interlayer insulating layer ILD formed in the memory circuit region ER1 and the peripheral circuit region ER3 through planarizing treatment, removing the dummy memory gate electrode DMG, the dummy first select gate electrode DDG, the dummy second select gate electrode DSG, and the dummy logic gate electrode DLG1 exposed from the interlayer insulating layer ILD, and forming a metal electrode layer in the electrode formation spaces in which the dummy memory gate electrode DMG, the dummy first select gate electrode DDG, the dummy second select gate electrode DSG, and the dummy logic gate electrode DLG1 have been formed.

As described above, in the manufacturing method according to the second embodiment of the present invention, too, the metal memory gate electrode MG, the metal first select gate electrode DG, and the metal second select gate electrode SG each made of a metallic material the same as that of the metal logic gate electrode LG1 can be formed simultaneously with the metal logic gate electrode LG1 through a series of manufacturing processes of forming, for example, the metal logic gate electrode LG1 made of an N-type MOS metallic material on the semiconductor substrate W.

Figure 9:
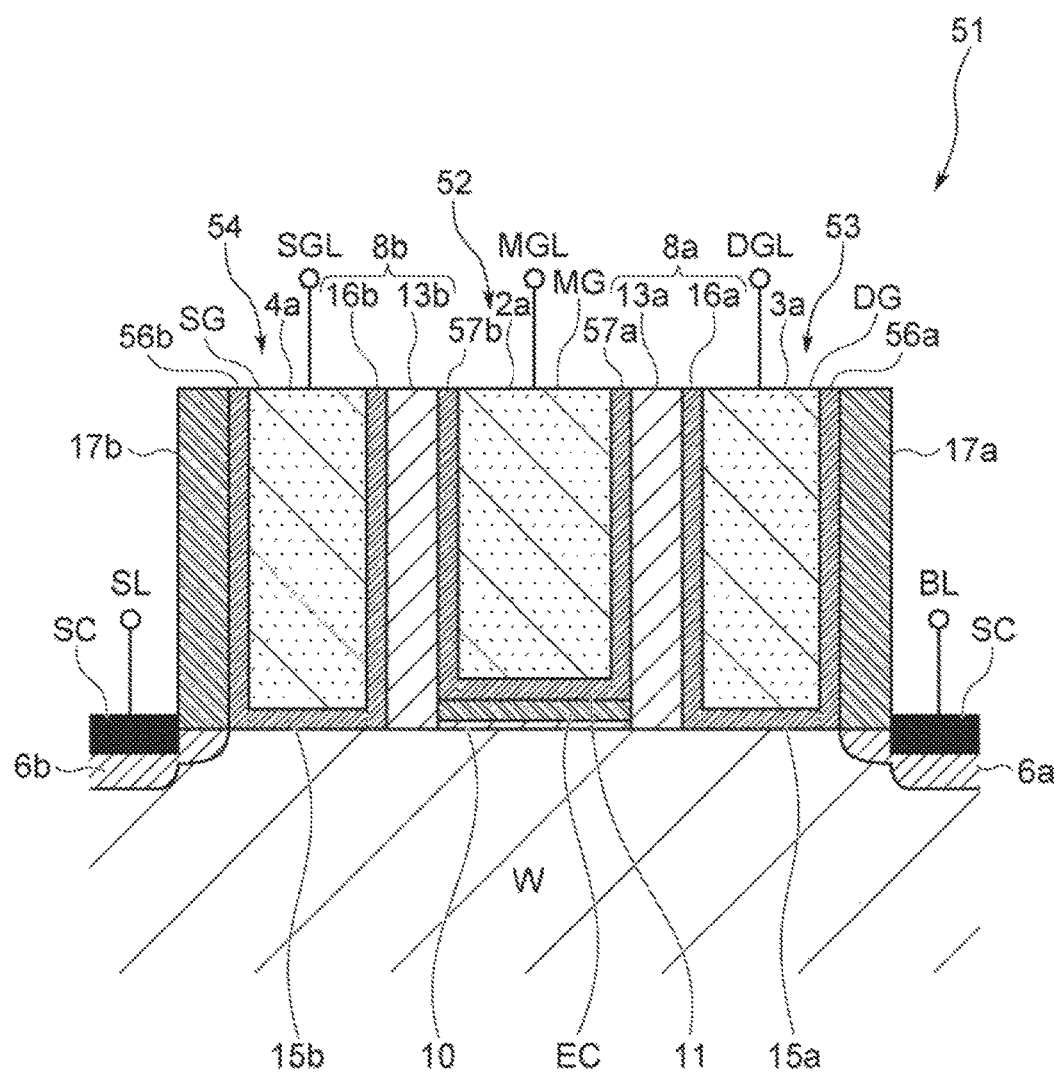
FIG. 9 is a schematic view illustrating a sectional configuration of a memory cell according to a third embodiment.

(3) Third Embodiment (3-1) Configuration of Memory Cell According to Third Embodiment In FIG. 9, in which any corresponding part to that in FIG. 1 is denoted by an identical reference sign, reference numeral 51 denotes a memory cell according to a third embodiment. The memory cell 51 differs from the memory cell 1 according to the first embodiment described above in that memory gate sidewall insulating films 57a and 57b are provided in the metal memory gate electrode MG of a memory gate structure 52, a facing sidewall insulating film 56a is disposed in the metal first select gate electrode DG of a first select gate structure 53, and a facing sidewall insulating film 56b is disposed in the metal second select gate electrode SG of a second select gate structure 54. The following description omits any description that would duplicate the description of the memory cell 1 according to the first embodiment described above, but will be made mainly on the configurations of the memory gate sidewall insulating films 57a and 57b and the facing sidewall insulating films 56a and 56b.

In this case, in the metal memory gate electrode MG of the memory gate structure 2, the wall-shaped memory gate sidewall insulating film 57a is disposed along the first sidewall insulating film 13a, and the wall-shaped memory gate sidewall insulating film 57b is disposed along the second sidewall insulating film 13b. The memory gate sidewall insulating films 57a and 57b are made of an insulating material (for example, a high-k material) the same as that of the upper memory gate insulating film 11. The memory gate sidewall insulating films 57a and 57b are integrated with ends of the upper memory gate insulating film 11 and erected on the charge storage layer EC. With this configuration, the metal memory gate electrode MG of the memory gate structure 52 is disposed in a recessed region enclosed by the memory gate sidewall insulating films 57a and 57b and the upper memory gate insulating film 11.

In the metal first select gate electrode DG of the first select gate structure 53, the facing sidewall insulating film 56a having a wall shape along the sidewall structure 17a is provided facing to the first select gate sidewall insulating film 16a. The facing sidewall insulating film 56a is made of an insulating material (for example, a high-k material) the same as that of the first select gate insulating film 15a, integrated with the end of the first select gate insulating film 15a, and erected on the semiconductor substrate W. With this configuration, the metal first select gate electrode DG of the first select gate structure 53 is disposed in a recessed region enclosed by the first select gate sidewall insulating film 16a, the first select gate insulating film 15a, and the facing sidewall insulating film 56a.

In the metal second select gate electrode SG of the second select gate structure 54, the facing sidewall insulating film 56b having a wall shape along the sidewall structure 17b is provided facing to the second select gate sidewall insulating film 16b. The facing sidewall insulating film 56b is made of an insulating material (for example, a high-k material) the same as that of the second select gate insulating film 15b, integrated with the end of the second select gate insulating film 15b, and erected on the semiconductor substrate W. With this configuration, the metal second select gate electrode SG of the second select gate structure 54 is disposed in a recessed region enclosed by the second select gate sidewall insulating film 16b, the second select gate insulating film 15b and the facing sidewall insulating film 56b.

In the memory cell 51 thus configured, too, the metal memory gate electrode MG, the metal first select gate electrode DG, and the metal second select gate electrode SG are made of a metallic material the same as that of a metal logic gate electrode (not illustrated) of a peripheral circuit disposed on the same semiconductor substrate W. Thus, the metal memory gate electrode MG, the metal first select gate electrode DG, and the metal second select gate electrode SG can be formed on the semiconductor substrate W when the metal logic gate electrode of the peripheral circuit is formed on the semiconductor substrate W. In addition, since the metal memory gate electrode MG, the metal first select gate electrode DG, and the metal second select gate electrode SG of the memory cell 51 are each made of a predetermined metallic material, no depletion layer is formed in the metal memory gate electrode MG, the metal first select gate electrode DG, and the metal second select gate electrode SG.

In addition, in the memory cell 51, too, the planarized top surface 3a of the metal first select gate electrode DG, the planarized top surface 4a of the metal second select gate electrode SG, and the planarized top surface 2a of the metal memory gate electrode MG are planarized through the same planarizing treatment in a manufacturing process. Accordingly, the memory gate structure 52, the first select gate structure 53, and the second select gate structure 54 have the same height, and the metal memory gate electrode MG does not protrude relative to the metal first select gate electrode DG and the metal second select gate electrode SG, thereby achieving reduction of the entire size.

The data programming operation and the data programming prevention operation on the memory cell 51 according to the third embodiment are the same as those described above in "(1-2) Data programming method", and the data reading operation and the data erasing operation on the memory cell 51 are the same as those described above in "(1-3) Other operations", and thus description thereof will be omitted in the following.

Figure 10:
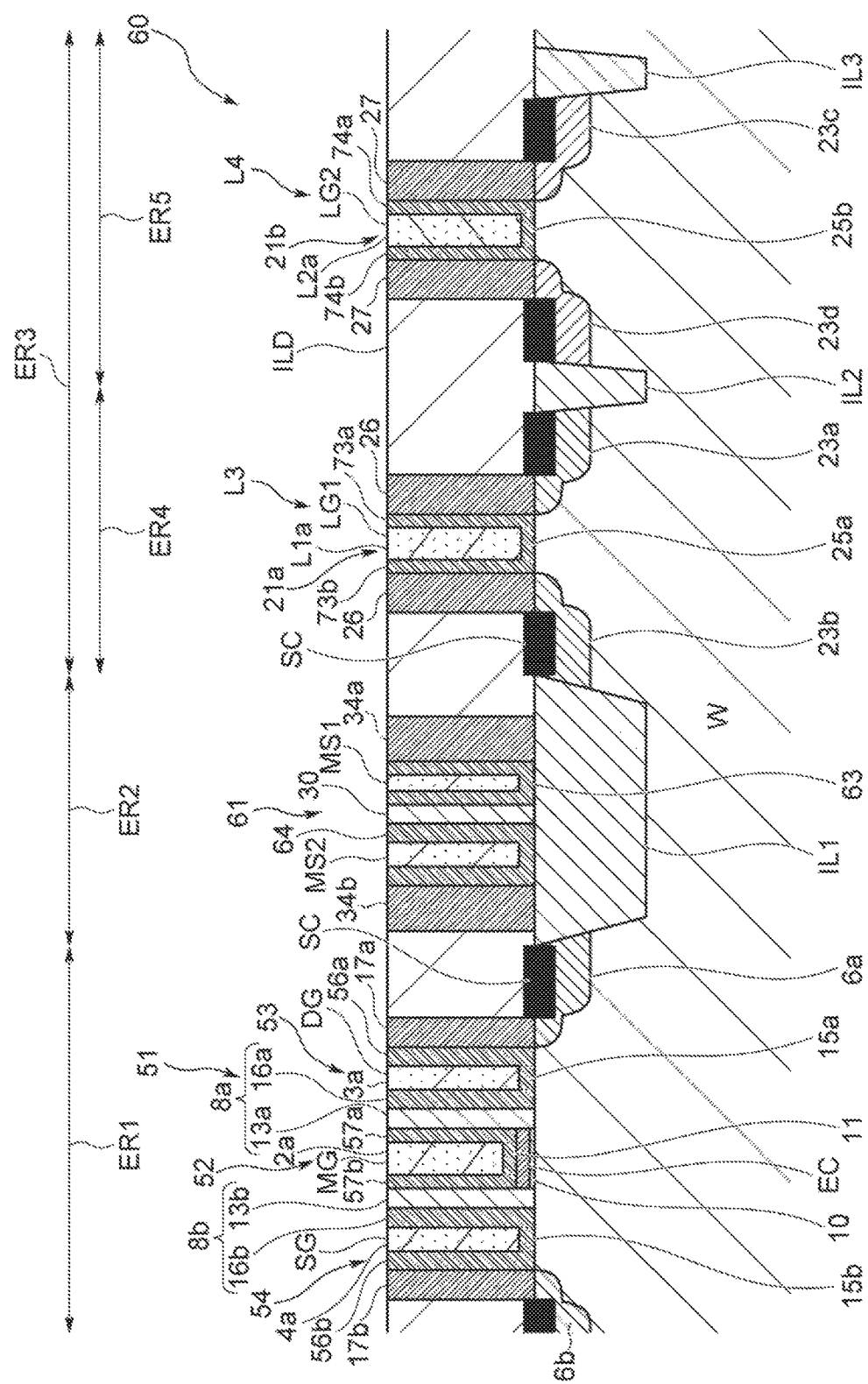
FIG. 10 is a schematic view illustrating a sectional configuration of a semiconductor integrated circuit device according to the third embodiment.

(3-2) Configuration of Semiconductor Integrated Circuit Device According to the Third Embodiment The following describes the configuration of a semiconductor integrated circuit device including the memory cell 51 described above. In FIG. 10, in which any corresponding part to that in FIG. 2 is denoted by an identical reference sign, reference numeral 60 denotes the semiconductor integrated circuit device according to the third embodiment. This semiconductor integrated circuit device differs from the semiconductor integrated circuit device 20 according to the first embodiment described above in that the memory gate sidewall insulating films 57a and 57b and the facing sidewall insulating films 56a and 56b are disposed in the memory circuit region ER1, insulating films 63 and 64 having recessed sections are disposed in the barrier region ER2, and sidewall insulating films 73a, 73b, 74a, and 74b are disposed in the peripheral circuit region ER3. Since the memory cell 51 disposed in the memory circuit region ER1 is described above with reference to FIG. 9, the following description omits description of the memory circuit region ER1, but will be made on the barrier region ER2 and the peripheral circuit region ER3.

In this case, in the peripheral circuit region ER3, a peripheral circuit L3 having an N-type MOS transistor structure is provided in the NMOS peripheral circuit region ER4, and a peripheral circuit L4 having a P-type MOS transistor structure is provided in the PMOS peripheral circuit region ER5. In the NMOS peripheral circuit region ER4, the logic gate structure 21a including the metal logic gate electrode LG1 on the logic gate insulating film 25a is disposed on the surface of the semiconductor substrate W between the impurity diffusion regions 23a and 23b. A wall-shaped sidewall insulating film 73a made of an insulating material (for example, a high-k material) the same as that of the logic gate insulating film 25a and erected on the semiconductor substrate W at one end of the logic gate insulating film 25a is disposed between the sidewall structure 26 disposed on the impurity diffusion region 23a and the logic gate structure 21a. In addition, a wall-shaped sidewall insulating film 73b made of an insulating material the same as that of the logic gate insulating film 25a and erected on the semiconductor substrate W at the other end of the logic gate insulating film 25a is disposed between the sidewall structure 26 disposed on the impurity diffusion region 23a and the logic gate structure 21a. In the peripheral circuit 13, the metal logic gate electrode LG1 made of an N-type MOS metallic material is disposed in an electrode formation space having a recessed section enclosed by the sidewall insulating films 73a and 73b and the logic gate insulating film 25a.

In the PMOS peripheral circuit region ER5, the logic gate structure 21b including the metal logic gate electrode LG2 on the logic gate insulating film 25b is disposed on the surface of the semiconductor substrate W between the impurity diffusion regions 23c and 23d. A wall-shaped sidewall insulating film 74a made of an insulating material (for example, a high-k material) the same as that of the logic gate insulating film 25b and erected on the semiconductor substrate W at one end of the logic gate insulating film 25b is disposed between the sidewall structure 27 disposed on the impurity diffusion region 23c and the logic gate structure 21b. In addition, a wall-shaped sidewall insulating film 74b made of an insulating material the same as that of the logic gate insulating film 25b and erected on the semiconductor substrate W at the other end of the logic gate insulating film 25b is disposed between the sidewall structure 27 disposed on the impurity diffusion region 23d and the logic gate structure 21b. In the peripheral circuit L4, the metal logic gate electrode LG2 made of a P-type MOS metallic material is disposed in an electrode formation space having a recessed section enclosed by the sidewall insulating films 74a and 74b and the logic gate insulating film 25b.

In a remaining part 61 disposed in the barrier region ER2, the insulating film 63 having a recessed section is disposed on the element separation layer IL1 between a remaining insulating film 30 and the sidewall structure 34a, and the remaining metal layer MS1 made of an N-type MOS metallic material the same as, for example, that of the metal gate memory electrode MG is disposed in an electrode formation space enclosed by the insulating film 63. In addition, m the remaining part 61, the insulating film 64 having a recessed section is disposed on the element separation layer IL1 between the remaining insulating film 30 and the sidewall structure 34b, and the remaining metal layer MS2 made of an N-type MOS metallic material the same as, for example, that of the metal gate memory electrode MG is disposed in an electrode formation space enclosed by the insulating film 64.

(3-3) Method for Manufacturing Semiconductor Integrated Circuit Device According to Third Embodiment A semiconductor integrated circuit device 60 having the above-described configuration is manufactured in accordance with a manufacturing process as described below. In the manufacturing process, simultaneously with the metal logic gate electrode LG1 made of, for example, an N-type MOS metallic material among the metal logic gate electrodes LG1 and LG2 each made of a metallic material, the metal memory gate electrode MG, the metal first select gate electrode DG, and the metal second select gate electrode SG are formed of a metallic material the same as that of the metal logic gate electrode LG1 through a series of manufacturing processes of forming the metal logic gate electrode LG1 on the semiconductor substrate W.

First, as illustrated in FIG. 3A, a plurality of the element separation layers IL1, IL2, and IL3 each made of an insulating material such as $SiO_2$ are formed at predetermined positions with predetermined intervals therebetween on the surface of the semiconductor substrate W made of, for example, Si by, for example, the STI method. In adjustment of the threshold voltage of the semiconductor substrate W in the peripheral circuit region ER3, for example, the ion implantation method is employed to inject P-type impurities into the semiconductor substrate W in the NMOS peripheral circuit region ER4 between the element separation layers IL1 and IL2, and N-type impurities into the semiconductor substrate W in the PMOS peripheral circuit region ER5 between the element separation layers IL2 and IL3.

Subsequently, resist patterning is performed by the photolithography technique to cover, with the resist M1, the partial region of the element separation layer IL1 formed in the barrier region ER2 between the memory circuit region ER1 and the peripheral circuit region ER3, and the semiconductor substrate W in the peripheral circuit region ER3. In this state, impurities such as B (boron), P (phosphorus), and As (arsenic) are injected into the semiconductor substrate W in the memory circuit region ER1 by the ion implantation method or the like to adjust the threshold voltage of the semiconductor substrate W in the formation target region (memory gate electrode formation target region) in which the metal memory gate electrode MG (FIG. 10) is to be formed.

Subsequently, after the resist M1 is removed, a layered lower memory gate insulating film made of, for example, $SiO_2$ and a charge storage layer made of, for example, SiN are stacked in this order across the memory circuit region ER1, the barrier region ER2, and the peripheral circuit region ER3. Thereafter, resist patterning is performed by the photolithography technique to cover, with the resist M2, the memory circuit region ER1 and the partial region of the barrier region ER2 as illustrated in FIG. 3B, in which any corresponding part to that in FIG. 3A is denoted by an identical reference sign. Then, the lower memory gate insulating film and the charge storage layer exposed through the resist M2 in the barrier region ER2 and the peripheral circuit region ER3 are removed. In this manner the layered lower memory gate insulating film 10a and the layered charge storage layer ECa are formed only in the memory circuit region ER1 and the partial region of the barrier region ER2.

Figure 11A:
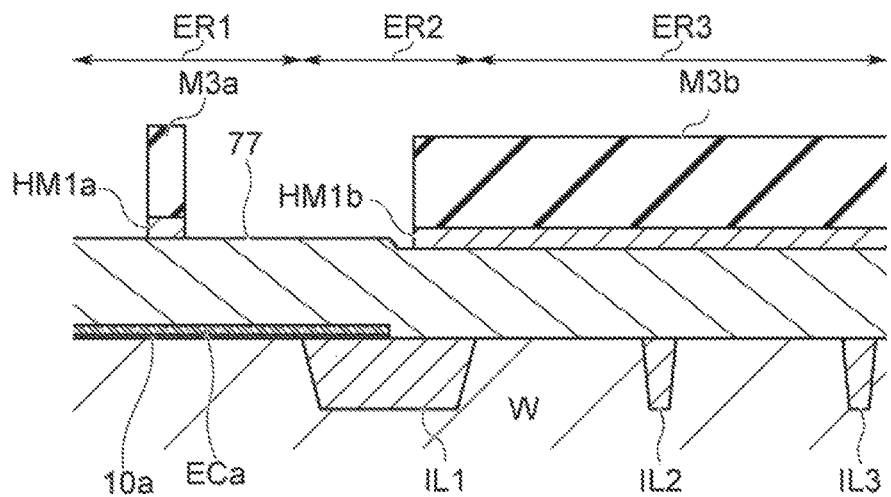
FIG. 11A is a schematic view illustrating process (1) of manufacturing the semiconductor integrated circuit device illustrated in FIG. 10.

Subsequently, after the resist M2 is removed, as illustrated in FIG. 11A, in which any corresponding part to that in FIG. 3B is denoted by an identical reference sign, a layered logic dummy electrode layer 77 made of, for example, polysilicon is formed across the charge storage layer ECa in the memory circuit region ER1, the element separation layer IL1 in the barrier region ER2, and the semiconductor substrate W in the peripheral circuit region ER3 (the first dummy electrode layer forming process). Subsequently, a layered hard mask layer is formed on the logic dummy electrode layer 77 and then patterned by using the resists M3a and M3b patterned by the photolithography technique. In this case, the resist M3a is formed in the memory gate electrode formation target region in the memory circuit region ER1, and the resist M3b is formed to cover the entire surface of the peripheral circuit region ER3. Then, the hard mask layer exposed through the resists M3a and M3b is removed so that the hard mask layer HM1a remains in the memory gate electrode formation target region in the memory circuit region ER1 and the hard mask layer HM1b remains in the entire surface of the peripheral circuit region ER3.

Figure 11B:
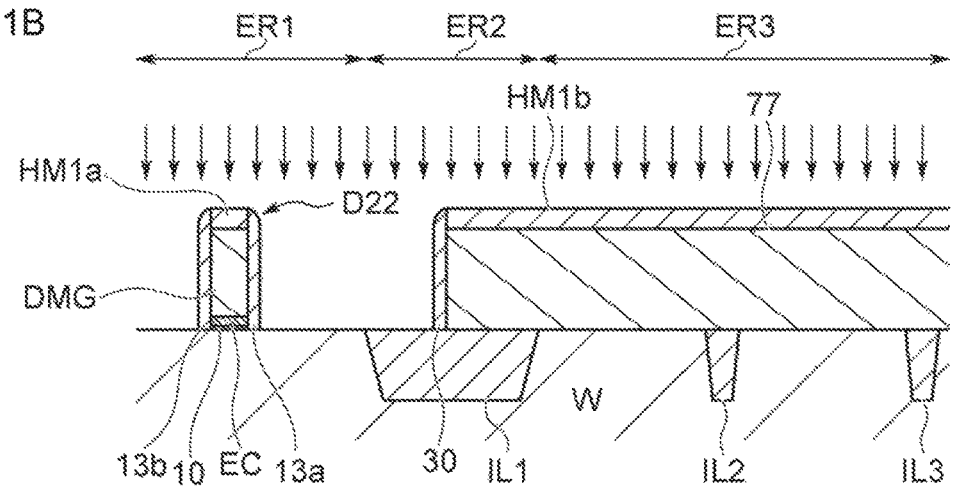
FIG. 11B is a schematic view illustrating process (2) of manufacturing the semiconductor integrated circuit device illustrated in FIG. 10.

Subsequently, after the resists M3a and M3b are removed, the logic dummy electrode layer 77, the charge storage layer ECa, and the lower memory gate insulating film 10a in the memory circuit region ER1 and the barrier region ER2 are removed in this order by using the hard mask layers HM1a and HM1b as masks. As a result, as illustrated in FIG. 11B, in which any corresponding part to that in FIG. 11A is denoted by an identical reference sign, a dummy memory gate structure D22 in which the lower memory gate insulating film 10, the charge storage layer EC, and the dummy memory gate electrode DMG are stacked in this order is formed in the memory gate electrode formation target region in the memory circuit region ER1. Simultaneously, the logic dummy electrode layer 77 remains intact through the hard mask layer HM1b in the peripheral circuit region ER3 (the dummy memory gate structure forming process). In this manner, in the present embodiment, the logic dummy electrode layer 77, which is provided for forming the dummy logic gate electrodes DLG1 and DLG2 (FIG. 12C) to be described later in a later manufacturing process, is used to form the dummy memory gate electrode DMG in the memory circuit region ER1.

Subsequently, a layered insulating film (not illustrated) made of, for example, $SiO_2$ is formed across the memory circuit region ER1, the barrier region ER2, and the peripheral circuit region ER3 and then etched back to form the sidewall insulating films 13a and 13b having sidewall shapes along facing side-walls of the dummy memory gate structure D22 in the memory circuit region ER1 (the sidewall insulating film forming process). Simultaneously, the insulating film also remains on sidewalls of the logic dummy electrode layer 77 disposed in the barrier region ER2, forming the sidewall-shaped remaining sidewall insulating film 30.

Subsequently, impurities such as B (boron), P (phosphorus), and As (arsenic) are injected into the semiconductor substrate W in the memory circuit region ER1 not coveted by the hard mask layers HM1a and HM1b and the sidewall insulating dims 13a, 13b, and 30 by the ion implantation method or the like to adjust the threshold voltage of the semiconductor substrate W in the formation target regions (select gate electrode formation target region) of the metal first select gate electrode DG and the metal second select gate electrode SG (FIG. 10) to be formed through a later manufacturing process.

Figure 11C:
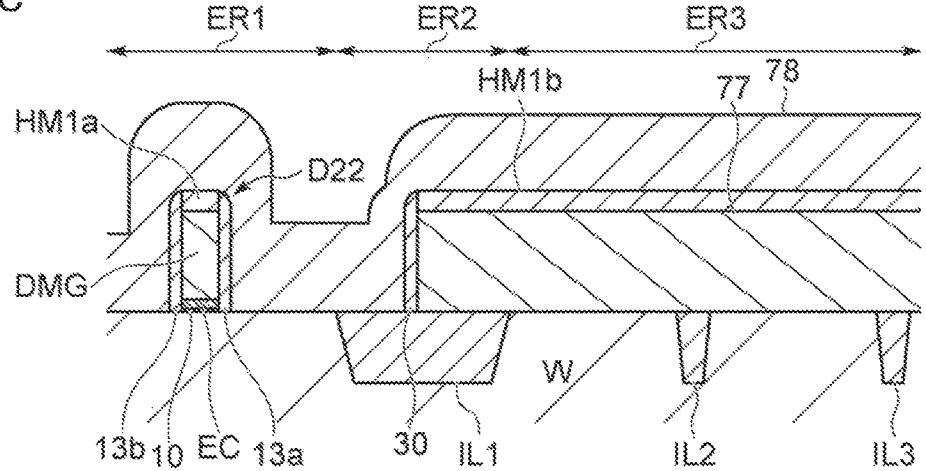
FIG. 11C is a schematic view illustrating process (3) of manufacturing the semiconductor integrated circuit device illustrated in FIG. 10.
Figure 12A:
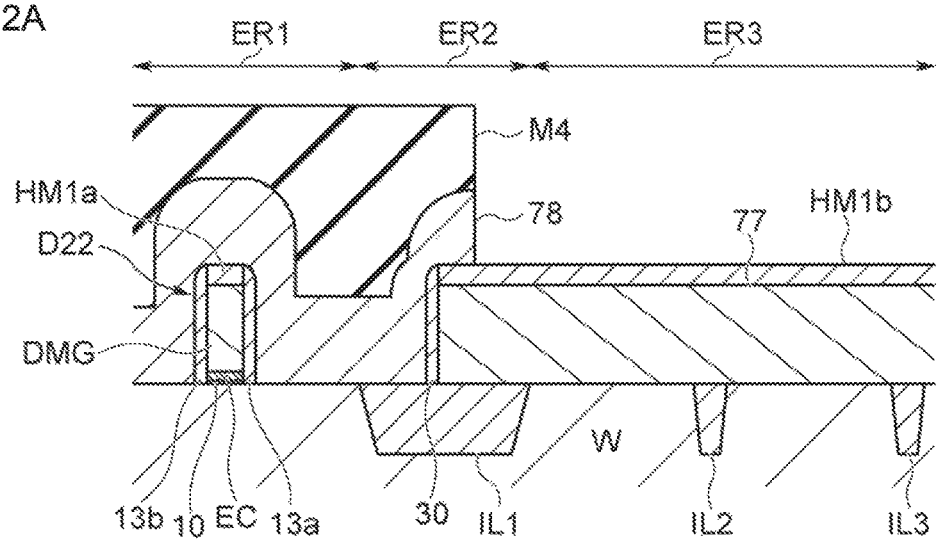
FIG. 12A is a schematic view illustrating process (4) of manufacturing the semiconductor integrated circuit device illustrated in FIG. 10.

Subsequently, as illustrated in FIG. 11C, in which any corresponding part to that in FIG. 11B is denoted by an identical reference sign, a layered memory dummy electrode layer 78 made of, for example, polysilicon is formed across the memory circuit region ER1, the barrier region ER2, and the peripheral circuit region ER3. Subsequently, as illustrated in FIG. 12A, in which any corresponding part to that in FIG. 11C is denoted by an identical reference sign, the memory circuit region ER1 and a partial region of the barrier region ER2 are covered by the resist M4 patterned by the photolithography technique. In this state, the memory dummy electrode layer 78 formed in the peripheral circuit region ER3 and the other region of the barrier region ER2 which are not covered by the resist M4 is removed. Accordingly, the layered memory dummy electrode layer 78 remains across the memory circuit region ER1 and the partial region of the barrier region ER2 covered by the resist M4 (the second dummy electrode layer forming process).

Figure 12B:
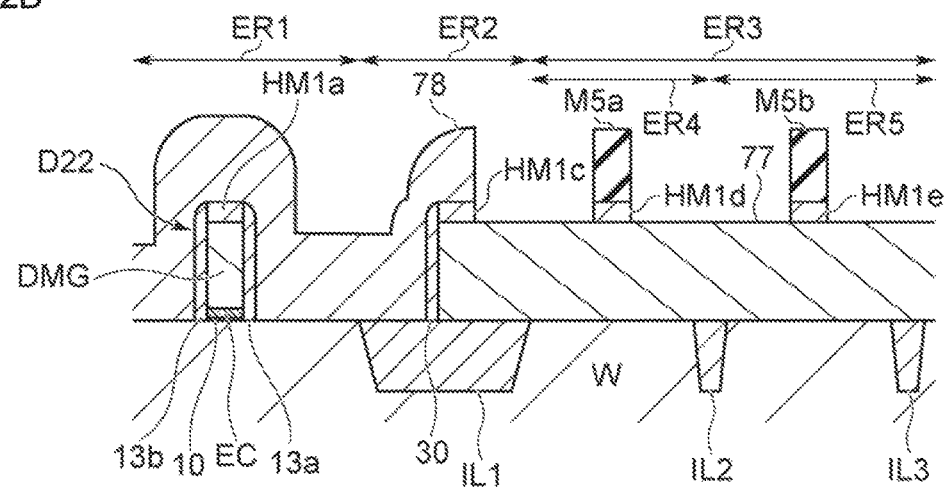
FIG. 12B is a schematic view illustrating process (5) of manufacturing the semiconductor integrated circuit device illustrated in FIG. 10.

Subsequently, after the resist M4 is removed, a new layered resist is formed across the memory circuit region ER1, the barrier region ER2, and the peripheral circuit region ER3. Subsequently, as illustrated in FIG. 12B, in which any corresponding part to that in FIG. 12A is denoted by an identical reference sign, resist patterning is performed by the photolithography technique to form the resists M5a and M5b covering the formation target regions (logic gate electrode formation target region) of the metal logic gate electrodes LG1 and LG2 (FIG. 10) to be formed through a later manufacturing process in the peripheral circuit region ER3. Then, the hard mask layer HM1b (FIG. 12A) in the peripheral circuit region ER3 and the barrier region ER2 is patterned by using the resists M5a and M5b to form the hard mask layers HM1d and HM1e covering the logic gate electrode formation target region.

Figure 12C:
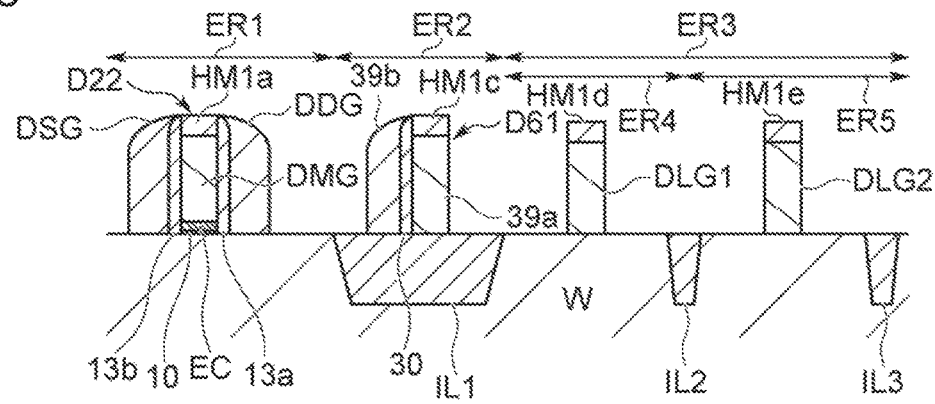
FIG. 12C is a schematic view illustrating process (6) of manufacturing the semiconductor integrated circuit device illustrated in FIG. 10.

Subsequently, after the resists M5a and M5b are removed, the remaining hard mask layers HM1d and HM1e are used as masks to etch back the memory dummy electrode layer 78 in the memory circuit region ER1 and the barrier region ER2 and the logic dummy electrode layer 77 in the barrier region ER2 and the peripheral circuit region ER3. Accordingly, as illustrated in FIG. 12C, in which any corresponding part to that in FIG. 12B is denoted by an identical reference sign, in the memory circuit region ER1, the memory dummy electrode layer 78 remains in a sidewall shape along the sidewall spacer 8a on a first sidewall of the dummy memory gate structure D22, forming the dummy first select gate electrode DDG on the semiconductor substrate W, and the memory dummy electrode layer 78 remains in a sidewall shape along the sidewall spacer 8b on a second sidewall of the dummy memory gate structure D22, forming the dummy second select gate electrode DSG on the semiconductor substrate W. Additionally, simultaneously, in the peripheral circuit region ER3, the logic dummy electrode layer 77 remains in the logic gate electrode formation target region through the hard mask layers HM1d and HM1e, forming the dummy logic gate electrodes DGL1 and DGL2 (the dummy gate electrode forming process).

The dummy first select gate electrode DDG and the dummy second select gate electrode DSG formed through the dummy gate electrode forming process can be formed to have a desired width by adjusting the thickness of the memory dummy electrode layer 78 formed through the second dummy electrode layer forming process described above.

When the hard mask layers HM1d and HM1e are formed in the barrier region ER2, the hard mask layer HM1c remains in a region covered by the memory dummy electrode layer 78 (FIG. 12B). In the barrier region ER2, in addition to the hard mask layer HM1c, the logic dummy electrode layer 77 and the memory dummy electrode layer 78 remain around the remaining sidewall insulating film 30, forming a dummy remaining part D61. In the barrier region ER2, the memory dummy electrode layer 78 remains in a sidewall shape along one surface of the wall-shaped remaining sidewall insulating film 30 and the element separation layer IL1, forming the memory dummy electrode remaining part 39b. In addition, in the barrier region ER2, the logic dummy electrode layer 77 remains in a region disposed adjacent to the other surface of the remaining sidewall insulating film 30 and covered by the hard mask layer HM1c, forming the logic dummy electrode remaining part 39a on the element separation layer IL1.

Figure 13A:
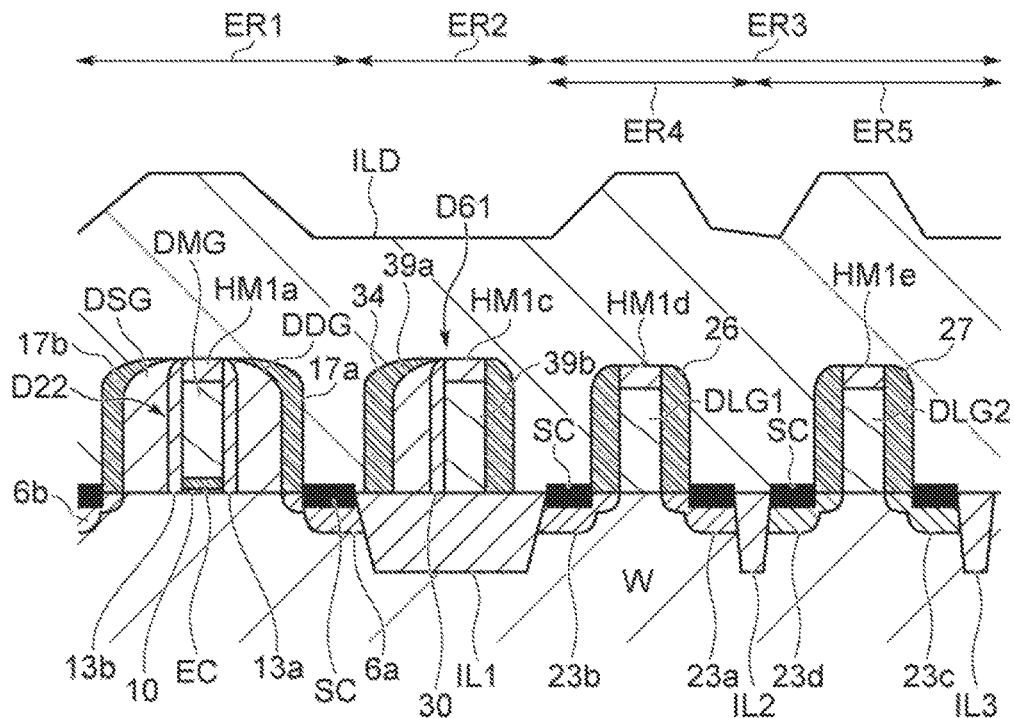
FIG. 13A is a schematic view illustrating process (7) of manufacturing the semiconductor integrated circuit device illustrated in FIG. 10.

Subsequently, as illustrated in FIG. 13A, in which any corresponding part to that in FIG. 12C is denoted by an identical reference sign, low concentration of N-type impurities or P-type impurities are injected into the memory circuit region ER1 and the peripheral circuit region ER3 by the ion implantation method or the like using a resist (not illustrated) patterned for the N type or the P type. Accordingly, the drain region 6a and the source region 6b are formed in the surface of the semiconductor substrate W in the memory circuit region ER1, and the impurity diffusion regions 23a, 23b, 23c, and 23d are formed in the surface of the semiconductor substrate W in the peripheral circuit region ER3. Subsequently, a layered insulating layer (not illustrated) made of, for example, SiN is formed across the memory circuit region ER1, the barrier region ER2, and the peripheral circuit region ER3 and then etched back. Accordingly, the insulating layer remains on sidewalls of the dummy first select gate electrode DDG and the dummy second select gate electrode DSG, forming the sidewall structures 17a and 17b, and the insulating layer also remains on facing sidewalls of the dummy logic gate electrodes DLG1 and DLG2, forming the sidewall structures 26 and 27. Additionally, the insulating layer also remains around the logic dummy electrode remaining part 39a and the memory dummy electrode remaining part 39b in the dummy remaining part D61 in the barrier region ER2, forming a sidewall structure 34.

Thereafter, in addition to the above-described process, the following processes are sequentially performed: the process of forming high-concentration impurity regions in the drain region 6a and the source region 6b in the memory circuit region ER1 and the impurity diffusion regions 23a, 23b, 23c, and 23d in the peripheral circuit region ER3 by injecting high concentration of N-type impurities or P-type impurities into necessary places of the semiconductor substrate W by the ion implantation method or the like; the process of forming the silicide layer SC on the drain region 6a, the source region 6b, and the impurity diffusion regions 23a, 23b, 23c, and 23d; and the process of forming the interlayer insulating layer ILD to cover, for example, the dummy memory gate structure D22, the dummy first select gate electrode DDG, the dummy second select gate electrode DSG, the dummy logic gate electrodes DLG1 and DLG2, and the dummy remaining part D61.

Figure 13B:
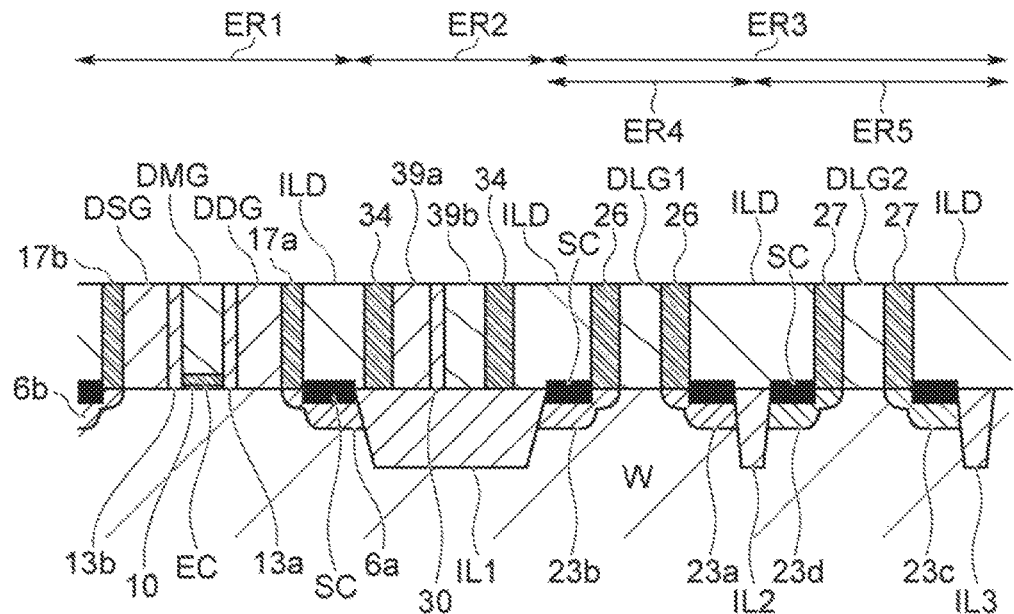
FIG. 13B is a schematic view illustrating process (8) of manufacturing the semiconductor integrated circuit device illustrated in FIG. 10.

Subsequently, planarizing treatment such as CMP is performed to polish and planarize the surface of the interlayer insulating layer ILD, and further polish and planarize surfaces of the hard mask layers HM1a, HM1c, HM1d, and HM1e, the dummy memory gate structure D22, the dummy first select gate electrode DDG, the dummy second select gate electrode DSG, the dummy logic gate electrodes DLG1 and DLG2, and the dummy remaining part D61 that are exposed from the top surface of the interlayer insulating layer ILD. In this manner, as illustrated in FIG. 13B, in which any corresponding part to that in FIG. 13A is denoted by an identical reference sign, planarized top surfaces of the dummy memory gate electrode DMG, the dummy first select gate electrode DDG, the dummy second select gate electrode DSG, the dummy logic gate electrodes DLG1 and DLG2, the logic dummy electrode remaining part 39a, and the memory dummy electrode remaining part 39b are exposed on the planarized surface of the interlayer insulating layer ILD (the electrode exposing process).

Subsequently, the PMOS peripheral circuit region ER5 is covered by a resist, whereas the memory circuit region ER1, the barrier region ER2, and the NMOS peripheral circuit region ER4 are exposed. In this state, dry etching using, for example, carbon tetrafluoride ($CF_4$) is performed to remove the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b exposed on the surface of the interlayer insulating layer ILD. Thereafter, the resist on the PMOS peripheral circuit region ER5 is removed. Subsequently, a layered insulating film made of an insulating material (for example, a high-k material) different from that of the lower memory gate insulating film 10 is formed across the memory circuit region ER1 and the peripheral circuit region ER3 and formed in spaces from which the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b have been removed.

Accordingly, as illustrated in FIG. 10, the insulating film in the memory circuit region ER1 forms the upper memory gate insulating film 11 on the charge storage layer EC between the sidewall insulating films 13a and 13b, and forms the wall-shaped memory gate sidewall insulating films 57a and 57b along the sidewall insulating films 13a and 13b. Simultaneously, the insulating film in the memory circuit region ER1 forms the first select gate insulating film 15a on the semiconductor substrate W between the sidewall insulating film 13a and the sidewall structure 17a, forms the wall-shaped first select gate sidewall insulating film 16a along the sidewall insulating film 13a, and forms the wall-shaped facing sidewall insulating film 56a along the sidewall structure 17a. Accordingly, the sidewall spacer 8a composed of the sidewall insulating film 13a and the first select gate sidewall insulating film 16a is formed in the memory circuit region ER1.

In addition, simultaneously, the insulating film in the memory circuit region ER1 forms the second select gate insulating film 15b on the semiconductor substrate W between the sidewall insulating film 13b and the sidewall structure 17b, forms the wall-shaped second select gate sidewall insulating film 16b along the sidewall insulating film 13b, and forms the wall-shaped facing sidewall insulating film 56b along the sidewall structure 17b. Accordingly, the sidewall spacer 8b composed of the sidewall insulating film 13b and the second select gate sidewall insulating film 16b is formed in the memory circuit region ER1. The insulating film in the NMOS peripheral circuit region ER4 of the peripheral circuit region ER3 forms the logic gate insulating film 25a on the semiconductor substrate W between the sidewall structures 26 facing to each other, and forms the wall-shaped sidewall insulating films 73a and 73b along the respective sidewall structures 26. In the barrier region ER2, the insulating film 63 having a recessed section is formed on the element separation layer IL1 between the sidewall structure 34a and the remaining insulating film 30, and the insulating film 64 having a recessed section is formed on the element separation layer IL1 between the sidewall structure 34b and the remaining insulating film 30.

Subsequently, a metal electrode layer made of an N-type MOS metallic material such as titanium aluminide (TiAl) aluminum (Al), tantalum carbide (TaC), or tantalum silicon nitride (TaSiN) is formed on the surface of the interlayer insulating layer ILD. Then, the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b are removed, and the metal electrode layer is embedded in each electrode formation space enclosed by a layered insulating material. Thereafter, the metal electrode layer and the insulating film are polished through planarizing treatment such as CMP to planarize surfaces of the metal electrode layer and the insulating film in accordance with the surface of the interlayer insulating layer ILD. In the PMOS peripheral circuit region ER5 of the peripheral circuit region ER3, the dummy logic gate electrode DLG2 is not removed but remains in a state m which it is formed, and thus the metal electrode layer and the insulating film on the dummy logic gate electrode DLG2 and the interlayer insulating layer ILD are removed through the planarizing treatment.

Accordingly, in the memory circuit region ER1, as illustrated in FIG. 10, the metal electrode layer is embedded in an electrode formation space enclosed by the upper memory gate insulating film 11 and the memory gate sidewall insulating films 57a and 57b in a space in which the dummy memory gate electrode DMG has been formed, thereby forming the metal memory gate electrode MG. In this manner, the memory gate structure 52 in which the lower memory gate insulating film 10, the charge storage layer EC, the upper memory gate insulating film 11, and the metal memory gate electrode MG are stacked in this order on the semiconductor substrate W is formed in the memory circuit region ER1.

Simultaneously, in the memory circuit region ER1, the metal electrode layer is embedded in an electrode formation space enclosed by the first select gate insulating film 15a, the first select gate sidewall insulating film 16a and the facing sidewall insulating film 56a in a space in which the dummy first select gate electrode DDG has been formed, thereby forming the metal first select gate electrode DG. Accordingly, the first select gate structure 53 in which the metal first select gate electrode DG is provided on the first select gate insulating film 15a is formed in the memory circuit region ER1. In addition, simultaneously, in the memory circuit region ER1, the metal electrode layer is embedded in an electrode formation space enclosed by the second select gate insulating film 15b, the second select gate sidewall insulating film 16b, and the facing sidewall insulating film 56b in a space in which the dummy second select gate electrode DSG has been formed, thereby forming the metal second select gate electrode SG. Accordingly, the second select gate structure 54 in which the metal second select gate electrode SG is provided on the second select gate insulating film 15b is formed in the memory circuit region ER1.

In the NMOS peripheral circuit region ER4 of the peripheral circuit region ER3, the metal electrode layer is embedded in an electrode formation space enclosed by the logic gate insulating film 25a and the sidewall insulating films 73a and 73b in a space in which the dummy logic gate electrode DLG1 has been formed, thereby forming the metal logic gate electrode LG1. Accordingly, the logic gate structure 21a in which the metal logic gate electrode LG1 is provided on the logic gate insulating film 25a is formed in the NMOS peripheral circuit region ER4 (the metal gate electrode forming process). In this manner, the metal memory gate electrode MG, the metal first select gate electrode DG, the metal second select gate electrode SG, and the metal logic gate electrode LG1 are formed of the same layer (metal electrode layer). Simultaneously, in the barrier region ER2, the metal electrode layer is embedded in electrode formation spaces enclosed by the insulating films 63 and 64 having recessed sections, forming the remaining metal layers MS1 and MS2. In this manner, the remaining part 61 is formed on the element separation layer IL1.

Subsequently, the memory circuit region ER1, the barrier region ER2, and the NMOS peripheral circuit region ER4 are covered by a resist, whereas the PMOS peripheral circuit region ER5 is exposed. In this state, dry etching using, for example, carbon tetrafluoride ($CF_4$) is performed to remove the dummy logic gate electrode DLG2 exposed on the surface of the interlayer insulating layer ILD. Thereafter, the resist is removed. Subsequently, a layered insulating film made of an insulating material (for example, a high-k material) different from that of the lower memory gate insulating film 10 is formed in a space from which the dummy logic gate electrode DLG2 has been removed.

Accordingly, as illustrated in FIG. 10, in the PMOS peripheral circuit region ER5, the logic gate insulating film 25a is formed on the semiconductor substrate W between the sidewall structures 27 facing to each other, and the wall-shaped sidewall insulating films 73a and 73b are formed along the respective sidewall structures 26. Subsequently, a metal electrode layer made of a P-type MOS metallic material such as aluminum (Al) or nitridation titanium (TiN) is formed on the surface of the interlayer insulating layer ILD and embedded in an electrode formation space enclosed by the logic gate insulating film 25a and the sidewall insulating films 73a and 73b in a space from which the dummy logic gate electrode DLG2 has been removed. Thereafter, the P-type MOS metal electrode layer and the insulating films are polished through planarizing treatment such as CMP to planarize surfaces of the metal electrode layer and the insulating films in accordance with the surface of the interlayer insulating layer ILD.

Accordingly, in the PMOS peripheral Circuit region ER5, the metal logic gate electrode LG2 is formed in the electrode formation space enclosed by the logic gate insulating film 25a and the sidewall insulating films 73a and 73b, and the logic gate structure 21b in which the metal logic gate electrode LG2 made of a P-type MOS metallic material is provided on the logic gate insulating film 25b is formed. Thereafter, the process of forming various contacts such as the first select gate contact, the second select gate contact, and the memory gate contact, which are not illustrated in FIG. 10, at predetermined places of the interlayer insulating layer ILD is performed to complete manufacturing of the semiconductor integrated circuit device 60.

(3-4) Operations and Effects

The memory cell 51 manufactured by the manufacturing method as described above and the semiconductor integrated circuit device 60 according to the third embodiment can achieve effects similarly to those of the first embodiment described above.

In the method for manufacturing the semiconductor integrated circuit device 46 according to the present invention, as illustrated in FIGS. 11A and 11B, the logic dummy electrode layer 77, the charge storage layer ECa, and the lower memory gate insulating film 10a in the memory circuit region ER1 are patterned by using the patterned resist M3a to form, in the memory circuit region ER1, the dummy memory gate structure D22, in which the lower memory gate insulating film 10, the charge storage layer EC, and the dummy memory gate electrode DMG provided by patterning are stacked in this order Simultaneously, the logic dummy electrode layer 77 remains intact in the peripheral circuit region ER3 using the resist M3b. Thereafter, the sidewall insulating films 13a and 13b are formed along the facing sidewalls of the dummy memory gate structure D22 in the memory circuit region ER1.

In the manufacturing method, as illustrated in FIGS. 12B and 12C, the memory dummy electrode layer 78 formed in the memory circuit region ER1 and the logic dummy electrode layer 77 formed in the peripheral circuit region ER3 are patterned by using the patterned resists M5a and M5b. In this manner, the dummy logic gate electrodes DLG1 and DLG2 disposed on the semiconductor substrate W in the peripheral circuit region ER3, the dummy first select gate electrode DDG disposed on the semiconductor substrate W along the sidewall insulating film 13a of the dummy memory gate structure D22, and the dummy second select gate electrode DSG disposed on the semiconductor substrate W along the sidewall insulating film 13b of the dummy memory gate structure D22 can be formed all at once through the same manufacturing process.

In addition, in the manufacturing method, the interlayer insulating layer ILD formed in the memory circuit region ER1 and the peripheral circuit region ER3 is planarized through planarizing treatment, and the dummy memory gate electrode DMG, the dummy first select gate electrode DDG, the dummy second select gate electrode DSG, and the dummy logic gate electrode DLG1 exposed on the interlayer insulating layer ILD are removed. Thereafter, an insulating film and a metal electrode layer are formed in this order in me spaces in which the dummy memory gate electrode DMG, the dummy first select gate electrode DDG, the dummy second select gate electrode DSG, and the dummy logic gate electrode DLG1 have been formed.

Accordingly, in the manufacturing method, the upper memory gate insulating film 11, the first select gate insulating film 15a, the second select gate insulating film 15b, and the logic gate insulating film 25a can be formed all at once through the same manufacturing process in the spaces from which the dummy memory gate electrode DMG, the dummy first select gate electrode DDG, the dummy second select gate electrode DSG, and the dummy logic gate electrode DLG1 have been removed, respectively. In addition, the metal memory gate electrode MG, the metal first select gate electrode DG, the metal second select gate electrode SG, and the metal logic gate electrode LG1 can be formed all at once through the same manufacturing process on the upper memory gate insulating film 11, the first select gate insulating film 15a, the second select gate insulating film 15b, and the logic gate insulating film 25a, respectively.

As described above, in the manufacturing method according to the third embodiment of the present invention, too, the metal memory gate electrode MG, the metal first select gate electrode DG, and the metal second select gate electrode SG each made of a metallic material the same as that of the metal logic gate electrode LG1 can be formed simultaneously with the metal logic gate electrode LG1 through a series of manufacturing processes of forming, for example, the metal logic gate electrode LG1 made of an N-type MOS metallic material on the semiconductor substrate W.

Figure 14:
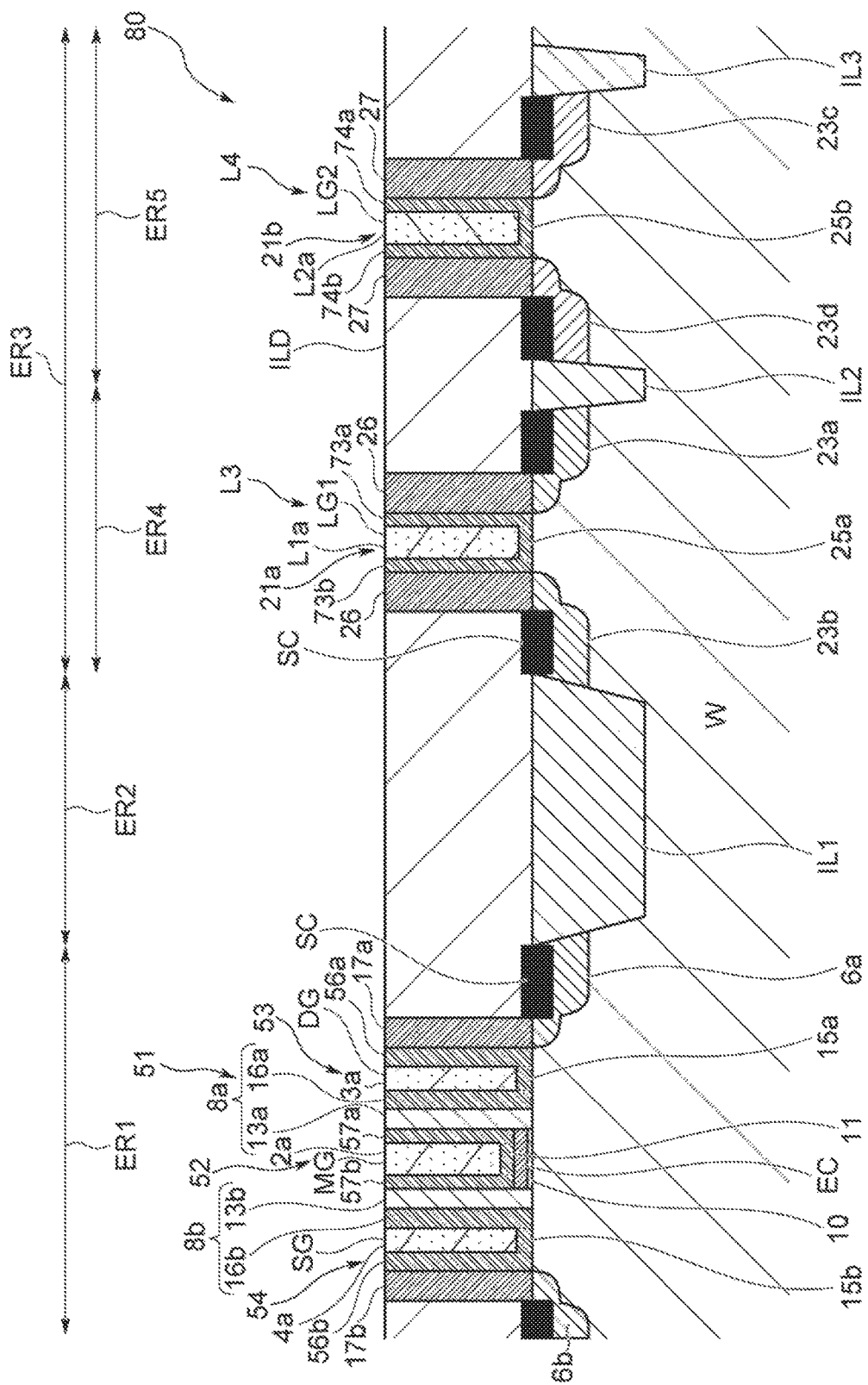
FIG. 14 is a schematic view illustrating a sectional configuration of a semiconductor integrated circuit device according to a fourth embodiment.

(4) Fourth Embodiment (4-1) Configuration of Semiconductor Integrated Circuit Device According to Fourth Embodiment In FIG. 14, in which any corresponding part to that in FIG. 10 is denoted by an identical reference sign, reference numeral 80 denotes a semiconductor integrated circuit device according to a fourth embodiment. The semiconductor integrated circuit device 80 differs from the semiconductor integrated circuit device 60 according to the third embodiment described above only in the configuration of the barrier region ER2. The semiconductor integrated circuit device 80 has a configuration in which the remaining part 61 (FIG. 10) included in the semiconductor integrated circuit device 66 according to the third embodiment described above is not disposed in the barrier region ER2 and the interlayer insulating layer ILD is disposed on the element separation layer IL1. The semiconductor integrated circuit device 80, in which no remaining part 61 (FIG. 9) is disposed in the barrier region ER2, has a simplified entire configuration.

The semiconductor integrated circuit device 80 according to the fourth embodiment has, in the memory circuit region ER1 and in the peripheral circuit region ER3 other than the barrier region ER2, a configuration identical to that of the semiconductor integrated circuit device 60 according to the third embodiment described above, and thus description of the memory circuit region ER1 and the peripheral circuit region ER3 will be omitted in the following description, in the semiconductor integrated circuit device 80, the data programming operation and the data programming prevention operation on the memory cell 51 are the same as those described above in "(1-2) Data programming method", and the data reading operation and the data erasing operation on the memory cell 51 are the same as those described above in "(1-3) Other operations", and thus description thereof will be omitted in the following.

(4-2) Method for Manufacturing Semiconductor Integrated Circuit Device According to Fourth Embodiment The semiconductor integrated circuit device 80 having the above-described configuration is manufactured in accordance with a manufacturing process as described below. In the manufacturing process, simultaneously with the metal logic gate electrode LG1 made of, for example, an N-type MOS metallic material on the semiconductor substrate W among the metal logic gate electrodes LG1 and LG2 each made of a metallic material the metal memory gate electrode MG, the metal first select gate electrode DG, and the metal second select gate electrode SG are formed of a metallic material the same as that of the metal logic gate electrode LG1 through a series of manufacturing processes of forming the metal logic gate electrode LG1 without forming the remaining part 61 (FIG. 10) in the barrier region ER2.

First, as illustrated in FIG. 3A, a plurality of the element separation layers IL1, IL2, and IL3 each made of an insulating material such as $SiO_2$ are formed at predetermined positions with predetermined intervals therebetween on the surface of the semiconductor substrate W made of, for example, Si by, for example, the STI method. In adjustment of the threshold voltage of the semiconductor substrate W in the peripheral circuit region ER3, for example, the ion implantation method is employed to inject P-type impurities into the semiconductor substrate W in the NMOS peripheral circuit region ER4 between the element separation layers IL1 and IL2, and N-type impurities into the semiconductor substrate W in the PMOS peripheral circuit region ER5 between the element separation layers IL2 and IL3.

Subsequently, resist patterning is performed by the photolithography technique to cover, with the resist M1, the partial region of the element separation layer IL1 formed in the barrier region ER2 between the memory circuit region ER1 and the peripheral circuit region ER3, and the semiconductor substrate W in the peripheral circuit region ER3. In this state, impurities such as B (boron), P (phosphorus), and As (arsenic) are injected into the semiconductor substrate W in the memory circuit region ER1 by implantation or the like to adjust the threshold voltage of the semiconductor substrate W in the formation target region (the memory gate electrode formation target region) in which the metal memory gate electrode MG (FIG. 14) is to be formed.

Subsequently, after the resist M1 is removed, a layered lower memory gate insulating film made of, for example, $SiO_2$ and a charge storage layer made of, for example, SiN are stacked in this order across the memory circuit region ER1, the barrier region ER2, and the peripheral circuit region ER3. Thereafter, resist patterning is performed by the photolithography technique to cover, with the resist M2, the memory circuit region ER1 and the partial region of the barrier region ER2 as illustrated in FIG. 3B, in which any corresponding part to that in FIG. 3A is denoted by an identical reference sign. Then, the lower memory gate insulating film and the charge storage layer exposed through the resist M2 in the barrier region ER2 and the peripheral circuit region ER3 are removed. In this manner, the layered lower memory gate insulating film 10a and the layered charge storage layer ECa are formed only in the memory circuit region ER1 and the partial region of the barrier region ER2.

Figure 15A:
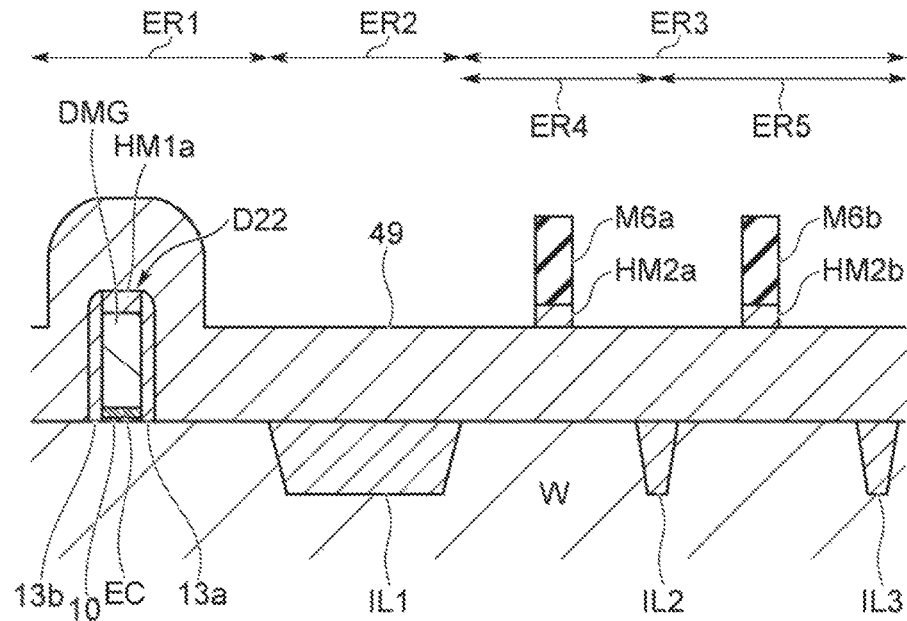
FIG. 15A is a schematic view illustrating process (1) of manufacturing the semiconductor integrated circuit device illustrated in FIG. 14.

Subsequently, after the resist M2 is removed, a layered memory dummy electrode layer (not illustrated) made of, for example, polysilicon is formed across the charge storage layer ECa in the memory circuit region ER1, the element separation layer IL1 in the barrier region ER2, and the semiconductor substrate W in the peripheral circuit region ER3. Subsequently, as illustrated in FIG. 15A, in which any corresponding part to that in FIG. 3B is denoted by an identical reference sign, the hard mask layer HM1a is formed in the memory gate electrode formation target region by using a patterned resist (not illustrated). Then, the memory dummy electrode layer (not illustrated), the charge storage layer ECa, and the lower memory gate insulating film 10a are patterned through the hard mask layer HM1a to form, in the memory gate electrode formation target region in the memory circuit region ER1, the dummy memory gate structure D22, in which the lower memory gate insulating film 10, the charge storage layer EC, and the dummy memory gate electrode DMG are slacked in this order. The dummy memory gate electrode DMG is formed by fabricating the memory dummy electrode layer (not illustrated) in the memory circuit region ER1.

Subsequently, a layered insulating film (not illustrated) made of, for example, $SiO_2$ is formed across the memory circuit region ER1, the barrier region ER2, and the peripheral circuit region ER3 and then etched back to form the sidewall insulating films 13a and 13b having sidewall shapes along the facing sidewalls of the dummy memory gate structure D22 in the memory circuit region ER1 (the sidewall insulating film forming process). Subsequently, the peripheral circuit region ER3 is covered by a patterned resist (not illustrated). In this state, impurities such as B (boron). P (phosphorus), and As (arsenic) are injected into the semiconductor substrate W in the memory circuit region ER1 by the ion implantation method or the like to adjust the threshold voltage of the semiconductor substrate W in the formation target regions (select gate electrode formation target regions) of the metal first select gate electrode DG and the metal second select gate electrode SG (FIG. 7) to be formed through a later manufacturing process.

Subsequently, after the resist is removed, the layered logic dummy electrode layer 49 made of, for example, polysilicon is formed across the memory circuit region ER1, the harrier region ER2, and the peripheral circuit region ER3 (the dummy electrode layer forming process). Subsequently, m the peripheral circuit region ER3, the resists M6a and M6b are formed to cover the formation target regions (logic gate electrode formation target regions) of the metal logic gate electrodes LG1 and LG2 (FIG. 14) to be formed through a later manufacturing process. A hard mask layer (not illustrated) made of, for example, $SiO_2$ is patterned by using the resists M6a and M6b to form, on the logic dummy electrode layer 49, the hard mask layers HM2a and HM2b covering the logic gate electrode formation target region.

Subsequently, after the resists M6a and M6b are removed, the remaining hard mask layers HM2a and HM2b are used as masks to etch back the logic dummy electrode layer 49 in the memory circuit region ER1, the barrier region ER2, and the peripheral circuit region ER3. Accordingly, as illustrated in FIG. 15B, in which any corresponding part to that in FIG. 15A is denoted by an identical reference sign, the logic dummy electrode layer 49 remaining in the logic gate electrode formation target regions in the peripheral circuit region ER3 through the hard mask layers HM2a and HM2b, forming the dummy logic gate electrodes DLG1 and DLG2.

Simultaneously, in the memory circuit region ER1, the logic dummy electrode layer 49 remains in a sidewall shape along the sidewall insulating film 13a on the first sidewall of the dummy memory gate structure D22, forming the dummy first select gate electrode DDG, and the logic dummy electrode layer 49 remains in a sidewall shape along the sidewall insulating film 13b on the second sidewall of the dummy memory gate structure D22, forming the dummy second select gate electrode DSG (the dummy gate electrode forming process). As described above, in the present embodiment, the logic dummy electrode layer 49 provided for forming the dummy logic gate electrodes DLG1 and DLG2 is used to form the dummy first select gate electrode DDG and the dummy second select gate electrode DSG in the memory circuit region ER1.

Figure 15B:
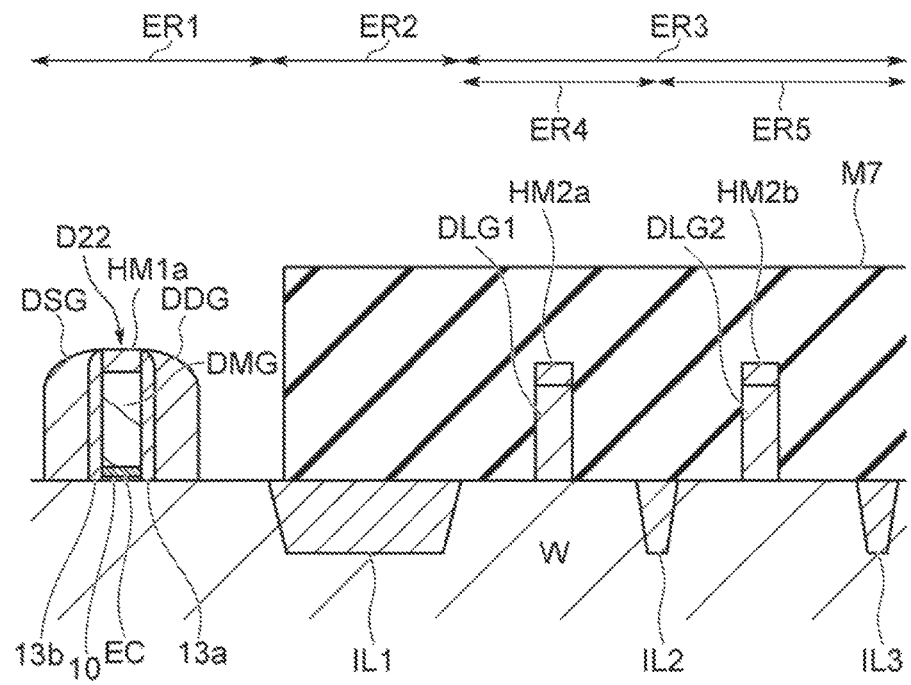
FIG. 15B is a schematic view illustrating process (2) of manufacturing the semiconductor integrated circuit device illustrated in FIG. 14.

To reduce the widths of the dummy first select gate electrode DDG and the dummy second select gate electrode DSG formed in the memory circuit region ER1, as illustrated in FIG. 15B, the peripheral circuit region ER3 and a partial region of the barrier region ER2 are covered by the resist M7, and the dummy first select gate electrode DDG and the dummy second select gate electrode DSG exposed in the memory circuit region ER1 are removed by dry etching. In this manner, the dummy first select gate electrode DDG and the dummy second select gate electrode DSG having desired widths are formed. Accordingly, in the manufacturing method, the dummy first select gate electrode DDG and the dummy second select gate electrode DSG in the memory circuit region ER1 can be formed to have desired widths independently whereas the dummy logic gate electrodes DLG1 and DLG2 having desired widths are formed in the peripheral circuit region ER3. Thus, the dummy first select gate electrode DDG and the dummy second select gate electrode DSG having small widths can be formed by the manufacturing method.

In the method for manufacturing the semiconductor integrated circuit device 80 according to the fourth embodiment, when the dummy first select gate electrode DDG, the dummy second select gate electrode DSG, and the dummy logic gate electrode DLG1, DLG2 are formed, the sidewall insulating film 30, the memory dummy electrode layer, and the logic dummy electrode layer 49 do not remain in the barrier region ER2, and thus the entire surface of the element separation layer IL1 can be exposed.

Thereafter, low concentration of N-type impurities or P-type impurities are injected into the memory circuit region ER1 and the peripheral circuit region ER3 by the ion implantation method or the like using a resist (not illustrated) patterned for the N type or the P type. Accordingly, as illustrated in FIG. 14, the drain region 6a and the source region 6b are formed in the surface of the semiconductor substrate W in the memory circuit region ER1, and the impurity diffusion regions 23a, 23b, 23c, and 23d are formed in the surface of the semiconductor substrate W in the peripheral circuit region ER3. Subsequently, a layered insulating layer (not illustrated) made of, for example, SiN is formed across the memory circuit region ER1, the barrier region ER2, and the peripheral circuit region ER3 and then etched back. Accordingly, the insulating layer remains on the sidewalls of the dummy first select gate electrode DDG and the dummy second select gate electrode DSG, forming the sidewall structures 17a and 17b, and the insulating layer also remains on the facing sidewalls of the dummy logic gate electrodes DLG1 and DLG2, forming the sidewall structures 26 and 27.

Thereafter, in addition, the following processes are sequentially performed: the process of forming high-concentration impurity regions in the drain region 6a and the source region 6b in the memory circuit region ER1 and the impurity diffusion regions 23a, 23b, 23c, and 23d in the peripheral circuit region ER3 by injecting high concentration of N-type impurities or P-type impurities into necessary places of the semiconductor substrate W by the ion implantation method or the like; the process of forming the silicide layer SC on the drain region 6a, the source region 6b, and the impurity diffusion regions 23a, 23b, 23c, and 23d; and the process of forming the interlayer insulating layer ILD to cover the dummy memory gate structure D22, the dummy first select gate electrode DDG, the dummy second select gate electrode DSG and the dummy logic gate electrodes DLG1 and DLG2.

Subsequently, the surface of the interlayer insulating layer ILD is planarized by polished through planarizing treatment such as CMP to expose, on the surface of the interlayer insulating layer ILD, the planarized top surfaces of the dummy memory gate electrode DMG, the dummy first select gate electrode DDG, the dummy second select gate electrode DSG, and the dummy logic gate electrodes DLG1 and DLG2 (the electrode exposing process). Subsequently, the PMOS peripheral circuit region ER5 is covered by a resist, whereas the memory circuit region ER1, the barrier region ER2, and the NMOS peripheral circuit region ER4 are exposed. In this state, dry etching using, for example, carbon tetrafluoride ($CF_4$) is performed to remove the dummy memory gate electrode DMG, the dummy first select gate electrode DDG, the dummy second select gate electrode DSG, and the dummy logic gate electrode DLG1 exposed on the surface of the interlayer insulating layer ILD. Thereafter, the resist on the PMOS peripheral circuit region ER5 is removed.

Subsequently, a layered insulating film made of an insulating material (for example, a high-k material) different from that of the lower memory gate insulating film 10 is formed across the memory circuit region ER1 and the peripheral circuit region ER3 and formed in spaces from which the dummy memory gate electrode DMG, the dummy first select gate electrode DDG, the dummy second select gate electrode DSG, the dummy logic gate electrode DLG1, the logic dummy electrode remaining part 39a, and the memory dummy electrode remaining part 39b have been removed.

Accordingly, as illustrated in FIG. 14, the insulating film in the memory circuit region ER1 forms the upper memory gate insulating film 11 on the charge storage layer EC between the sidewall insulating films 13a and 13b, and forms the wall-shaped memory gate sidewall insulating films 57a and 57b along the sidewall insulating films 13a and 13b. Simultaneously, the insulating film in the memory circuit region ER1 forms the first select gate insulating film 15a on the semiconductor substrate W between the sidewall insulating film 13a and the sidewall structure 17a, forms the wall-shaped first select gate sidewall insulating film 16a along the sidewall insulating film 13a, and forms the wall-shaped facing sidewall insulating film 56a along the sidewall structure 17a. Accordingly, the sidewall spacer 8a composed of the sidewall insulating film 13a and the first select gate sidewall insulating film 16a is formed in the memory circuit region ER1.

In addition, simultaneously, the insulating film in the memory circuit region ER1 forms the second select gate insulating film 15b on the semiconductor substrate W between the sidewall insulating film 13b and the sidewall structure 17b, forms the wall-shaped second select gate sidewall insulating film 16b along the sidewall insulating film 13b, and forms the wall-shaped facing sidewall insulating film 56b along the sidewall structure 17b. Accordingly, the sidewall spacer 8b composed of the sidewall insulating film 13b and the second select gate sidewall insulating film 16b is formed in the memory circuit region ER1. The insulating film in the NMOS peripheral circuit region ER4 of the peripheral circuit region ER3 forms the logic gate insulating film 25a on the semiconductor substrate W between the sidewall structures 26 facing to each other, and forms the wall-shaped sidewall insulating films 73a and 73b along the respective sidewall structures 26.

Subsequently, a metal electrode layer made of an N-type MOS metallic material such as aluminum (Al), titanium aluminide (TiAl), tantalum carbide (TaC), or tantalum silicon nitride (TaSiN) is formed on the surface of the interlayer insulating layer ILD. Then, the dummy memory gate electrode DMG, the dummy first select gate electrode DDG, the dummy second select gate electrode DSG, and the dummy logic gate electrode DLG1 are removed, and the metal electrode layer is embedded in each electrode formation space enclosed by a layered insulating material. Thereafter, the metal electrode layer and the insulating film are polished through planarizing treatment such as CMP to planarize surfaces of the metal electrode layer and the insulating film in accordance with the surface of the interlayer insulating layer ILD. In the PMOS peripheral circuit region ER5 of the peripheral circuit region ER3, the dummy logic gate electrode DLG2 is not removed but remains in a state in which it is formed, and thus the metal electrode layer and the insulating film on the dummy logic gate electrode DLG2 and the interlayer insulating layer ILD are removed through the planarizing treatment.

Accordingly, in the memory circuit region ER1, as illustrated in FIG. 14, the metal electrode layer is embedded in the electrode formation space enclosed by the upper memory gate insulating film 11 and the memory gate sidewall insulating films 57a and 57b in the space in which the dummy memory gate electrode DMG has been formed, thereby forming the metal memory gate electrode MG. In this manner, the memory gate structure 52 in which the lower memory gate insulating film 10, the charge storage layer EC, the upper memory gate insulating film 11, and the metal memory gate electrode MG are stacked in this order on the semiconductor substrate W is formed in the memory circuit region ER1.

Simultaneously, in the memory circuit region ER1, the metal electrode layer is embedded in the electrode formation space enclosed by the first select gate insulating film 15a, the first select gate sidewall insulating film 16a and the facing sidewall insulating film 56a in the space in which the dummy first select gate electrode DDG has been formed, thereby forming the metal first select gate electrode DG. Accordingly, the first select gate structure 53 in which the metal first select gate electrode DG is provided on the first select gate insulating film 15a is formed in the memory circuit region ER1. In addition, simultaneously, in the memory circuit region ER1, the metal electrode layer is embedded in the electrode formation space enclosed by the second select gate insulating film 15b, the second select gate sidewall insulating film 16b, and the facing sidewall insulating film 56b in the space in which the dummy second select gate electrode DSG has been formed, thereby forming the metal second select gate electrode SG. Accordingly, the second select gate structure 54 in which the mewl second select gate electrode SG is provided on the second select gate insulating film 15b is formed in the memory circuit region ER1.

In the NMOS peripheral circuit region ER4 of the peripheral circuit region ER3, the metal electrode layer is embedded in the electrode formation space enclosed by the logic gate insulating film 25a and the sidewall insulating films 73a and 73b in the space in which the dummy logic gate electrode DLG1 has been formed, thereby forming the metal logic gate electrode LG1. Accordingly, the logic gate structure 21a in which the metal logic gate electrode LG1 is provided on the logic gate insulating film 25a is formed in the NMOS peripheral circuit region ER4 (the metal gate electrode forming process). In this manner, the metal memory gate electrode MG, the metal first select gate electrode DG, the metal second select gate electrode SG, and the metal logic gate electrode LG1 are formed of the same layer (metal electrode layer).

Thereafter, similarly to the third embodiment described above, as illustrated in FIG. 14, the metal logic gate electrode LG2 made of a P-type MOS metallic material is formed in the PMOS peripheral circuit region ER5 of the peripheral circuit region ER3. Thereafter, the process of forming various contacts such as the first select gate contact, the second select gate contact, and the memory gate contact, which are not illustrated in FIG. 14, at predetermined places of the interlayer insulating layer ILD is performed to complete manufacturing of the semiconductor integrated circuit device 80.

(4-3) Operations and Effects

The memory cell 51 manufactured by the manufacturing method as described above and the semiconductor integrated circuit device SG according to the fourth embodiment can achieve effects similarly to those of the first embodiment described above.

In the method for manufacturing the semiconductor integrated circuit device 80 according to the present invention, first, the dummy memory gate structure D22, in which the lower memory gate insulating film 10, the charge storage layer EC, and the dummy memory gate electrode DMG provided by patterning are stacked in this order on the semiconductor substrate W, is provided in the memory circuit region ER1 as illustrated in FIG. 15A. Thereafter, the sidewall insulating films 13a and 13b are formed along the facing sidewalls of the dummy memory gate structure D22.

In the manufacturing method, the logic dummy electrode layer 49 formed across the memory circuit region ER1 and the peripheral circuit region ER3 is patterned by using the patterned resists M6a and M6b. In this manner, as illustrated in FIG. 15B, the dummy logic gate electrodes DLG1 and DLG2 disposed on the semiconductor substrate W, the dummy first select gate electrode DDG disposed along the sidewall insulating film 13a of the dummy memory gate structure D22, and the dummy second select gate electrode DSG disposed along the sidewall insulating film 13b of the dummy memory gate structure D22 can be formed all at once through the same manufacturing process.

In addition, in the manufacturing method, the interlayer insulating layer ILD formed in the memory circuit region ER1 and the peripheral circuit region ER3 is planarized through planarizing treatment, and the dummy memory gate electrode DMG, the dummy first select gate electrode DDG, the dummy second select gate electrode DSG, and the dummy logic gate electrode DLG1 exposed on the interlayer insulating layer ILD are removed. Thereafter, an insulating film and a metal electrode layer are formed in this order in the spaces in which the dummy memory gate electrode DMG, the dummy first select gate electrode DDG, the dummy second select gate electrode DSG, and the dummy logic gate electrode DLG1 have been formed.

Accordingly, in the manufacturing method, the upper memory gate insulating film 11, the first select gate insulating film 15a, the second select gate insulating film 15b, and the logic gate insulating film 25a can be formed all at once through the same manufacturing process in the spaces from which the dummy memory gate electrode DMG, the dummy first select gate electrode DDG, the dummy second select gate electrode DSG, and the dummy logic gate electrode DLG1 have been removed, respectively. In addition, the metal memory gate electrode MG, the metal first select gate electrode DG, the metal second select gate electrode SG, and the metal logic gate electrode LG1 can be formed all at once through the same manufacturing process on the upper memory gate insulating film 11, the first select gate insulating film 15a, the second select gate insulating film 15b, and the logic gate insulating film 25a, respectively.

As described above, in the manufacturing method according to the fourth embodiment of the present invention, too, the metal memory gate electrode MG, the metal first select gate electrode DG, and the metal second select gate electrode SG each made of a metallic material the same as that of the metal logic gate electrode LG1 can be formed simultaneously with the metal logic gate electrode LG1 through a series of manufacturing processes of forming, for example, the metal logic gate electrode LG1 made of an N-type MOS metallic material on the semiconductor substrate W.

(5) Other Embodiments

The present invention is not limited to the first to fourth embodiments described above, but various modifications are possible within the scope of the present invention. For example, various voltages may be applied at each site described above in "(1-2) Data programming method" and "(1-3) Other operations". The configurations according to the embodiments may be combined to achieve a semiconductor integrated circuit device.

In the above-described embodiments, in the peripheral circuit region ER3, the peripheral circuit L1 (L3) included in an N-type MOS transistor structure is disposed in the NMOS peripheral circuit region ER4, and the peripheral circuit L2 (L4) included in a P-type MOS transistor structure is disposed in the PMOS peripheral circuit region ER5. However, the present invention is not limited thereto. The peripheral circuits L1 and L2 (L3 and L4) may be both included in a P-type or N-type MOS transistor structure in the peripheral circuit region ER3.

In addition, in the above-described embodiments, the metal memory gate electrode MG, the metal first select gate electrode DG, and the metal second select gate electrode SG in the memory cell 1 or 51 are formed of an N-type MOS metallic material of the metal logic gate electrode LG1 in the NMOS peripheral circuit region ER4. However, the present invention is not limited thereto. The metal memory gate electrode MG, the metal first select gate electrode DG, and the metal second select gate electrode SG in the memory cell 1 or 51 may be formed of a P-type MOS metallic material of the metal logic gate electrode LG2 in the PMOS peripheral circuit region ER5. In this case, the memory cell is disposed on the semiconductor substrate W into which N-type impurities are injected, as necessary.

In addition, in the above-described embodiments, a single metal layer is used to form the metal memory gate electrode MG, the metal first select gate electrode DG, the metal second select gate electrode SG, and the metal logic gate electrodes LG1 and LG2, but the present invention is not limited thereto. For example, a plurality of kinds of metal layers made of different kinds of metallic materials may be sequentially stacked to form a laminated structure of the metal memory gate electrode MG, the metal first select gate electrode DG, the metal second select gate electrode SG, and the metal logic gate electrode LG1.

In addition, in the above-described embodiments, planarizing treatment such as CMP is performed as the electrode exposing process of exposing, on the interlayer insulating layer ILD, the top surfaces of the dummy memory gate electrode DMG, the dummy first select gate electrode DDG, the dummy second select gate electrode DSG, and the dummy logic gate electrodes DLG1 and DLG2. However, the present invention is not limited thereto. Any other various kinds of fabrication such as etching on the interlayer insulating layer ILD is applicable to expose, on the interlayer insulating layer ILD, the top surfaces of the dummy memory gate electrode DMG, the dummy first select gate electrode DDG, the dummy second select gate electrode DSG, and the dummy logic gate electrodes DLG1 and DLG2.

The voltage (for example, the first select gate voltage, the second select gate voltage, the off voltage, and the reading voltage) of 1.5 V defined in "(1-2) Data programming method" and "(1-3) Other operations" described above may be a power supply voltage VDD of 1.5 V or lower, such as 1.2 V or 1.0 V. The power supply voltage VDD allows execution of operations the same as those described above.

REFERENCE SIGNS LIST 1,51 memory cell
20,46,60,80 semiconductor integrated circuit device
2 memory gate structure
3 first select gate structure
4 second select gate structure
6a dram region
6b source region
8a sidewall spacer
8b side wall spacer
10 lower memory gate insulating film
11 upper memory gate insulating film
15a first select gate insulating film
15b second select gate insulating film
D2, D22 dummy memory gate structure
D3 dummy first select gate structure
D4 dummy second select gate structure
DG metal first select gate electrode
EC charge storage layer
MG metal memory gate electrode
SG metal second select gate electrode
W semiconductor substrate

What is claimed is:

1. A memory cell disposed on a semiconductor substrate on which a peripheral circuit including a metal logic gate electrode containing a metallic material is provided, the memory cell comprising:
a drain region disposed on a surface of the semiconductor substrate and connected with a bit line;
a source region disposed on the surface of the semiconductor substrate and connected with a source line;
a memory gate structure that is disposed between the drain region and the source region and in which a lower memory gate insulating film, a charge storage layer, an upper memory gate insulating film, and a metal memory gate electrode containing the metallic material are stacked in this order on the semiconductor substrate;
a first select gate structure in which a metal first select gate electrode containing the metallic material is disposed on the semiconductor substrate between the drain region and the memory gate structure through a first select gate insulating film and that is disposed adjacent to a first sidewall of the memory gate structure through a first sidewall spacer; and
a second select gate structure in which a metal second select gate electrode containing the metallic material is disposed on the semiconductor substrate between the source region and the memory gate structure through a second select gate insulating film and that is disposed adjacent to a second sidewall of the memory gate structure through a second sidewall spacer, wherein a first memory gate sidewall insulating film disposed along the first sidewall spacer and integrated with the upper memory gate insulating film is provided between the metal memory gate electrode and the first sidewall spacer, and a second memory gate sidewall insulating film disposed along the second sidewall spacer and integrated with the upper memory gate insulating film is provided between the metal memory gate electrode and the second sidewall spacer.

2. The memory cell according to claim 1, wherein the metal memory gate electrode, the metal first select gate electrode, and the metal second select gate electrode have planarized top surfaces, and a planarized top surface of the metal memory gate electrode, a planarized top surface of the metal first select gate electrode, and a planarized top surface of the metal second select gate electrode have identical heights.

3. A memory cell disposed on a semiconductor substrate on which a peripheral circuit including a metal logic gate electrode containing a metallic material is provided, the memory cell comprising:

a drain region disposed on a surface of the semiconductor substrate and connected with a bit line;

a source region disposed on the surface of the semiconductor substrate and connected with a source line;

a memory gate structure that is disposed between the drain region and the source region and in which a lower memory gate insulating film, a charge storage layer, an upper memory gate insulating film, and a metal memory gate electrode containing the metallic material are stacked in this order on the semiconductor substrate;

a first select gate structure in which a metal first select gate electrode containing the metallic material is disposed on the semiconductor substrate between the drain region and the memory gate structure through a first select gate insulating film and that is disposed adjacent to a first sidewall of the memory gate structure through a first sidewall spacer; and a second select gate structure in which a metal second select gate electrode containing the metallic material is disposed on the semiconductor substrate between the source region and the memory gate structure through a second select gate insulating film and that is disposed adjacent to a second sidewall of the memory gate structure through a second sidewall spacer, wherein the first sidewall spacer is composed of a first sidewall insulating film disposed along the first sidewall of the memory gate structure and a first select gate sidewall insulating film disposed along a sidewall of the first select gate structure and integrated with the first select gate insulating film, the second sidewall spacer is composed of a second sidewall insulating film disposed along the second sidewall of the memory gate structure and a second select gate sidewall insulating film disposed along a sidewall of the second select gate structure and integrated with the second select gate insulating film, the first select gate sidewall insulating film and the second select gate sidewall insulating film are made of an insulating material different from an insulating material of the first sidewall insulating film and the second sidewall insulating film, the first sidewall insulating film and the second sidewall insulating film are made of the insulating material having a relative dielectric constant smaller than a relative dielectric constant of the insulating material of the first select gate sidewall insulating film and the second select gate sidewall insulating film, and the first select gate sidewall insulating film and the second select gate sidewall insulating film are each made of a high-k material.

4. A semiconductor integrated circuit device including memory cells arranged in a matrix of rows and columns and each connected with a bit line and a source line, wherein each memory cell is the memory cell according to claim 1, and a peripheral circuit region in which the peripheral circuit is provided is provided around a memory circuit region in which each memory cell is disposed.

5. The semiconductor integrated circuit device according to claim 4, wherein the peripheral circuit has a configuration in which the metal logic gate electrode containing the metallic material is disposed on the surface of the semiconductor substrate through a logic gate insulating film, and the metal memory gate electrode, the metal first select gate electrode, the metal second select gate electrode, and the metal logic gate electrode are made of the same metallic material.

6. A method for manufacturing a semiconductor integrated circuit device including:

a memory circuit region in which a memory cell including a memory gate structure between a first select gate structure and a second select gate structure is disposed; and a peripheral circuit region in which a peripheral circuit including a logic gate structure is disposed, the method comprising:

a first dummy electrode layer forming process of forming a layered lower memory gate insulating film and a layered charge storage layer in this order on a semiconductor substrate in the memory circuit region, and then forming a layered logic dummy electrode layer on the charge storage layer in the memory circuit region and the semiconductor substrate in the peripheral circuit region;

a dummy memory gate structure forming process of patterning the logic dummy electrode layer, the charge storage layer, and the lower memory gate insulating film in the memory circuit region by using a patterned resist so that a dummy memory gate structure in which the lower memory gate insulating film, the charge storage layer, and a dummy memory gate electrode provided by patterning are stacked in this order is formed in the memory circuit region whereas the logic dummy electrode layer remains intact in the peripheral circuit region using the resist;

a sidewall insulating film forming process of forming a layered sidewall insulating film across the memory circuit region and the peripheral circuit region, and then etching back the layered sidewall insulating film to expose the semiconductor substrate, thereby forming sidewall insulating films along facing sidewalls of the dummy memory gate structure in the memory circuit region;

a second dummy electrode layer forming process of forming a layered memory dummy electrode layer across the memory circuit region and the peripheral circuit region, and then removing the memory dummy electrode layer in the peripheral circuit region by using a patterned resist whereas the memory dummy electrode layer remains in the memory circuit region;

a dummy gate electrode forming process of patterning the logic dummy electrode layer in the peripheral circuit region by using another patterned resist to form a dummy logic gate electrode on the semiconductor substrate, and etching back the memory dummy electrode layer in the memory circuit region so that a sidewall-shaped dummy first select gate electrode is formed along one of the sidewall insulating films of the dummy memory gate structure and a sidewall-shaped dummy second select gate electrode is formed along the other sidewall insulating film of the dummy memory gate structure;

an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, forming a layered insulating film in spaces in which the dummy memory gate electrode, the dummy first select gate electrode, the dummy second select gate electrode, and the dummy logic gate electrode have been formed, and then forming a metal memory gate electrode, a metal first select gate electrode, a metal second select gate electrode, and a metal logic gate electrode each containing a metallic material, in electrode formation spaces enclosed by the insulating film in the spaces.

7. The method for manufacturing a semiconductor integrated circuit device according to claim 6, wherein the dummy first select gate electrode and the dummy second select gate electrode formed through the dummy gate electrode forming process are formed to have desired widths by adjusting a thickness of the memory dummy electrode layer formed through the second dummy electrode layer forming process.

8. A method for manufacturing a semiconductor integrated circuit device including:

a memory circuit region in which a memory cell including a memory gate structure between a first select gate structure and a second select gate structure is disposed; and a peripheral circuit region in which a peripheral circuit including a logic gate structure is disposed, the method comprising:

a sidewall insulating film forming process of providing, in the memory circuit region, a dummy memory gate structure in which a lower memory gate insulating film, a charge storage layer, and a dummy memory gate electrode provided by patterning are stacked in this order on a semiconductor substrate, and then forming a layered sidewall insulating film across the memory circuit region and the peripheral circuit region, and then etching back the layered sidewall insulating film to expose the semiconductor substrate, thereby forming sidewall insulating films along facing sidewalls of the dummy memory gate structure;

a dummy electrode layer forming process of forming a layered logic dummy electrode layer in the memory circuit region and the peripheral circuit region;

a dummy gate electrode forming process of patterning the logic dummy electrode layer in the peripheral circuit region by using a patterned resist to form a dummy logic gate electrode on the semiconductor substrate, and etching back the logic dummy electrode layer in the memory circuit region so that a sidewall-shaped dummy first select gate electrode is formed along one of the sidewall insulating films of the dummy memory gate structure and a sidewall-shaped dummy second select gate electrode is formed along the other sidewall insulating film of the dummy memory gate structure;

an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, forming a layered insulating film in spaces in which the dummy memory gate electrode, the dummy first select gate electrode, the dummy second select gate electrode, and the dummy logic gate electrode have been formed, and then forming a metal memory gate electrode, a metal first select gate electrode, a metal second select gate electrode, and a metal logic gate electrode each containing a metallic material, in electrode formation spaces enclosed by the insulating film in the spaces.

9. The method for manufacturing a semiconductor integrated circuit device according to claim 8, further comprising, after the dummy gate electrode forming process, a dummy electrode adjusting process of covering the peripheral circuit region with a resist and removing predetermined amounts of the dummy first select gate electrode and the dummy second select gate electrode in the memory circuit region to adjust widths of the dummy first select gate electrode and the dummy second select gate electrode.

10. A method for manufacturing a semiconductor integrated circuit device including:

a memory circuit region in which a memory cell including a memory gate structure between a first select gate structure and a second select gate structure is disposed; and a peripheral circuit region in which a peripheral circuit including a logic gate structure is disposed, the method comprising:

a first dummy electrode layer forming process of forming a layered lower memory gate insulating film and a layered charge storage layer in this order on a semiconductor substrate in the memory circuit region, and then stacking a layered first insulating film and a layered logic dummy electrode layer in this order on the charge storage layer in the memory circuit region and the semiconductor substrate in the peripheral circuit region;

a dummy memory gate structure forming process of patterning the logic dummy electrode layer, the first insulating film, the charge storage layer, and the lower memory gate insulating film in the memory circuit region by using a patterned resist so that a dummy memory gate structure in which the lower memory gate insulating film, the charge storage layer, an upper memory gate insulating film, and a dummy memory gate electrode provided by patterning are stacked in this order is formed in the memory circuit region and the first insulating film and the logic dummy electrode layer remain intact in the peripheral circuit region using the resist;

a sidewall insulating film forming process of forming a layered sidewall insulating film across the memory circuit region and the peripheral circuit region, and then etching back the layered sidewall insulating film to expose the semiconductor substrate, thereby forming sidewall insulating films along facing sidewalls of the dummy memory gate structure in the memory circuit region;

a second dummy electrode layer forming process of forming a layered second insulating film across the memory circuit region and the peripheral circuit region to form sidewall spacers composed of the sidewall insulating films and the second insulating film on the respective facing sidewalls of the dummy memory gate structure, stacking a layered memory dummy electrode layer on the second insulating film, and removing the memory dummy electrode layer and the second insulating film in this order in the peripheral circuit region by using a patterned resist so that the second insulating film and the memory dummy electrode layer remain in the memory circuit region;

a dummy gate electrode forming process of patterning the logic dummy electrode layer and the first insulating film in the peripheral circuit region by using another patterned resist to form a dummy logic gate structure in which a dummy logic gate electrode is stacked on the semiconductor substrate through a logic gate insulating film, and etching back the memory dummy electrode layer and the second insulating film in the memory circuit region so that a sidewall-shaped dummy first select gate electrode is formed along one of the sidewall spacers of the dummy memory gate structure whereas the second insulating film remains below the dummy first select gate electrode to form a first select gate insulating film, and a sidewall-shaped dummy second select gate electrode is formed along the other sidewall spacer of the dummy memory gate structure whereas the second insulating film remains below the dummy second select gate electrode to form a second select gate insulating film;

an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, and then forming, in electrode formation spaces in which the dummy memory gate electrode, the dummy first select gate electrode, the dummy second select gate electrode, and the dummy logic gate electrode have been formed, a metal memory gate electrode, a metal first select gate electrode, a metal second select gate electrode, and a metal logic gate electrode each containing a metallic material.

11. A method for manufacturing a semiconductor integrated circuit device including:

a memory circuit region in which a memory cell including a memory gate structure between a first select gate structure and a second select gate structure is disposed; and a peripheral circuit region in which a peripheral circuit including a logic gate structure is disposed, the method comprising:

a sidewall insulating film forming process of providing, in the memory circuit region, a dummy memory gate structure in which a lower memory gate insulating film, a charge storage layer, an upper memory gate insulating film, and a dummy memory gate electrode provided by patterning are stacked in this order on a semiconductor substrate, and then forming a layered sidewall insulating film across the memory circuit region and the peripheral circuit region, and then etching back the layered sidewall insulating film to expose the semiconductor substrate, thereby forming sidewall insulating films along facing sidewalls of the dummy memory gate structure;

a dummy electrode layer forming process of forming a layered insulating film in the memory circuit region and the peripheral circuit region to form sidewall spacers composed of the sidewall insulating films and the insulating film on the respective facing sidewalls of the dummy memory gate structure, and then stacking a layered logic dummy electrode layer on the insulating film;

a dummy gate electrode forming process of patterning the logic dummy electrode layer and the insulating film in the peripheral circuit region by using a patterned resist to form a dummy logic gate structure in which a dummy logic gate electrode is stacked on the semiconductor substrate through a logic gate insulating film, and etching back the logic dummy electrode layer and the insulating film in the memory circuit region so that a sidewall-shaped dummy first select gate electrode is formed along one of the sidewall spacers of the dummy memory gate structure whereas the insulating film remains below the dummy first select gate electrode to form a first select gate insulating film and a sidewall-shaped dummy second select gate electrode is formed along the other sidewall spacer of the dummy memory gate structure whereas the insulating film remains below the dummy second select gate electrode to form a second select gate insulating film;

an electrode exposing process of forming an interlayer insulating layer in the memory circuit region and the peripheral circuit region, and then processing the interlayer insulating layer to expose, on the interlayer insulating layer, top surfaces of the dummy memory gate electrode, the dummy first select gate electrode, the dummy second select gate electrode, and the dummy logic gate electrode; and a metal gate electrode forming process of removing the dummy memory gate electrode, the dummy first select gate electrode, the dummy second select gate electrode, and the dummy logic gate electrode, and then forming, in electrode formation spaces in which the dummy memory gate electrode, the dummy first select gate electrode, the dummy second select gate electrode, and the dummy logic gate electrode have been formed, a metal memory gate electrode, a metal first select gate electrode, a metal second select gate electrode, and a metal logic gate electrode each containing a metallic material.

* * * * *